US011295807B2

United States Patent
Koya

(10) Patent No.: US 11,295,807 B2
(45) Date of Patent: Apr. 5, 2022

(54) VOLATILE MEMORY DEVICE WITH 3-D STRUCTURE INCLUDING MEMORY CELLS HAVING TRANSISTORS VERTICALLY STACKED ONE OVER ANOTHER

(71) Applicant: Micron Technology, Inc., Boise, ID (US)

(72) Inventor: Yoshihito Koya, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/020,536

(22) Filed: Sep. 14, 2020

(65) Prior Publication Data

US 2020/0411080 A1    Dec. 31, 2020

Related U.S. Application Data

(62) Division of application No. 16/112,133, filed on Aug. 24, 2018, now Pat. No. 10,790,008.
(Continued)

(51) Int. Cl.
*G11C 11/4091* (2006.01)
*G11C 11/4094* (2006.01)
(Continued)

(52) U.S. Cl.
CPC ........ *G11C 11/4091* (2013.01); *G11C 11/404* (2013.01); *G11C 11/4076* (2013.01);
(Continued)

(58) Field of Classification Search
CPC ............... G11C 11/4091; G11C 11/404; H01L 27/10802; H01L 27/10805
See application file for complete search history.

(56) References Cited

U.S. PATENT DOCUMENTS 5,920,785 A    7/1999  Chi et al.
6,114,725 A    9/2000  Furukawa et al.
(Continued)

FOREIGN PATENT DOCUMENTS

| CN | 111213237 A | 5/2020 |
|---|---|---|
| JP | 08064777 A | 3/1996 |
| WO | WO-2019046125 A1 | 3/2019 |

OTHER PUBLICATIONS

U.S. Appl. No. 16/112,113 U.S. Pat. No. 10,790,008, filed Aug. 24, 2018, Volatile Memory Device With 3-D Structure Including Vertical Pillars and Memory Cells Vertically Stacked One Over Another in Multiple Levels.
(Continued)

*Primary Examiner* — Mushfique Siddique
(74) *Attorney, Agent, or Firm* — Schwegman Lundberg & Woessner, P.A.

(57) ABSTRACT

Some embodiments include apparatuses and methods of operating the apparatuses. One of the apparatuses includes volatile memory cells located along a pillar that has a length extending in a direction perpendicular to a substrate of a memory device. Each of the volatile memory cells includes a capacitor and at least one transistor. The capacitor includes a capacitor plate. The capacitor plate is either formed from a portion a semiconductor material of the pillar or formed from a conductive material separated from the pillar by a dielectric.

16 Claims, 42 Drawing Sheets

Related U.S. Application Data

(60) Provisional application No. 62/551,542, filed on Aug. 29, 2017.

(51) Int. Cl.
  *G11C 11/408* (2006.01)
  *G11C 11/4096* (2006.01)
  *G11C 11/4076* (2006.01)
  *G11C 11/404* (2006.01)
  *H01L 27/108* (2006.01)

(52) U.S. Cl.
  CPC ...... *G11C 11/4085* (2013.01); *G11C 11/4087* (2013.01); *G11C 11/4094* (2013.01); *G11C 11/4096* (2013.01); *H01L 27/10802* (2013.01); *H01L 27/10805* (2013.01)

(56) References Cited

U.S. PATENT DOCUMENTS

| | | | |
|---|---|---|---|
| 9,099,544 | B2 | 8/2015 | Rodriguez et al. |
| 9,379,005 | B2 | 6/2016 | Tang et al. |
| 9,698,272 | B1 | 7/2017 | Ikeda et al. |
| 10,164,009 | B1* | 12/2018 | Carlson ............ H01L 27/11521 |
| 10,347,322 | B1 | 7/2019 | Kim et al. |
| 10,790,008 | B2 | 9/2020 | Koya |
| 2005/0280061 | A1 | 12/2005 | Lee |
| 2012/0083093 | A1 | 4/2012 | Mouli |
| 2014/0321188 | A1 | 10/2014 | Tanzawa |
| 2016/0071591 | A1 | 3/2016 | Hsu |
| 2018/0033478 | A1* | 2/2018 | Tanaka ................ G11C 11/4074 |
| 2018/0061468 | A1 | 3/2018 | Derner et al. |
| 2018/0082733 | A1 | 3/2018 | Tanaka et al. |
| 2018/0218765 | A1 | 8/2018 | Derner et al. |
| 2019/0066762 | A1 | 2/2019 | Koya |
| 2019/0267074 | A1 | 8/2019 | Fishburn et al. |
| 2019/0295626 | A1 | 9/2019 | Ikeda et al. |

OTHER PUBLICATIONS

"A New Reverse Base Current (RBC) of the Bipolar Transistor Induced by Impact Ionization", Japanese Journal of Applied Physics vol. 28, No. 12, (Dec. 1989), 3 pgs.

"International Application Serial No. PCT/US2018/047956, International Preliminary Report on Patentability dated Mar. 12, 2020", 8 pgs.

"International Application Serial No. PCT/US2018/047956, International Search Report dated Dec. 7, 2018", 6 pgs.

"International Application Serial No. PCT/US2018/047956, Written Opinion dated Dec. 7, 2018", 16 pgs.

Chung, Hyunwoo, et al., "Novel 4F2 DRAM Cell with Vertical Pillar Transistor(VPT)", Proceedings of the European Solid-State Device Research Conference (ESSDERC), (Sep. 2011), 4 pgs.

Hamamoto, T, et al., "NAND-Structured Cell Technologies for Low Cost 256Mb DRAMs", IEDM Tech. Dig, (1993), 4 pgs.

Hasegawa, T., et al., "An Experimental DRAM with a NAND-Structured Cell", 1993 IEEE International Solid-State Circuits Conference, pp. 46047120194, (Nov. 1993), 1099-1104.

Jeong, Hoon, et al., "Capacitorless DRAM Cell with Highly Scalable Surrounding Gate Structure", Extended Abstracts of the 2006 International Conference on Solid State Devices and Materials, Yokohama, (2006), 3 pgs.

Nakamura, Hiroki, et al., "Analysis of the NAND-type DRAM-on-SGT for High-Density and Low-Voltage Memory.", Proceedings of ESSDERC, Grenoble, France, (2005), 4 pgs.

Nakamura, Hiroki, "NAND-type DRAM-on-SGT", IEEE Transactions on Electron Devices, vol. 52 No. 3, (Mar. 2005), 3 pgs.

Okhonin, S, et al., "New Generation of Z-RAM", IEDM Tech. Dig., (2007), 4 pgs.

Sakui, Koji, et al., "A New Static Memory Cell Based on the Reverse Base Current (RBC) Effect of Bipolar Transistors", IEDM Tech. Dig., (Dec. 1988), 1215-1217.

Yoshida, Eiji, et al., "A Capacitorless 1T-DRAM Technology Using Gate-Induced Drain-Leakage (GIDL) Current for Low-Power and High-Speed Embedded Memory", IEEE Transactions on Electron Devices, vol. 53, No. 4, (Apr. 2006), 692-697.

* cited by examiner

| CELL GROUP $201_0$ | WRITE OPERATION<br>CELL 212 SELECTED<br>CELLS 210,211,213 UNSELECTED | READ OPERATION<br>CELL 212 SELECTED<br>CELLS 210,211,213 UNSELECTED |
|---|---|---|
| $WWL0_3$ | V0 (e.g., VDD) | V0 |
| $WWL0_2$ | V1 (V1 > VDD) | V0 |
| $WWL0_1$ | V0 | V0 |
| $WWL0_0$ | V0 | V0 |
| $PL0_3$ | V0 | V2 (V2 > V0) |
| $PL0_2$ | V0 | V0 |
| $PL0_1$ | V0 | V2 |
| $PL0_0$ | V0 | V2 |
| $BL\_W_B$ | $V_{BL\_W}$ ("0" OR "1") | V0 |
| $BL\_W_A$ | V0 | V0 |
| RSL0 | V0 | V2 |
| $BL\_R_0$ | V0 | $V_{BL\_R}$ ("0" OR "1") |
| CS | V0 | V0 |

FIG. 2C

| CELL GROUP $201_0$ | WRITE OPERATION<br>CELL 210 SELECTED<br>CELLS 211,212,213 UNSELECTED | READ OPERATION<br>CELL 210 SELECTED<br>CELLS 211,212,213 UNSELECTED |
|---|---|---|
| $WWL0_3$ | V1 (V1 > VDD) | V0 (e.g., VDD) |
| $WWL0_2$ | V1 | V0 |
| $WWL0_1$ | V1 | V0 |
| $WWL0_0$ | V1 | V0 |
| $PL0_3$ | V0 | V2 (V2 > V0) |
| $PL0_2$ | V0 | V2 |
| $PL0_1$ | V0 | V2 |
| $PL0_0$ | V0 | V0 |
| $BL\_W_0$ | $V_{BL\_W}$ ("0" OR "1") | V0 |
| RSL0 | V0 | V2 |
| $BL\_R_0$ | V0 | $V_{BL\_R}$ ("0" OR "1") |

FIG. 3C

| CELL GROUP $201_0$ | WRITE OPERATION<br>CELL 212 SELECTED<br>CELLS 210,211,213 UNSELECTED | READ OPERATION<br>CELL 212 SELECTED<br>CELLS 210,211,213 UNSELECTED |
|---|---|---|
| $WWL0_3$ | V1 (V1 > V0) | V0 (e.g., 0V) |
| $WWL0_2$ | V1 | V0 |
| $WWL0_1$ | V0 | V0 |
| $WWL0_0$ | V0 | V0 |
| $PL0_3$ | V0 | V2 (V2 > V0) |
| $PL0_2$ | V0 | V0 |
| $PL0_1$ | V0 | V2 |
| $PL0_0$ | V0 | V2 |
| $BL\_W_0$ | $V_{BL\_W}$ ("0" OR "1") | V0 |
| RSL0 | V0 | V2 |
| $BL\_R_0$ | V0 | $V_{BL\_R}$ ("0" OR "1") |
| CS | V0 | V0 |

FIG. 3D

| WRITE OPERATIONS | CELL 413$_A$ UNSELECTED CELL 412$_A$ SELECTED | CELL 413$_A$ SELECTED CELL 412$_A$ UNSELECTED | CELL 413$_A$ SELECTED CELL 412$_A$ SELECTED |
|---|---|---|---|
| CS$_2$ | V3(0V) | V3 | V3 |
| PL$_3$ | V4(0V) | V4 | V4 |
| PL$_2$ | V4 | V4 | V4 |
| WL$_3$ | V5 (V5=0V) | V6 | V6 |
| WL$_2$ | V6(V6>VDD) | V5 | V6 |
| BL2$_A$ | Vx | V$_{BL2}$("0" or "1") | V$_{BL2}$ |
| BL1$_A$ | V$_{BL1}$("0" or "1") | Vx | V$_{BL1}$ |

(columns labeled 421, 422, 423)

461

| PRE-SENSE STAGE | CELL 413$_A$ SELECTED |
| --- | --- |
| | CELL 413$_B$ UNSELECTED |
| CS$_2$ | V$_L$ (0V) |
| PL$_3$ | V$_{PL}$ (0V) |
| PL$_2$ | V$_{PL}$ |
| WL$_3$ | V$_{WL}$ (V$_{WL}$<0) |
| WL$_2$ | V$_{WL}$ |
| BL2$_A$ | V$_{BL\_L}$ |
| BL1$_A$ | V$_{BL\_L}$ |

FIG. 4K'

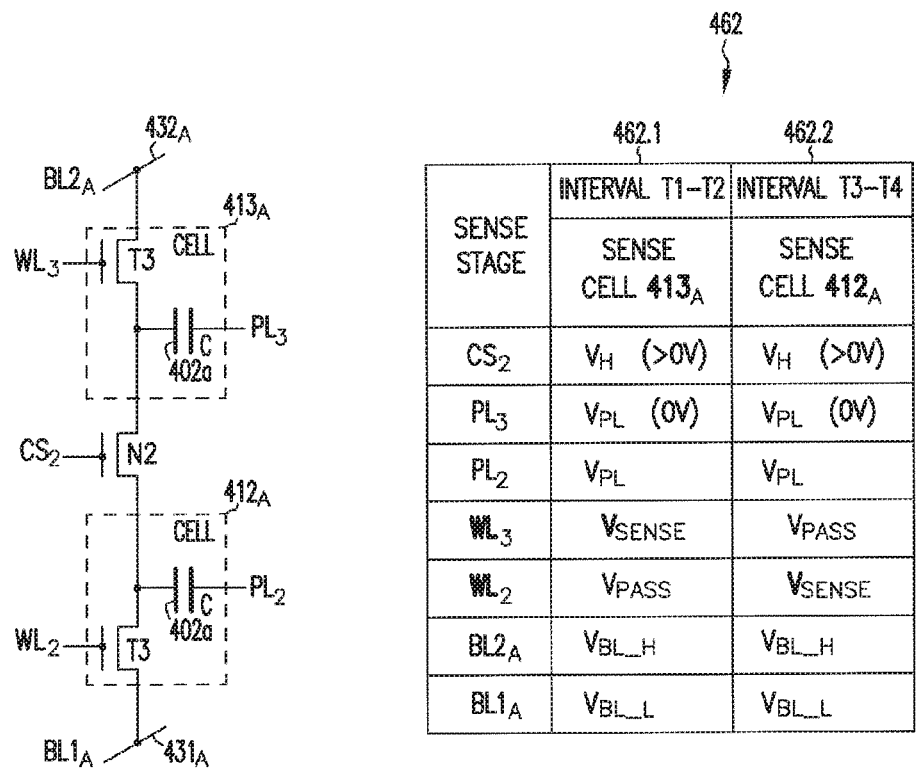
FIG. 4L
FIG. 4M
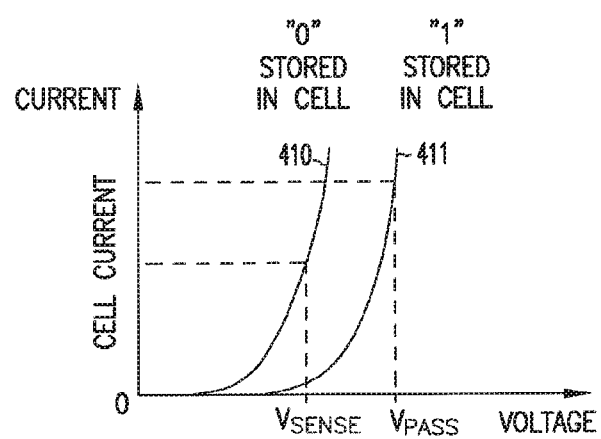
FIG. 4N

| WRITE OPERATIONS | CELL 513_A UNSELECTED / CELL 512_A SELECTED | CELL 513_A SELECTED / CELL 512_A UNSELECTED | CELL 513_A SELECTED / CELL 512_A SELECTED |
|---|---|---|---|
| $PL_3$ | V4 (0V) | V4 | V4 |
| $PL_2$ | V4 | V4 | V4 |
| $RSL_3$ | Va (0V) | Va | Va |
| $RSL_2$ | Va | Va | Va |
| $WL_3$ | V5 (V5=0V) | V6 | V6 |
| $WL_2$ | V6 (V6>VDD) | V5 | V6 |
| $BL2_A$ | Vx | $V_{BL2}$ ("0" or "1") | $V_{BL2}$ |
| $BL1_A$ | $V_{BL1}$ ("0" or "1") | Vx | $V_{BL1}$ |
| $BLR1_A$ | Vb | Vb | Vb |

| PRE-SENSE STAGE | CELL 513_A UNSELECTED / CELL 512_A SELECTED |
|---|---|
| $PL_3$ | $V_{PL}$ (0V) |
| $PL_2$ | $V_{PL}$ (0V) |
| $BL2_A$ | $V_C$ |
| $WL_3$ | $V_L$ (0V) |
| $RSL_3$ | $V_L$ |
| $BLR1_A$ | $V_L$ ($V_L < V_{BL\_H}$) |
| $RSL_2$ | $V_L$ |
| $WL_2$ | $V_{WL}$ ($0 < V_{WL} < V_{BL\_H}$) |
| $BL1_A$ | $V_{BL\_H}$ |

561

| PRE-SENSE STAGE | CELL 513$_A$ UNSELECTED / CELL 512$_A$ SELECTED |
|---|---|
| PL$_3$ | V$_{PL}$ (0V) |
| PL$_2$ | V$_{PL}$ (0V) |
| BL2$_A$ | V$_c$ |
| WL$_3$ | V$_L$ (0V) |
| RSL$_3$ | V$_L$ |
| BLR1$_A$ | V$_L$ |
| RSL$_2$ | V$_L$ |
| WL$_2$ | V$_{WL}$ (V$_{WL}$<0) |
| BL1$_A$ | V$_L$ |

FIG. 5H'

| SENSE STAGE | CELL 513$_A$ UNSELECTED / CELL 512$_A$ SELECTED |
|---|---|
| PL$_3$ | V$_{PL}$ (0V) |
| PL$_2$ | V$_{PL}$ |
| BL2$_A$ | V$_C$ |
| WL$_3$ | V$_L$ (0V) |
| RSL$_3$ | V$_L$ |
| BLR1$_A$ | V$_{BL\_H}$ |
| RSL$_2$ | V$_{PASS}$ |
| WL$_2$ | V$_{SENSE}$ |
| BL1$_A$ | V$_{BL\_L}$ |

| SENSE STAGE | CELL 513$_A$ UNSELECTED / CELL 512$_A$ SELECTED |
|---|---|
| PL$_3$ | V$_{PL}$ (0V) |
| PL$_2$ | V$_{PL}$ |
| BL2$_A$ | V$_C$ |
| WL$_3$ | V$_L$ (0V) |
| RSL$_3$ | V$_L$ |
| BLR1$_A$ | V$_{BL\_L}$ |
| RSL$_2$ | V$_{PASS}$ |
| WL$_2$ | V$_G$ (<0V) |
| BL1$_A$ | V$_{BL\_H}$ |

| RESET STAGE | CELL 513$_A$ UNSELECTED<br>CELL 512$_A$ SELECTED |
|---|---|
| PL$_3$ | V$_{PL}$ (0V) |
| PL$_2$ | V$_{PL}$ (0V) |
| BL2$_A$ | Vc |
| WL$_3$ | V$_L$ (0V) |
| RSL$_3$ | V$_L$ |
| BLR1$_A$ | V$_{BL\_x}$ (V$_{BL\_x}$ ≤ 0) |
| RSL$_2$ | V$_{WLy}$ (V$_{WLy}$=VDD) |
| WL$_2$ | V$_{WLy}$ |
| BL1$_A$ | V$_{BL\_x}$ (V$_{BL\_x}$ ≤ 0) |

| RESTORE STAGE | CELL 513$_A$ UNSELECTED CELL 512$_A$ SELECTED |
|---|---|
| PL$_3$ | V$_{PL}$ (0V) |
| PL$_2$ | V$_{PL}$ (0V) |
| BL2$_A$ | Vx |
| WL$_3$ | V$_L$ (0V) |
| RSL$_3$ | V$_L$ |
| BLR1$_A$ | Vc |
| RSL$_2$ | V$_L$ |
| WL$_2$ | V6 (V6>VDD) |
| BL1$_A$ | V$_{BL1}$ ("0" or "1") |

VOLATILE MEMORY DEVICE WITH 3-D STRUCTURE INCLUDING MEMORY CELLS HAVING TRANSISTORS VERTICALLY STACKED ONE OVER ANOTHER

RELATED APPLICATION

This application is a divisional of U.S. application Ser. No. 16/112,133, filed Aug. 24, 2018, which claims the benefit of priority to U.S. Application Ser. No. 62/551,542, filed 29 Aug. 2017, all of which are incorporated herein by reference in their entirety.

BACKGROUND

Memory devices are widely used in computers and many other electronic items to store information. Memory devices are generally categorized into two types: volatile memory device and non-volatile memory device. An example of a volatile memory device includes a dynamic random access memory (DRAM) device. An example of a non-volatile memory device includes a flash memory device (e.g., a flash memory stick). A memory device usually has numerous memory cells. In a volatile memory device, information stored in the memory cells are lost if supply power is disconnected from the memory device. In a non-volatile memory device, information stored in the memory cells are retained even if supply power is disconnected from the memory device.

The description herein involves volatile memory devices. Most conventional volatile memory devices have a planar structure (i.e., a two-dimensional structure) in which the memory cells are formed in a single level of the device. As demand for device storage density increases, many conventional techniques provide ways to shrink the size of the memory cell in order to increase device storage density for a given device area. However, physical limitations and fabrication constraints may pose a challenge to such conventional techniques if the memory cell size is to be shrunk to a certain dimension. Unlike some conventional memory devices, the memory devices described herein include features that can overcome challenges faced by conventional techniques.

BRIEF DESCRIPTION OF THE DRAWINGS

FIG. 2C is a chart showing example values of voltages provided to signals of the memory device of FIG. 2B during example write and read operations, according to some embodiments described herein.

FIG. 2E through FIG. 2I show different portions (e.g., partial top views) of the memory device of FIG. 2D including some elements of the memory device viewed from different sectional lines of FIG. 2D, according to some embodiments described herein.

FIG. 3C is a chart showing example values of voltages provided to signals of the memory device of FIG. 3B, during example write and read operations, according to some embodiments described herein.

FIG. 3D is a chart showing example values of voltages provided to signals of the memory device of FIG. 3B, during additional example write and read operations of the memory device, according to some embodiments described herein.

FIG. 4I is a flow chart showing different stages of a read operation of the memory device of FIG. 4A, according to some embodiments described herein.

FIG. 4K' is a chart showing values of signals in FIG. 4J during a pre-sense stage using an alternative pre-sense scheme based on gate-induced drain-leakage (GIDL) current mechanism.

FIG. 4L shows a schematic diagram of a portion of the memory device of FIG. 4A.

FIG. 4M' is a chart showing values of signals in FIG. 4L during a sense stage using an alternative sense scheme based on a property (e.g., self-latching) of a built-in bipolar junction transistor (BJT).

FIG. 4N is a graph showing relationships between some signals in FIG. 4M.

FIG. 5H' is a chart showing values of signals in FIG. 5G during a pre-sense stage using an alternative pre-sense scheme based on GIDL current mechanism.

FIG. 5J' is a chart showing values of signals in FIG. 5I during a sense stage using an alternative sense scheme based on a property (e.g., self-latching) of a built-in bipolar junction transistor.

DETAILED DESCRIPTION

The memory device described herein includes volatile memory cells that are arranged in a 3-D (three-dimensional) structure. In the 3-D structure, the memory cells are vertically stacked over each other in multiple levels of the memory device. Since the memory cells are vertically stacked, storage density of the described memory device can be higher than that of a conventional volatile memory device for a given device area. The 3-D structure also allows an increase in storage density of the described memory device without aggressively reducing feature size (e.g., memory cell size). The memory device described herein can have an effective feature size of $2F^2$ or less. Different variations of the described memory device are discussed in detail below with reference to FIG. 1 through FIG. 6.

Figure 1:
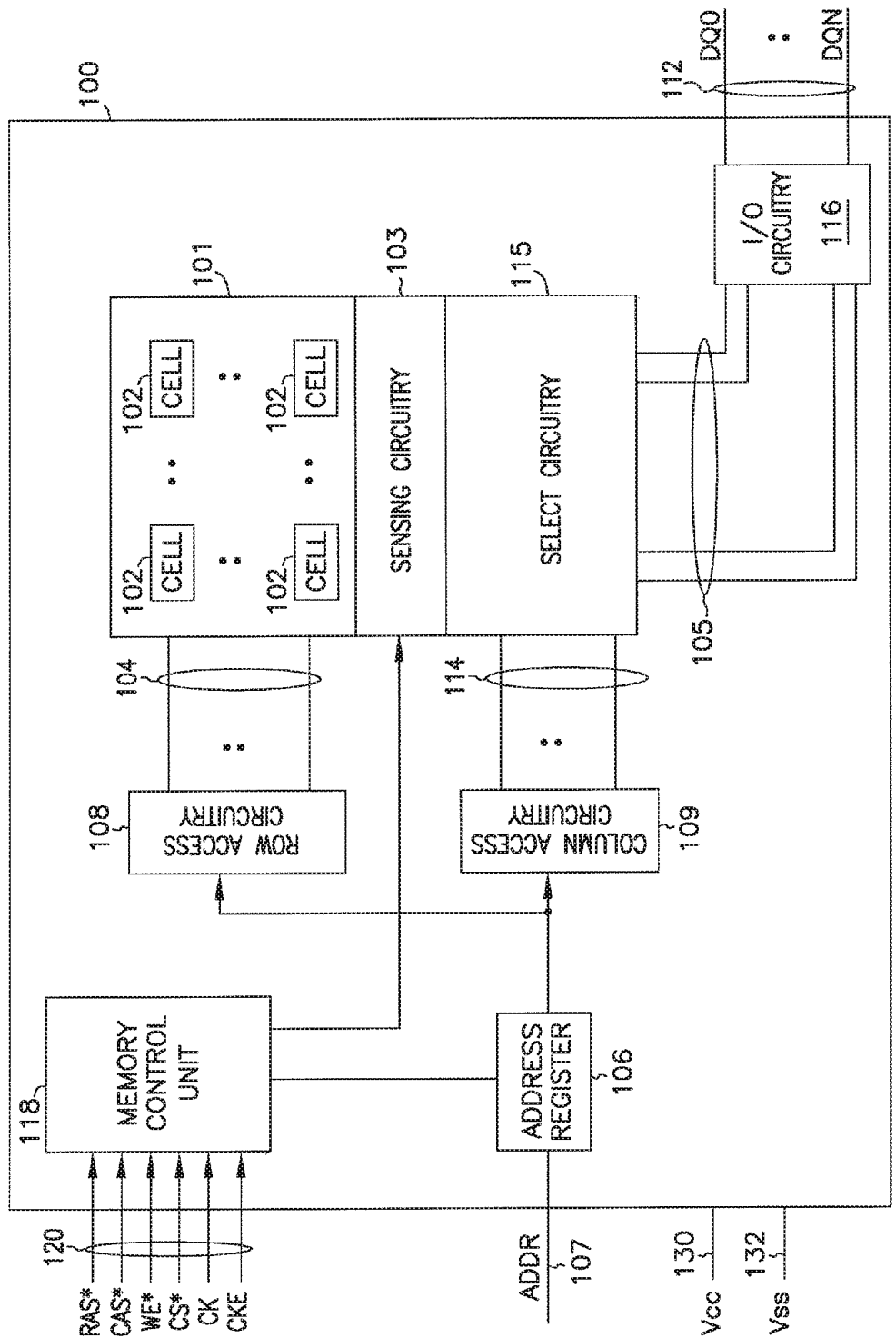
FIG. 1 shows a block diagram of an apparatus in the form of a memory device including volatile memory cells, according to some embodiments described herein.

FIG. 1 shows a block diagram of an apparatus in the form of a memory device 100 including volatile memory cells, according to some embodiments described herein. Memory device 100 includes a memory array 101, which can contain memory cells 102. Memory device 100 is volatile memory device (e.g., a DRAM device), such that memory cells 102 are volatile memory cells. Thus, information stored in memory cells 102 may be lost (e.g., invalid) if supply power (e.g., supply voltage VDD) is disconnected from memory device 100. Hereinafter, VDD is referred to represent some voltage levels, however, they are not limited to a supply voltage (e.g., VDD) of the memory device (e.g., memory device 100). For example, if the memory device (e.g., memory device 100) has an internal voltage generator (not shown in FIG. 1) that generates an internal voltage based on VDD, such an internal voltage may be used instead of VDD.

In a physical structure of memory device 100, memory cells 102 can be formed vertically (e.g., stacked over each other in different layers) in different levels over a substrate (e.g., semiconductor substrate) of memory device 100. The structure of memory array 101 including memory cells 102 can include the structure of memory arrays and memory cells described below with reference to FIG. 2A through FIG. 6.

As shown in FIG. 1, memory device 100 can include access lines 104 (or "word lines") and data lines (e.g., bit lines) 105. Memory device 100 can use signals (e.g., word line signals) on access lines 104 to access memory cells 102 and data lines 105 to provide information (e.g., data) to be stored in (e.g., written) or sensed (e.g., read) from memory cells 102.

Memory device 100 can include an address register 106 to receive address information ADDR (e.g., row address signals and column address signals) on lines (e.g., address lines) 107. Memory device 100 can include row access circuitry (e.g., x-decoder) 108 and column access circuitry (e.g., y-decoder) 109 that can operate to decode address information ADDR from address register 106. Based on decoded address information, memory device 100 can determine which memory cells 102 are to be accessed during a memory operation. Memory device 100 can perform a write operation to store information in memory cells 102, and a read operation to read (e.g., sense) information (e.g., previously stored information) in memory cells 102. Memory device 100 can also perform an operation (e.g., a refresh operation) to refresh (e.g., to keep valid) the value of information stored in memory cells 102. Each of memory cells 102 can be configured to store information that can represent a binary 0 ("0") or a binary 1 ("1").

Memory device 100 can receive a supply voltage, including supply voltages VDD and Vss, on lines 130 and 132, respectively. Supply voltage Vss can operate at a ground potential (e.g., having a value of approximately zero volts). Supply voltage VDD can include an external voltage supplied to memory device 100 from an external power source such as a battery or an alternating current to direct current (AC-DC) converter circuitry.

As shown in FIG. 1, memory device 100 can include a memory control unit 118 to control memory operations (e.g., read and write operations) of memory device 100 based on control signals on lines (e.g., control lines) 120. Examples of signals on lines 120 include a row access strobe signal RAS*, a column access strobe signal CAS*, a write-enable signal WE*, a chip select signal CS*, a clock signal CK, and a clock-enable signal CKE. These signals can be part of signals provided to a dynamic random access memory (DRAM) device.

As shown in FIG. 1, memory device 100 can include lines (e.g., global data lines) 112 that can carry signals DQ0 through DQN. In a read operation, the value (e.g., logic 0 and logic 1) of information (read from memory cells 102) provided to lines 112 (in the form signals DQ0 through DQN) can be based on the values of signals $DL_0$ and $DL_0^*$ through $DL_N$ and $DL_N^*$ on data lines 105. In a write operation, the value (e.g., "0" (binary 0) or "1" (binary 1)) of the information provided to data lines 105 (to be stored in memory cells 102) can be based on the values of signals DQ0 through DQN on lines 112.

Memory device 100 can include sensing circuitry 103, select circuitry 115, and input/output (I/O) circuitry 116. Column access circuitry 109 can selectively activate signals on lines (e.g., select lines) based on address signals ADDR. Select circuitry 115 can respond to the signals on lines 114 to select signals on data lines 105. The signals on data lines 105 can represent the values of information to be stored in memory cells 102 (e.g., during a write operation) or the values of information read (e.g., sensed) from memory cells 102 (e.g., during a read operation).

I/O circuitry 116 can operate to provide information read from memory cells 102 to lines 112 (e.g., during a read operation) and to provide information from lines 112 (e.g., provided by an external device) to data lines 105 to be stored in memory cells 102 (e.g., during a write operation). Lines 112 can include nodes within memory device 100 or pins (or solder balls) on a package where memory device 100 can reside. Other devices external to memory device 100 (e.g., a memory controller or a processor) can communicate with memory device 100 through lines 107, 112, and 120.

Memory device 100 may include other components, which are not shown to help focus on the embodiments described herein. Memory device 100 can be configured to include at least a portion of the memory device with associated structures and operations described below with reference to FIG. 2A through FIG. 6.

One of ordinary skill in the art may recognize that memory device 100 may include other components, several of which are not shown in FIG. 1 so as not to obscure the example embodiments described herein. At least a portion of memory device 100 (e.g., a portion of memory array 101) can include structures similar to or identical to any of the memory devices described below with reference to FIG. 2A through FIG. 6.

Figure 2A:
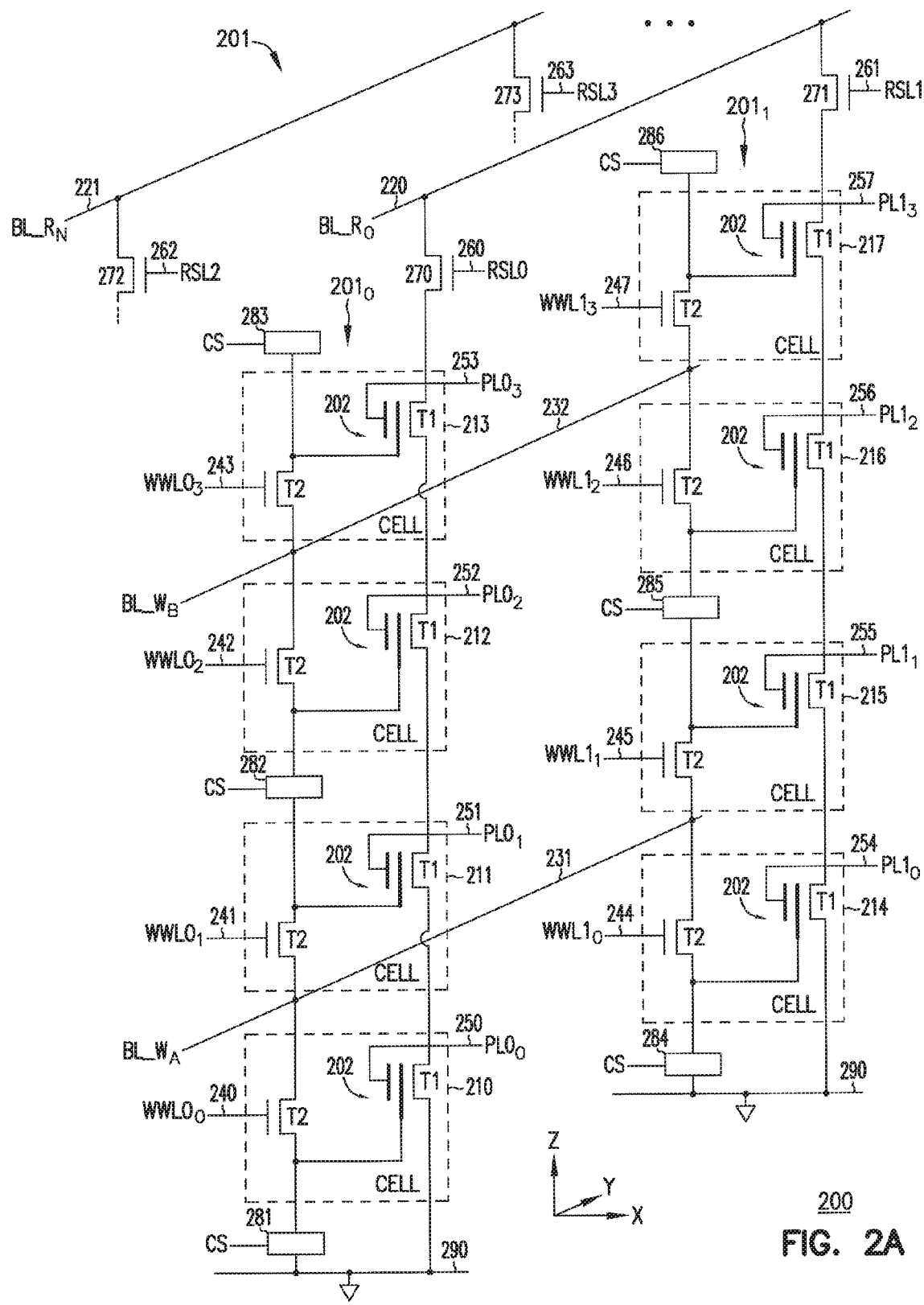
FIG. 2A shows a schematic diagram of a portion of a memory device including a memory array, according to some embodiments described herein.

FIG. 2A shows a schematic diagram of a portion of a memory device 200 including a memory array 201, according to some embodiments described herein. Memory device 200 can correspond to memory device 100 of FIG. 1. For example, memory array 201 can form part of memory array 101 of FIG. 1.

As shown in FIG. 2A, memory device 200 can include memory cells 210 through 217, which are volatile memory cells (e.g., DRAM cells). Each of memory cells 210 through 217 can include two transistors T1 and T2 and one capacitor 202, such that each of memory cells 210 through 217 can be called a 2T1C memory cell. For simplicity, the same labels T1 and T2 are given to the transistors of different memory cells among memory cells 210 through 217, and the same label (i.e., 202) is given to the capacitor of different memory cells among memory cells 210 through 217.

Memory cells 210 through 217 can be arranged in memory cell groups (e.g., strings) $201_0$ and $201_1$. Each of memory cell groups $201_0$ and $201_1$ can include the same number of memory cells. For example, memory cell group $201_0$ can include four memory cells 210, 211, 212, and 213, and memory cell group $201_1$ can include four memory cells 214, 215, 216, and 217. FIG. 2A shows four memory cells in each of memory cell groups $201_0$ and $201_1$ as an example. The number of memory cells in memory cell groups $201_0$ and $201_1$ can be different from four.

FIG. 2A shows directions x, y, and z that can correspond to the directions x, y, and z directions of the structure (physical structure) of memory device 200 shown in FIG. 2D through FIG. 2I. As described in more detail below with reference to FIG. 2D through FIG. 2I, the memory cells in each of memory cell groups $201_0$ and $201_1$ can be formed vertically (e.g., stacked over each other in a vertical stack in the z-direction) over a substrate of memory device 200.

Memory device 200 (FIG. 2A) can perform a write operation to store information in memory cells 210 through 217, and a read operation to read (e.g., sense) information from memory cells 210 through 217. Each of memory cells 210 through 217 can be randomly selected during a read or write operation. During a write operation of memory device 200, information can be stored in the selected memory cell (or memory cells). During a read operation of memory device 200, information can be read from the selected memory cell (or memory cells).

As shown in FIG. 2A, memory device 200 can include decoupling components (e.g., isolation components) 281 through 286, which are not memory cells. A particular decoupling component among decoupling components 281 through 286 can stop a flow of current from going across that particular decoupling component (described in more detail below). In the physical structure of memory device 200, each of the decoupling components 281 through 286 can be a component (e.g., a transistor) that is permanently turned off (e.g., always placed in a turned-off state). Alternatively, each of the decoupling components 281 through 286 can be a dielectric material (e.g., silicon oxide) that can prevent a conduction of current through it.

As shown in FIG. 2A, memory device 200 can include a read data line (e.g., read bit line) 220 that can be shared by memory cell groups $201_0$ and $201_1$. Memory device 200 can include a common conductive line 290 coupled to memory cell groups $201_0$ and $201_1$. Common conductive line 290 can be coupled to ground during an operation (e.g., read or write operation) of memory device 200.

Read data line 220 can carry a signal (e.g., read data line signal) $BL\_R_0$. During a read operation of memory device 200, the value (e.g., current or voltage value) of signal $BL\_R_0$ can be used to determine the value (e.g., "0" or "1") of information read (e.g., sensed) from a selected memory cell. The selected memory cell can be either from memory cell group $201_0$ or memory cell group $201_1$. During a read operation of memory device 200, the memory cells of memory cell group $201_0$ and memory cell group $201_1$ can be selected one at a time to provide information read from the selected memory cell.

Memory device 200 can include separate plate lines 250 through 257. Plate lines 250, 251, 252, and 253 can carry signals $PL0_0$, $PL0_1$, $PL0_2$, and $PL0_3$, respectively. Plate lines 254, 255, 256, and 257 can carry signals $PL1_0$, $PL1_1$, $PL1_2$, and $PL1_3$, respectively.

During a read operation of memory device 200, signals $PL0_0$, $PL0_1$, $PL0_2$, and $PL0_3$ on corresponding plate lines 250 through 253 can be provided with different voltages. Depending on the value of information stored in a selected memory cell, an amount (e.g., a predetermined amount) of current may or may not flow between read data line 220 and common conductive line 290 through memory cells 210, 211, 212, and 213. Based on the presence or absence of such an amount of current, memory device 200 can determine (e.g., by using a detection circuit (not shown in FIG. 2A)) the value (e.g., "0" or "1") of information stored in the selected memory cell.

As shown in FIG. 2A, memory device 200 can include read select lines 260 and 261 coupled to memory cell groups $201_0$ and $201_1$, respectively. Read select lines 260 and 261 can carry signals (e.g., read select signals) RSL0 and RSL1, respectively. During a read operation of memory device 200, read select signals RSL0 and RSL1 can be selectively activated to couple a corresponding memory cell group ($201_0$ or $201_1$) to read data line 220.

Memory device 200 can include select transistors 270 and 271 that can be controlled (e.g., turned on or turned off) by signals RSL0 and RSL1, respectively. Memory cell groups $201_0$ and $201_1$ can be selected one at a time during a read operation to read information from memory cells 210 through 217. For example, during a read operation, signal RSL0 can be activated (e.g., provided with a positive voltage) to turn on select transistor 270 and coupled to memory cell group $201_0$ to read data line 220 if one of memory cells 210, 211, 212, and 213 is selected. In this example, signal RSL1 can be deactivated (e.g., provided with zero volts) to turn off select transistor 271 when signal RSL0 is activated, so that memory cell group $201_1$ is not coupled to read data line 220. In another example, during a read operation, signal RSL1 can be activated (e.g., provided with a positive voltage) to turn on select transistor 271 and couple to memory cell group $201_1$ to read data line 220 if one of memory cells 214, 215, 216, and 217 is selected. In this example, signal RSL0 can be deactivated (e.g., provided with zero volts) when signal RSL1 is activated, so that memory cell group $201_0$ is not coupled to read data line 220.

Memory device 200 can include write data lines (write bit lines) 231 and 232 that can be shared by memory cell groups $201_0$ and $201_1$. Write data lines 231 and 232 can carry signals $BL\_W_A$ and $BL\_W_B$, respectively. During a write operation of memory device 200, signals $BL\_W_A$ and $BL\_W_B$ can be provided with voltages that can have values based on the value (e.g., "0" or "1") of information to be stored in a selected memory cell (or memory cells). Two memory cells within a group can share a write data line. For example, memory cells 210 and 211 can share write data line 231, and memory cells 212 and 213 can share write data line 232. In another example, memory cells 214 and 215 can share write data line 231, and memory cells 216 and 217 can share write data line 232.

Memory device 200 can include write word lines 240 through 247 (which can be part of the access lines of memory device 200). Write word lines 240, 241, 242, and 243 can carry signals $WWL0_0$, $WWL0_1$, $WWL0_2$, and $WWL0_3$, respectively. Write word lines 244, 245, 246, and 247 can carry signals $WWL1_0$, $WWL1_1$, $WWL1_2$, and $WWL1_3$, respectively.

During a write operation of memory device 200, write word lines 240, 241, 242, and 243 (associated with memory cell group $201_0$) can be used to provide access to memory cells 210, 211, 212, and 213, respectively, in order to store information in the selected memory cell (or memory cells) in memory cell group $201_0$.

During a write operation of memory device 200, write word lines 244, 245, 246, and 247 (associated with memory cell group $201_1$) can be used to provide access to memory cells 214, 215, 216, and 217, respectively, in order to store information in the selected memory cell (or memory cells) in memory cell group $201_1$.

Information stored in a particular memory cell (among memory cells 210 through 217) of memory device 200 can be based on the presence or absence of an amount (e.g., a predetermined amount) of charge in a capacitor 202 of that particular memory cell. The amount of charge placed on the capacitor 202 of a particular memory cell can be based on the value of voltages provided to signals $BL\_W_A$ and $BL\_W_B$ during a write operation. During a read operation to read information from a selected memory cell, the presence or absence of an amount of current between read data line 220 and common conductive line 290 is based on the presence or absence of an amount of charge in capacitor 202 of the selected memory cell.

FIG. 2A shows read data line 220 and write data lines 231 and 232 shared by two memory cell groups (e.g., $201_0$ and $201_1$) as an example. However, read data line 220 and write data lines 231 and 232 can be shared by other memory cell groups (not shown) of memory device 200 that are similar to memory cell groups $201_0$ and $201_1$ (e.g., memory cell groups in the y-direction).

Write word lines 240, 241, 242, and 243 can be shared by other memory cell groups (not shown) in the x-direction of memory device 200. Plate lines 250, 251, 252, and 253 can be shared by other memory cell groups (not shown) in the x-direction of memory device 200.

As shown in FIG. 2A, two memory cells (e.g., 212 and 213) of a same memory cell group (e.g., $201_0$) can share a write data line (e.g., 232). Thus, the number of write data lines (e.g., two date lines in FIG. 2A) can be one half of the number of memory cells (e.g., four memory cells in FIG. 2A) in each memory cell group. For example, if each memory cell group in FIG. 2A has six memory cells, then memory device 200 can include three write data lines (similar to write data lines 231 and 232) shared by respective pairs of the six memory cells.

As shown in FIG. 2A, memory device 200 can include other elements, such as read data line 221 (and corresponding signal $BL\_R_N$), read select lines 262 and 263 (and corresponding signals RSL2 and RSL3), and select transistors 272 and 273. Such other elements are similar to those described above. Thus, for simplicity, detailed description of such other elements of memory device 200 is omitted from the description herein.

Figure 2B:
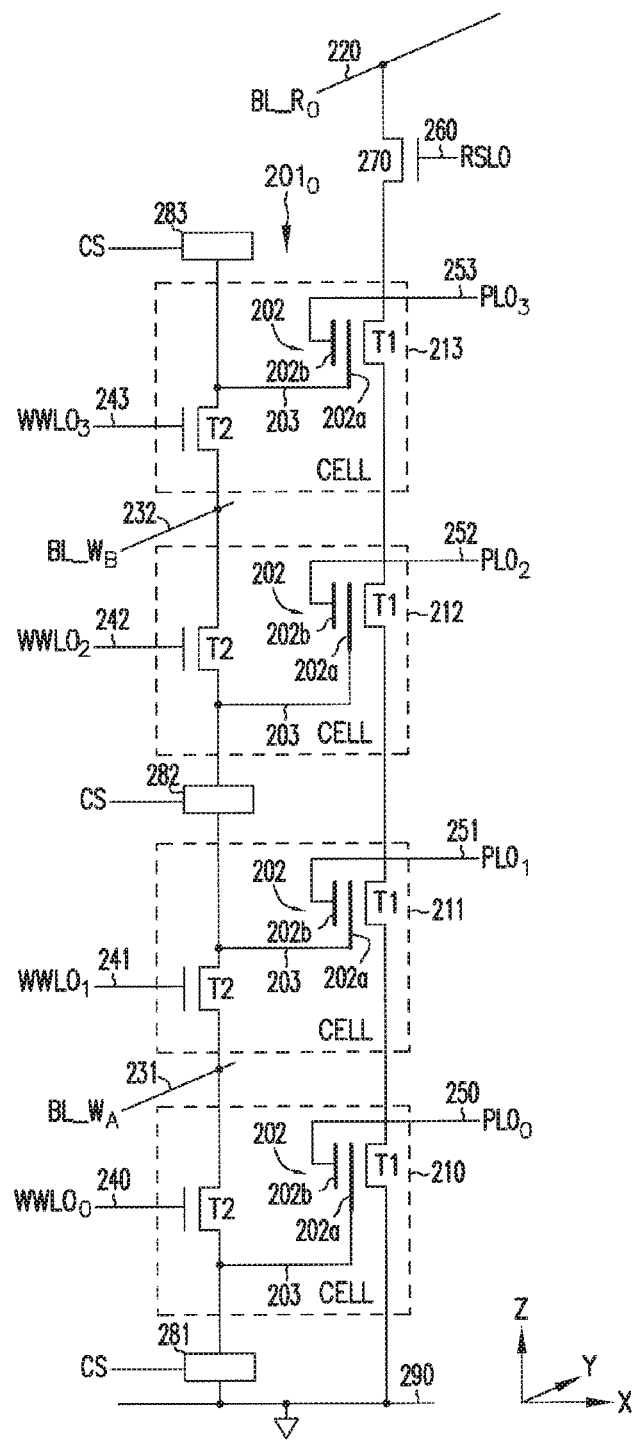
FIG. 2B shows a schematic diagram of a portion of the memory device of FIG. 2A.

FIG. 2B shows a schematic diagram of a portion of the memory device 200 of FIG. 2A including memory cell group $201_0$. As shown in FIG. 2B, the capacitor 202 can include capacitor plates (e.g., terminals) 202a and 202b. Capacitor plate 202a can form part of (or can be the same as) a storage node (e.g., a memory element) of a corresponding memory cell of memory device 200. Capacitor plate 202a of a particular memory cell can hold a charge that can be used to represent the value (e.g., "0" or "1") of information stored in that particular memory cell. Capacitor plate 202a can be coupled to a terminal (e.g., source or drain) of transistor T2 through a conductive connection 203.

Capacitor plate 202b of capacitor 202 can also be the gate of transistor T1 of a corresponding memory cell. Thus, capacitor plate 202b of capacitor 202 and the gate of transistor T1 are the same element. The combination of capacitor 202 and transistor T1 can also be called a storage capacitor-transistor (e.g., a gain cell). During a write operation to store information in the memory (e.g., memory cell 213), the storage capacitor-transistor of memory device 200 can allow a relatively small amount of charge to be stored in capacitor plate 202a to represent the value (e.g., "1") of information stored in the memory. The relatively small amount of charge can allow the size of a memory cell of memory device 200 to be relatively small. During a read operation of reading information from the memory cell, the storage capacitor-transistor combination can operate to amplify the charge (e.g., current). Since the amount of charge is relatively small, the amplification (e.g., gain) of the charge can improve accuracy of the information read from the memory cell of memory device 200.

During a write operation of storing information in a selected memory cell (e.g., memory cell 213), charge can be provided to (or not provided to) capacitor plate 202a of the selected memory cell (e.g., memory cell 213), depending on the value of information to be stored in that selected memory cell. For example, if "0" (binary 0) is to be stored in memory cell 213 (selected memory cell), then charge may not be provided to capacitor plate 202a. In this example, signal BL_$W_B$ on write data line 232 can be provided with zero volts (or alternatively a negative voltage), transistor T2 of memory cell 213 can be turned on, and transistor T2 of memory cell 212 can be turned off. In another example, if "1" (binary 1) is to be stored in memory cell 213 (selected memory cell), then an amount (e.g., predetermined amount) of charge can be provided to capacitor plate 202a of memory cell 213. In this example, signal BL_$W_B$ on write data line 232 can be provided with a positive voltage, transistor T2 of memory cell 213 can be turned on, and transistor T2 of memory cell 212 can be turned off.

During a read operation of reading (e.g., sensing) information previously stored in a selected memory cell (e.g., memory cell 212) of a memory cell group (e.g., 201$_0$), a voltage (e.g., V1>0) can be applied to the gates of transistors T1 of unselected memory cells (e.g., memory cell 210, 211, and 213) of that memory cell group, such that transistors T1 of the unselected memory cells are turned on regardless of the value of information stored in the selected memory cells. Another voltage (e.g., V0<V1) can be provided to the gate of transistor T1 of the selected memory cell. Transistor T1 of the memory cell may turn on or may remain turned off, depending on the value (e.g., "0" or "1") previously stored in the selected memory cell.

During the read operation, signal BL_$R_0$ on read data line 220 can have different values depending on the state (e.g., turned-on or turned-off) of transistor T1 of the selected memory cell. Memory device 200 can detect different values of signal BL_$R_0$ to determine the value of information stored in the selected memory cell. For example, in FIG. 2B, if memory cell 212 is selected to be read, then a voltage (e.g., zero volts) can be provided to signal PL0$_2$ (which controls the gate of transistor T1 of memory cell 212), and a voltage V1 can be applied to the gates of transistors T1 memory cell 210, 211, and 213. In this example, depending on the value (e.g., binary 0 or binary 1) previously stored in memory cell 212, transistor T1 of memory cell 213 may turn on or may remain turned off. Memory device 200 can detect the different values of signal BL_$R_0$ to determine the value of information stored in memory cell 212.

FIG. 2C is a chart showing example values of voltages provided to the signals of memory device 200 of FIG. 2B, during example write and read operations of memory device 200, according to some embodiments described herein. The signals in FIG. 2C (WWL0$_0$ through WWL0$_3$, PL0$_0$ through PL0$_3$, BL_$W_A$, BL_$W_B$, RSL0, and BL_$R_0$) are the same as those shown in FIG. 2B. As shown in FIG. 2C, in each of the write and read operations, the signals can be provided with voltages having specific values (in volt unit), depending upon which memory cell among memory cells 210, 211, 212, and 213 is selected. In FIG. 2C, memory cell 212 (shown in FIG. 2B) is assumed to be a selected (target) memory cell during a write operation and a read operation, and memory cells 210, 211, and 213 are not selected (unselected). The following description refers to FIG. 2B and FIG. 2C.

During a write operation of memory device 200 (FIG. 2C), signal WWL0$_2$ (associated with selected memory cell 212) can be provided with a voltage V1 (positive voltage), such as WWL0$_2$=V1, in order to turn on transistor T2 of memory cell 212. As an example, the value of voltage V1 can be greater than the supply voltage (e.g., VDD). Signals WWL0$_0$, WWL0$_1$, and WWL0$_3$ (associated with unselected memory cells 210, 211, and 213, respectively) can be provided with a voltage V0 (e.g., substantially equal to VDD), such as WWL0$_0$=WWL0$_1$=WWL0$_3$=V0, in order to turn off transistors T2 of memory cells 210, 211, and 213. Information (e.g., "0" or "1") can be stored in memory cell 212 (through the turned-on transistor T2 of memory cell 212) by way of providing a voltage V$_{BL\_W}$ to signal BL_$W_B$. The value of voltage V$_{BL\_W}$ can be based on the value of information to be stored in memory cell 212. For example, voltage V$_{BL\_W}$ can have one value (e.g., V$_{BL\_W}$=0V or V$_{BL\_W}$<0V) if "0" is to be stored in memory cell 212, and voltage V$_{BL\_W}$ can have another value (e.g., V$_{BL\_W}$>0V (e.g., or V$_{BL\_W}$=1V) if "1" is to be stored in memory cell 212.

Other signals of memory device 200 during a write operation can be provided with voltages as shown in FIG. 2C. For example, each of signals PL0$_0$, PL0$_1$, PL0$_2$, and PL0$_3$ (associated with both selected and unselected memory cells) can be provided with voltage V0, and each of signals BL_$W_A$, RSL0, and BL_$R_0$ can be provided with voltage V0.

The values of the voltages applied to the signals of FIG. 2C during a write operation can be used for any selected memory cell of memory cell group 201$_0$ (FIG. 2B). For example, if memory cell 213 is selected (memory cells 210, 211, and 212 are unselected) during a write operation, then the values of voltages provided to signals WWL0$_2$ and WWL0$_3$ in FIG. 2C can be swapped (e.g., WWL0$_2$=V0, and WWL0$_3$=V1), and other signals can remain at the values shown in FIG. 2C.

In another example, if memory cell 210 is selected (memory cells 211, 212, and 213 are unselected) during a write operation, the values of voltages provided to signals WWL0$_0$ and WWL0$_2$ in FIG. 2C can be swapped (e.g., WWL0$_0$=V1, and WWL0$_2$=V0), the values of voltages provided to BL_$W_A$ and BL_$W_B$ in FIG. 2C can be swapped (e.g., BL_$W_B$=V$_{BL\_W}$, and BL_$W_A$=V0), and other signals can remain at the values shown in FIG. 2C.

In another example, if memory cell 211 is selected (memory cells 210, 212, and 213 are unselected) during a write operation, the values of voltages provided to signals WWL0$_1$ and WWL0$_2$ in FIG. 2C can be swapped (e.g., WWL0$_1$=V1, and WWL0$_2$=V0), the values of voltages provided to BL_$W_A$ and BL_$W_B$ in FIG. 2C can be swapped (e.g., BL_$W_B$=V$_{BL\_W}$, and BL_$W_A$=V0), and other signals can remain at the values shown in FIG. 2C.

As shown in FIG. 2B, memory cells 210 and 211 can share write data line 231, and memory cells 212 and 213 can share write data line 232 (which is different from data line 231). In this configuration, two memory cells associated with different write data lines can be concurrently (e.g., simultaneously) selected during the same write operation to store (e.g., concurrently store) information in the two selected memory cells. For example, in a write operation, memory cells 210 and 212 can be concurrently selected; memory cells 210 and 213 can be concurrently selected: memory cells 211 and 212 can be concurrently selected; and memory cells 211 and 213 can be concurrently selected. As an example, if memory cells 210 and 212 are selected (e.g., concurrently selected) in a write operation, then the values of voltages can be provided, such that $WWL0_0=WWL0_2=V1$ (to turn on transistors T2 of memory cells 210 and 212), $WWL0_1=WWL0_3=V0$ (to turn on transistors T2 of memory cells 211 and 213), and other signals can remain at the values shown in FIG. 2C. In this example, the values of information to be stored in selected memory cells 210 and 212 can be the same (e.g., by providing the same voltage to signals $BL\_W_A$ and $BL\_W_B$) or can be different (e.g., by providing different voltages to signals $BL\_W_A$ and $BL\_W_B$).

The following description discusses an example read operation of memory device 200 of FIG. 2B. As assumed above, during a read operation, memory cell 212 (FIG. 2B) is a selected memory cell and memory cells 210, 211, and 213 are unselected memory cells. In the description herein, specific values for the voltages are used as an example. However, the voltages can have different values. During a read operation (FIG. 2C), signals $WWL0_0$, $WWL0_1$, $WWL0_2$, and $WWL0_3$ can be provided with a voltage V0 (e.g., $WWL0_0=WWL0_1=WWL0_2=WWL0_3=V0$) because transistors T2 of memory cells 210, 211, 212, and 213 can remain turned off (or may not need to be turned on) in a read operation. Signal $PL0_2$ (associated with selected memory cell 212) can be provided with a voltage V0. Signals $PL0_0$, $PL0_1$, and $PL0_3$ (associated with unselected memory cell 210, 211, and 213, respectively) can be provided with a voltage V2, such as $PL0_0=PL0_1=PL0_3=V2$. As an example, the value of voltage V2 can be substantially equal to VDD.

Other signals of memory device 200 during a read operation can be provided with voltages as shown in FIG. 2C. For example, signal RSL0 can be provided with a voltage V2 (to turn on select transistor 270), and each of signals $BL\_W_A$ and $BL\_W_B$ can be provided with voltage V0.

Based on the applied voltage V2 shown in FIG. 2C, transistor T1 of memory cells 210, 211, and 213 can turn on (regardless of (e.g., independent of) the value of information stored in memory cells 210, 211, and 213). Based on the applied voltage V0, transistor T1 of memory cell 212 may turn on or may remain turned off (may not turn on). For example, transistor T1 of memory cell 212 may turn on if the information stored in memory cell 212 is "0" and turn off (or remain turned off) if the information stored in memory cell 212 is "1". If transistor T1 of memory cell 212 is turned on, an amount of current may flow on a current path between read data line 220 and common conductive line 290 (through the turned-on transistors T1 of each of memory cells 210, 211, 212, and 213). If transistor T1 of memory cell 212 remains turned off (or is turned off), an amount of current may not flow between read data line 220 and common conductive line 290 (e.g., because no conductive path may form through transistor T1 of memory cell 212, which is turned off).

In FIG. 2C, signal $BL\_R_0$ can have a voltage $V_{BL\_R}$. The value of voltage $V_{BL\_W}$ can be based on the presence or absence of current (e.g., an amount of current) flowing between read data line 220 and common conductive line 290 (presence or absence of current is based on the value of information stored in memory cell 212). For example, the value of voltage $V_{BL\_W}$ can be $0<V_{BL\_R}<1V$ (or $0<V_{BL\_R}=1$), if information stored in memory cell 212 is "1", and the value of voltage $V_{BL\_W}$ can be $V_{BL\_R}=0$ if information stored in memory cell 212 is "0". Based on the value of voltage $V_{BL\_W}$ associated with signal $BL\_R_0$, memory device 200 can determine the value of information stored in memory cell 212 during this example read operation.

The description above assumes memory cell 212 is a selected memory cell during a read operation. The values of the signals in the chart shown in FIG. 2C can be similar if other memory cells (210, 211, and 213) of memory device are selected. For example, if memory cell 210 is selected, signals $PL0_0$, $PL0_1$, $PL0_2$, and $PL0_3$ can be provided with voltages V0, V2, V2, and V2, respectively; if memory cell 211 is selected, signals $PL0_0$, $PL0_1$, $PL0_2$, and $PL0_3$ can be provided with voltages V2, V0, V2, and V2, respectively; if memory cell 213 is selected, signals $PL0_0$, $PL0_1$, $PL0_2$, and $PL0_3$ can be provided with voltages V2, V2, V2, and V0, respectively. In this example, other signals can remain at the values shown in FIG. 2C.

The memory cells (e.g., memory cells 210, 211, 212, and 213) of memory device 200 can be randomly selected during a write operation or a read operation. Alternatively, the memory cells (e.g., memory cells 210, 211, 212, and 213) of memory device 200 can be sequentially selected during a write operation, a read operation, or both.

Figure 2D:
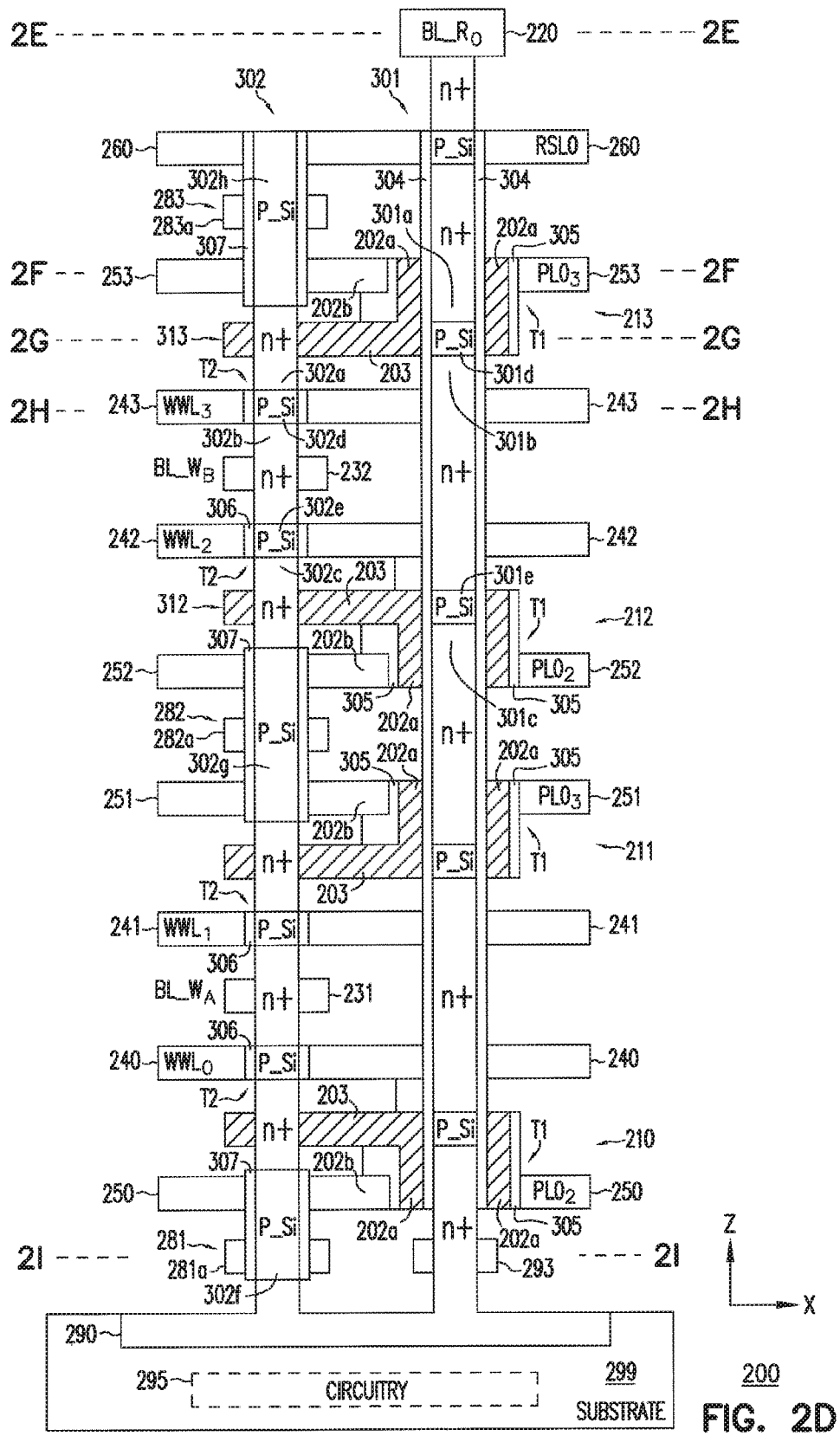
FIG. 2D shows a side view (e.g., cross-sectional view) of a structure of a portion of the memory device schematically shown in FIG. 2B, in which the memory cell structure of each memory cell can include parts from a double-pillar, according to some embodiments described herein.

FIG. 2D shows a side view (e.g., cross-sectional view) of a structure of a portion of memory device 200 schematically shown in FIG. 2B, in which the memory cell structure of each of memory cells 210, 211, 212, and 213 can include parts from double-pillar, according to some embodiments described herein. For simplicity, cross-sectional lines (e.g., hatch lines) are omitted from most of the elements shown in the drawings described herein.

As shown in FIG. 2D, memory device 200 can include a substrate 299 over which memory cells 210, 211, 212, and 213 can be formed (e.g., formed vertically) in different levels (physical internal levels) of memory device 200 with respect to the z-direction. Substrate 299 can include monocrystalline (also referred to as single-crystal) semiconductor material. For example, substrate 299 can include monocrystalline silicon (also referred to as single-crystal silicon). The monocrystalline semiconductor material of substrate 299 can include impurities, such that substrate 299 can have a specific conductivity type (e.g., n-type or p-type). Substrate 299 can include circuitry 295 formed in substrate 299. Circuitry 295 can include sense amplifiers (that can be similar to sensing circuitry 103 of FIG. 1), decoder circuitry (that can be similar to row and column access circuitry 108 and 109 of FIG. 1), and other circuitry of a memory device (e.g., a DRAM device) such as memory device 100.

Memory device 200 can include pillars (e.g., semiconductor material pillars) 301 and 302 having lengths extending in a direction perpendicular to (e.g., outwardly from) substrate 299 in the z-direction. The z-direction can be a vertical direction of memory device 200, which is a direction between common conductive line 290 and read data line 220. As shown FIG. 2D, pillars 301 and 302 are parallel with each other in the z-direction. As described in more detail below, each of memory cells 210, 211, 212, and 213 has a memory cell structure that includes parts of both pillars (double-pillar) 301 and 302.

In FIG. 2D, portions labeled "n+" can be n-type semiconductor material portions (n-type semiconductor material regions). The material of the n+ portions include semiconductor material (e.g., silicon) that can be doped (e.g., implanted) with dopants (e.g., impurities), such that the n+ portions are conductively doped portions (doped regions) that can conduct current. Portions labeled "P_Si" can be semiconductor material (e.g., silicon) and have a different type (e.g., conductivity type) from the n+ portions. Portions P_Si can be p-type semiconductor material (p-type semiconductor material regions). For example, portions P_Si can be p-type polysilicon portions. As described below, when a voltage is applied to a conductive element (e.g., a write word line) adjacent a particular portion P_Si, a channel (e.g., a conductive path) can be formed in a particular portion P_Si and electrically connect that particular P_Si portion with two n+ portions adjacent that particular portion P_Si.

As shown in FIG. 2D, each of pillars 301 and 302 can include different segments, in which each of the segments can include an n+ portion, a P_Si portion, or a combination of an n+ portion and a P_Si portion. For example, as shown in FIG. 2D, pillar 301 can have a segment that includes a portion 301a (n+ portion) and a portion 301d (P_Si portion) adjacent the structure (e.g., the material) of capacitor plate 202a of memory cell 213. In another example, pillar 301 can have a segment that includes a portion 301c (n+ portion) and a portion 301e (P_Si portion) adjacent the structure (e.g., the material) of capacitor plate 202a of memory cell 212. In a further example, pillar 301 can have segment that includes a portion 301b (n+ portion) adjacent portion 301d (P_Si portion). FIG. 2D also shows pillar 302 having portions 302a, 302b, 302c (n+ portions), 302d and 302e (P_Si portions) included in respective segments of pillar 302.

Each of transistors T1 can include parts of a combination of a particular portion P_Si of pillar 301 and two n+ portions of pillar 301 adjacent that particular P_Si portion. For example, portion 301d (P_Si portion) and portions 301a and 301b (n+ portions) can form parts of the body, source, and drain respectively, of transistor T1 of memory cell 213. In another example, portion 301e (P_Si portion) and portions 301b and 301c (n+ portions) can form parts of the body, source, and drain, respectively, of transistor T1 of memory cell 212.

Each of transistors T2 can include a combination of parts of a particular portion P_Si of pillar 302 and two n+ portions of pillar 302 adjacent that particular P_Si portion. For example, portion 302d (P_Si portion) and portions 302a and 302b (n+ portions) can form parts of the body, source, and drain, respectively, of transistor T2 of memory cell 213. In another example, portion 302e (P_Si portion) and portions 302b and 302c (n+ portions) can form parts of the body, source, and drain, respectively, of transistor T2 of memory cell 212.

As shown in FIG. 2D, memory cell structures of memory cells 212 and 213 can include conductive material 312 and 313, respectively. Examples of each of conductive materials 312 and 313 include polysilicon (e.g., conductively doped polysilicon), metals, or other conductive materials.

Conductive material 312 can include a portion that forms part of capacitor plate 202a of memory cell 212, a portion that contacts (e.g., electrically connected to (which is directly coupled to)) portion 302a (n+ portion) of pillar 302, and a portion that forms part of conductive connection 203 of memory cell 212.

Conductive material 313 can include a portion that forms part of capacitor plate 202a of memory cell 213, a portion that contacts (e.g., electrically connected to) portion 302b (n+ portion) of pillar 302, and a portion that forms part of conductive connection 203 of memory cell 213.

The memory cell structure of each of memory cells 210 and 211 is similar to the memory cell structures of memory cells 212 and 213, as shown in FIG. 2D. For simplicity, detailed description of the memory cell structures of memory cells 210 and 211 is omitted from the description of FIG. 2D.

As shown in FIG. 2D, memory device 200 can include a dielectric (e.g., dielectric material) 304 that can extend continuously along the length and a sidewall of pillar 301. Capacitor plate 202a of each of memory cells 210, 211, 212, and 213 can be separated (e.g., electrically isolated) from pillar 301 by dielectric 304.

Memory device 200 can include dielectrics (e.g., dielectric materials) 305. Capacitor plate 202a of each of memory cells 210, 211, 212, and 213 can be separated (e.g., electrically isolated) from a respective plate line (among plate lines 250, 251, 252, and 253) by one of dielectrics 305.

Memory device 200 can include dielectrics (e.g., dielectric materials) 306 and 307 located at respective locations (adjacent respective segment) of pillar 302, as shown in FIG. 2D. Each of write word lines 240, 241, 242, and 243 can be separated (e.g., electrically isolated) from pillar 302 by a respective dielectric among dielectrics 306. Each of write data line 231 and 232 can contact (e.g., electrically connect) a respective n+ portion of pillar 302. Each of plate lines 250, 251, 252, and 253 can be separated (e.g., electrically isolated) from pillar 302 by a respective dielectric among dielectrics 307.

Dielectrics 304, 305, 306, and 307 can be formed from the same dielectric material or different dielectric materials. For example, dielectrics 304, 305, 306, and 307 can be formed from silicon dioxide. In another example, dielectrics 304, 306, and 307 can be formed from silicon dioxide, and dielectric 305 can be formed from dielectric material having a dielectric constant greater than the dielectric constant of silicon dioxide.

As shown in FIG. 2D, each of read select lines 260, write word lines 240 through 243, and plate lines 250 through 253 can have a length in the x-direction, which is perpendicular to the z-dimension. Each of read data line 220 and write data lines 231 and 232 can have length in the y-direction (not shown), which is perpendicular to the x-dimension.

Common conductive line 290 can include a conductive material (e.g., a conductive region) and can be formed over a portion of substrate 299 (e.g., by depositing a conductive material over substrate 299). Alternatively, common conductive line 290 can be formed in or formed on a portion of substrate 299 (e.g., by doping a portion of substrate 299).

Memory device 200 can include a conductive portion 293, which can include conductively doped polysilicon, metals, or other conductive materials. Conductive portion 293 can be coupled to ground (not shown). Although common conductive line 290 can be coupled to ground, connecting pillar 301 to ground through conductive portion 293 may further improve a conductive path (e.g., current path) between read data line 220 and ground during read operation of memory device 200.

As shown in FIG. 2D, each of decoupling components 281, 282, and 283 can include a P_Si portion of pillar 302, a portion of one of dielectrics 307, and a portion of a conductive line among conductive lines 281a, 282a, and 283a. Examples of conductive lines 281a, 282a, and 283a include conductively doped polysilicon, metals, or other conductive materials. Decoupling components 281, 282, and 283 are in a "turned-off" state (e.g., permanently turned off (always off)) during operations (e.g., write and read operations) of memory device 200.

As mentioned above with reference to FIG. 2A, each of decoupling components 281 through 286 can be permanently placed in a turned-off state. The turned-off state of each of decoupling components 281, 282, and 283 can prevent current (e.g., stop current) from flowing from one location to another location across each of decoupling components 281, 282, and 283. This can create an electrical separation between elements associated with pillar 302 where current is undesirable to be flown between such elements. For example, decoupling component 282 in FIG. 2D can create an electrical separation between write data lines 231 and 232. This separation prevents information intended for storing in a selected memory cell from being stored in an unselected memory cell. For example, decoupling component 282 can prevent information from write data line 231 intended to be stored in selected memory cell 211 from being stored in an unselected memory cell 212, and prevent information from write data line 232 intended to be stored in selected memory cell 212 from being stored in an unselected memory cell 211.

In an alternative structure of memory device 200, decoupling components 281, 282, and 283 can have structures different from their structures shown in FIG. 2D as long as each of decoupling components 281, 282, and 283 can be an electrical isolation component. For example, in such an alternative structure, each of decoupling components 281, 282, and 283 can include a dielectric material in a respective portion of pillar 302. In this example, each of portions 302f, 302g and 302h can be a dielectric portion (e.g., a silicon oxide portion).

In FIG. 2D, each of read data line 220, write data lines 231 and 232, read select line 260, write word lines 240 through 243, plate lines 250 through 253, and capacitor plates 202a can be formed form a conductive material (or a combination of conductive materials). Examples of such a conductive material include polysilicon (e.g., conductively doped polysilicon), metals, or other conductive materials.

As shown in FIG. 2D, conductive material 313, and other elements (e.g., plate lines, write word lines, and write data lines), can be located along respective segments of pillars 301 and 302, as shown in FIG. 2D. For example, conductive material 313 can include a portion (the portion that forms part of capacitor plate 202a of memory cell 213) located along the segment of pillar 301 that includes portions 301a and 301d. Conductive material 313 can also include a portion that contacts portion 302a (n+ portion) of pillar 302. In another example, conductive material 312 can include a portion (the portion that forms part of capacitor plate 202a of memory cell 212) located along the segment of pillar 301 that includes portions 301c and 301e. Conductive material 312 can also include a portion that contacts portion 302c (n+ portion) of pillar 302. The conductive materials of plate lines 250 through 253, write word lines 240 through 243, and write data lines 231 and 232 can be located along respective segments of pillar 301 and 302, as shown in FIG. 2D.

In FIG. 2D, lines 2E, 2F, 2G, 2H, and 2I are sectional lines. As described below, some portions (e.g., partial top views) of memory device 200 taken from lines 2E, 2F, 2G, 2H, and 2I are shown in FIG. 2E, FIG. 2F, FIG. 2G, FIG. 2H, and FIG. 2I, respectively.

Figure 2E:
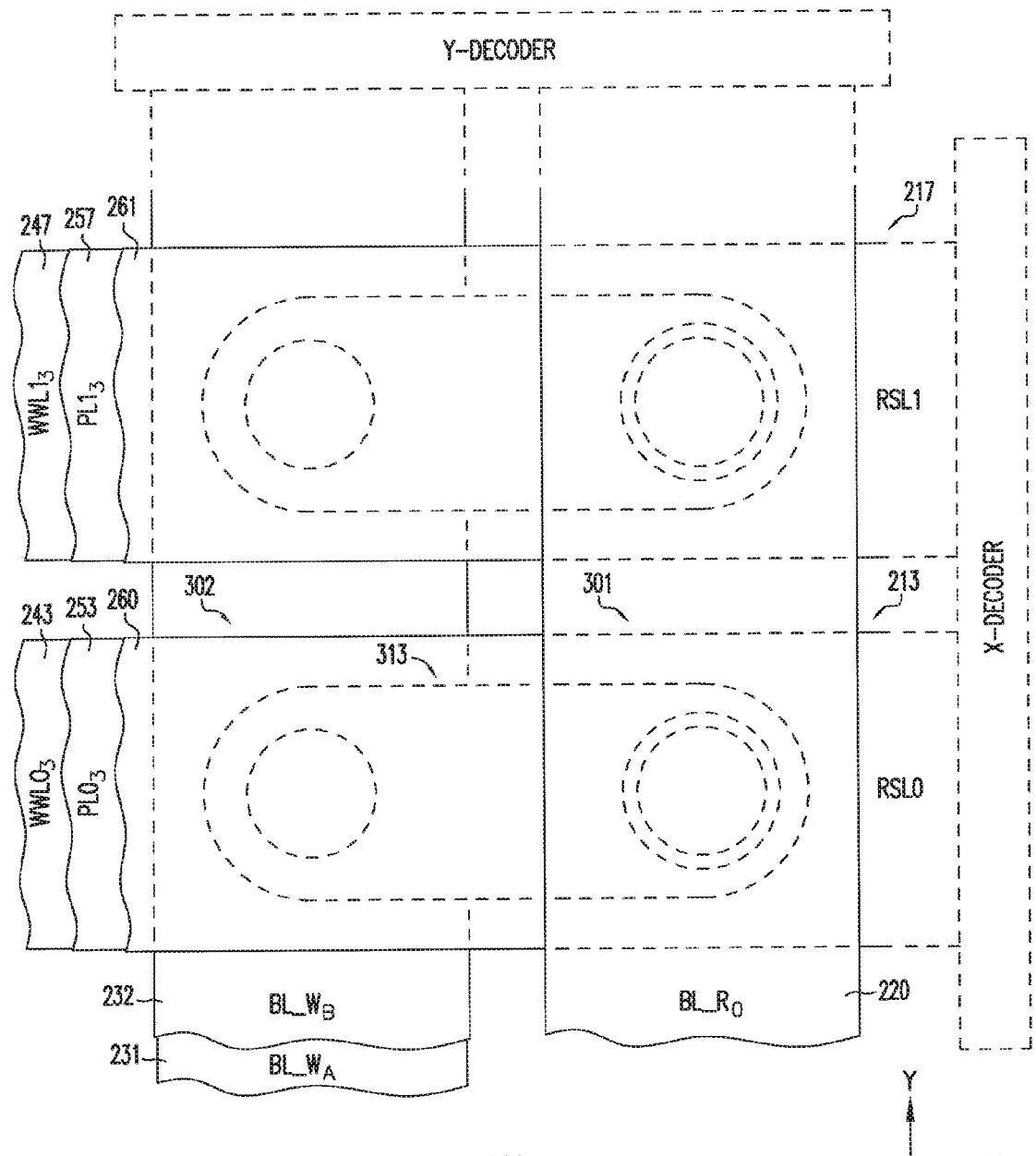

FIG. 2E shows a portion (e.g., partial top view) of memory device 200 including some elements viewed from line 2E of FIG. 2D down to substrate 299 of FIG. 2D, according to some embodiments described herein. For simplicity, detailed description of the same elements shown in FIG. 2A through FIG. 2D (and other figures described below) are not repeated.

For purposes of illustrating relative locations of some of the elements of memory device 200 (e.g., memory cells 213 and 217). FIG. 2E shows the locations for some elements of memory device 200 that are schematically shown in FIG. 2C but not structurally shown in FIG. 2D. For example, FIG. 2E shows memory cell 217 (FIG. 2A), read select line 261 (FIG. 2C), plate line 257 (FIG. 2C) and write word line 247 (FIG. 2C) that are schematically shown in FIG. 2C but not structurally shown in FIG. 2D. In another example, FIG. 2E shows an X-decoder and a Y-decoder that are not shown in FIG. 2D. The X-decoder and the Y-decoder in FIG. 2E can be part of circuitry 295 in substrate 299 in FIG. 2D of memory device 200. The X-decoder and the Y-decoder (FIG. 2E) can be part of respective row and column access circuitry of memory device 200.

As shown in FIG. 2E, each of read select line 260, plate line 253 (located below (underneath) read select line 260 with respect to the z-direction), and write word line 243 (located below (underneath) plate line 253 in the z-direction) can have a length extending in the x-direction. FIG. 2E does not show write word lines 242, 241, and 240 (FIG. 2D), which are located below write word line 243.

Similarly, in FIG. 2E, each of read select line 261, plate line 257 (located below read select line 261 with respect to the z-direction), and write word line 247 (located below plate line 257 with respect to the z-direction) can have a length extending in the x-direction. FIG. 2E does not show write word lines 244, 245, and 246 (FIG. 2A), which are located below write word line 247.

As shown in FIG. 2E, each of read data line 220, write data line 232, and write data line 231 (located below write data line 232 in the z-direction) can have a length extending in the y-direction.

Figure 2F:
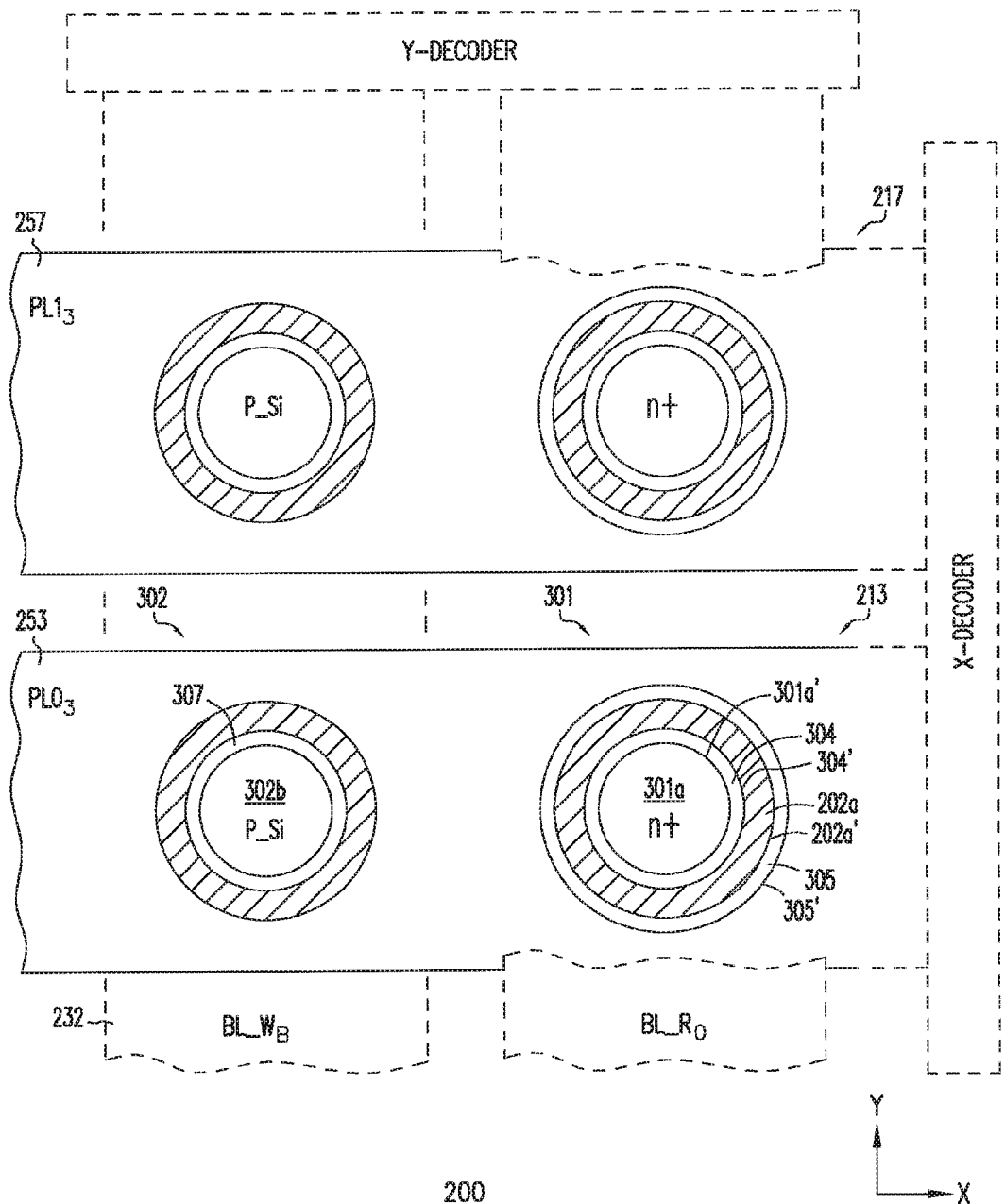

FIG. 2F shows a portion (e.g., partial top view) of memory device 200 including some elements viewed from line 2F of FIG. 2D down to substrate 299 of FIG. 2D, according to some embodiments described herein. As shown in FIG. 2F, portion 301a (which is a segment of pillar 301 that includes n+ portion) can include a sidewall 301a' (e.g., circular sidewall). Dielectric 304 can include a sidewall 304' (e.g., circular sidewall). Capacitor plate 202a (formed from a portion of conductive material 313 in FIG. 2D) can include a sidewall 202a' (e.g., circular sidewall). Dielectric 305 can include a sidewall 305' (e.g., circular sidewall).

Dielectric 304 can include a portion surrounding sidewall 301a'. Capacitor plate 202a can include a portion surrounding sidewall 304' of dielectric 304. Dielectric 305 can include a portion surrounding sidewall 202a' of capacitor plate 202a. The conductive material of plate line 253 can include a portion surrounding sidewall 305' of dielectric 305.

Figure 2G:
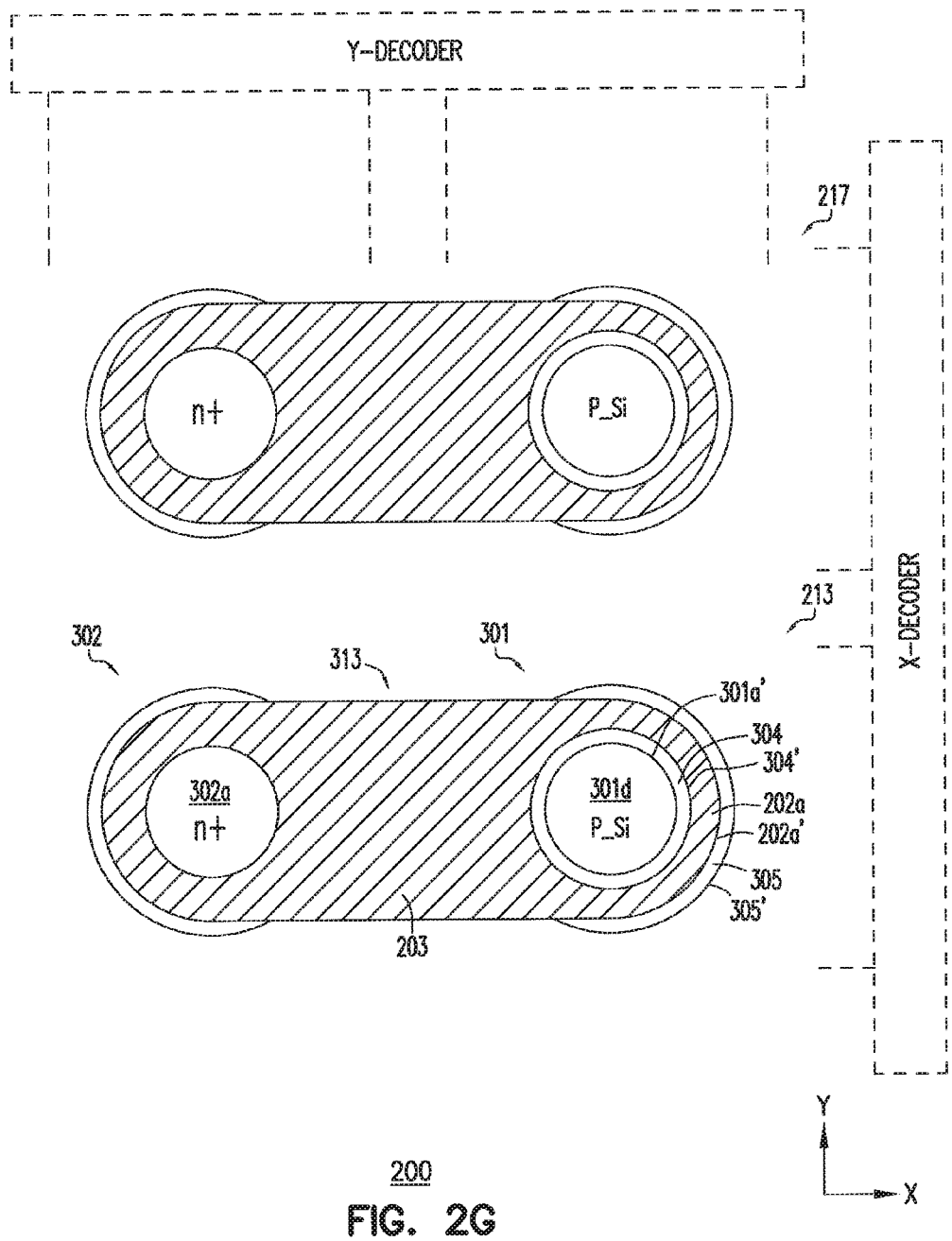

FIG. 2G shows a portion (e.g., partial top view) of memory device 200 including some elements viewed from line 2G of FIG. 2D down to substrate 299 of FIG. 2D, according to some embodiments described herein. As shown in FIG. 2G, conductive material 313 can include a portion that forms capacitor plate 202a, and a portion contacting (e.g., electrically connected to) portion 302a (n+ portion) of pillar 302. Material 313 also include a portion that forms part of conductive connection 203.

Figure 2H:
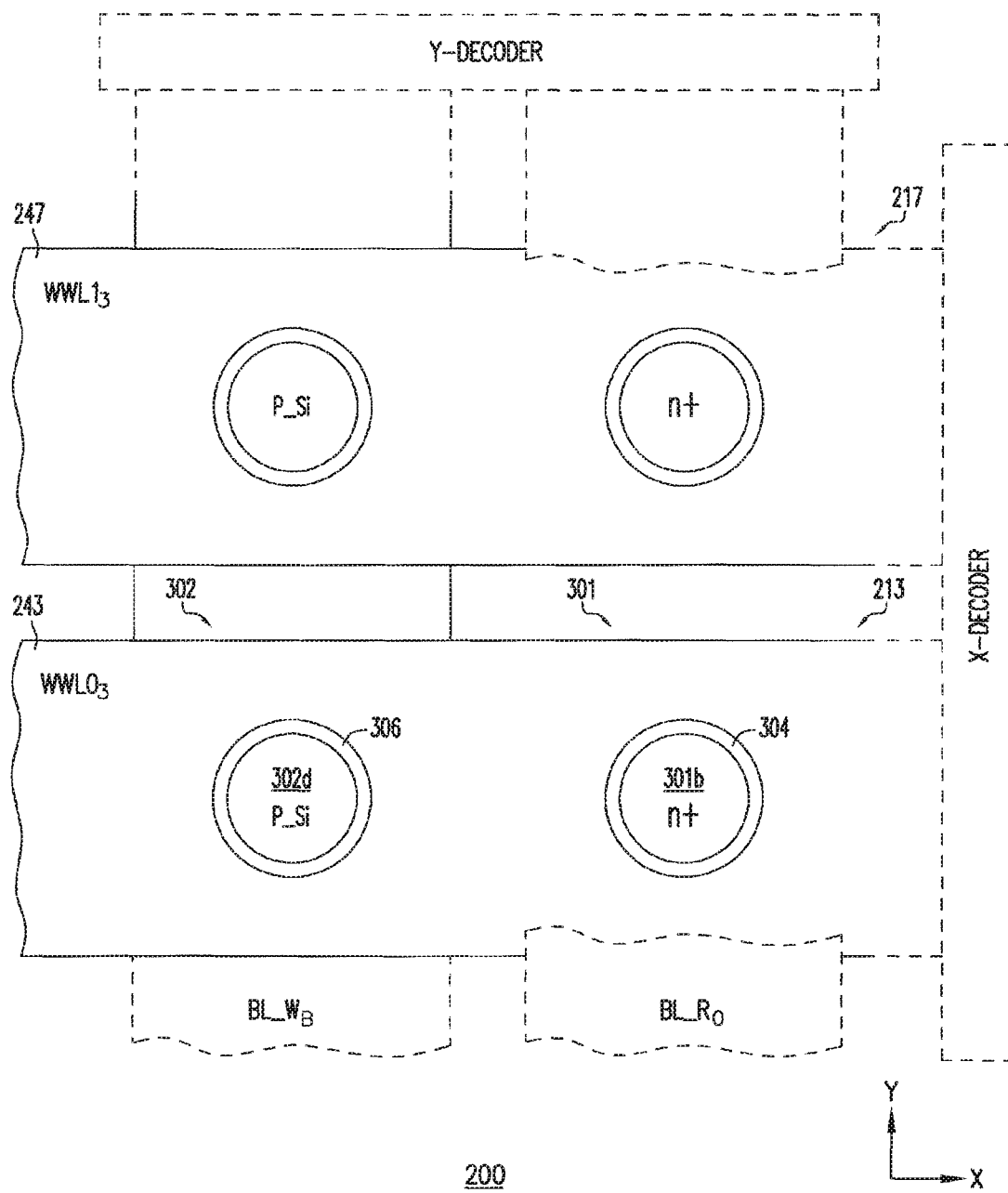
Figure 21:
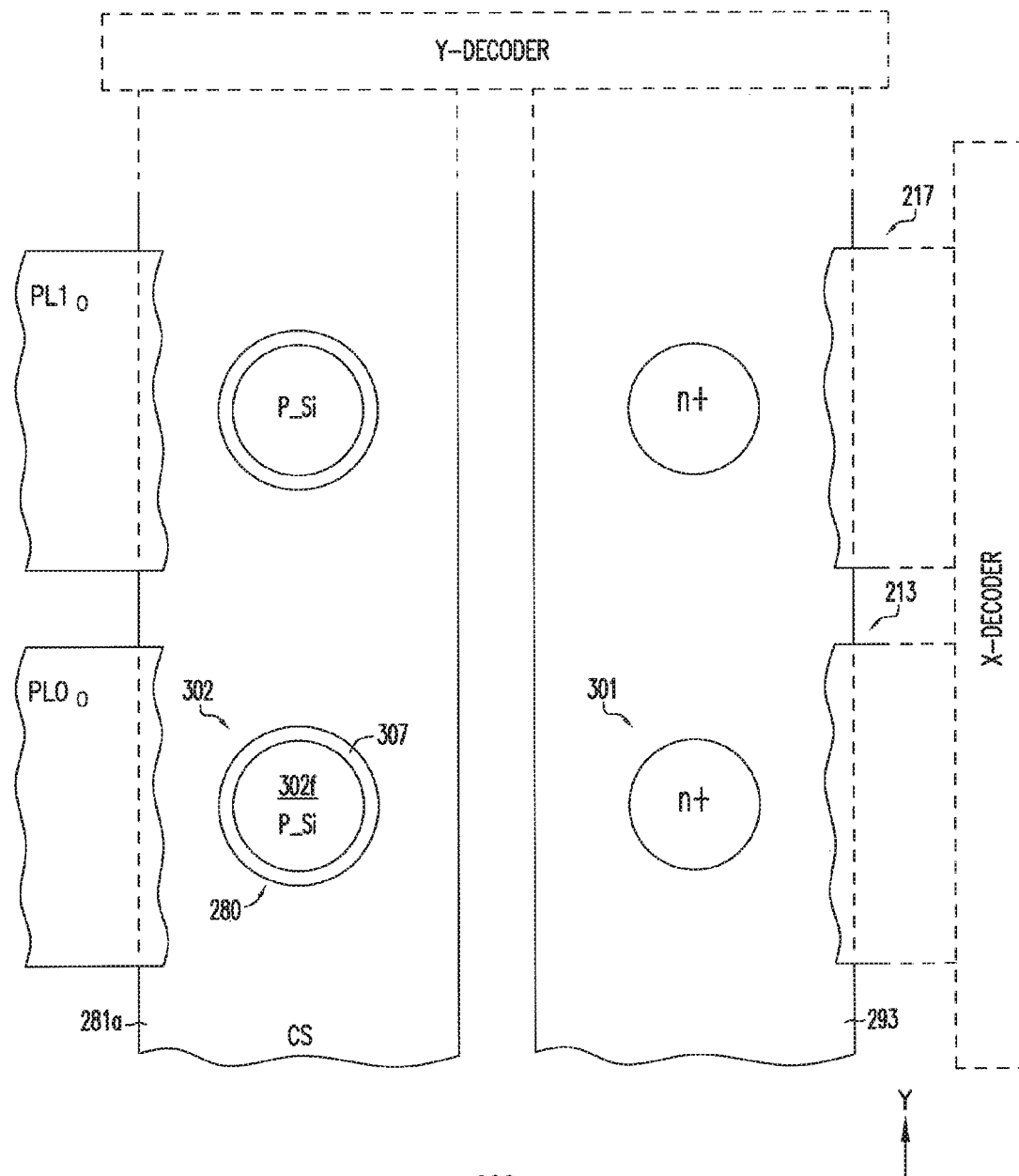

FIG. 2H shows a portion (e.g., partial top view) of memory device 200 including some elements viewed from line 2H of FIG. 2D down to substrate 299 of FIG. 2D, according to some embodiments described herein. As shown in FIG. 2H, write word line 243 (which is formed from a conductive material) can include a portion separated from portion 301b of pillar 301 by dielectric 304, and a portion separated from portion 302d of pillar 302 by a dielectric 306.

FIG. 2I shows a portion (e.g., partial top view) of memory device 200 including some elements viewed from line 2I of FIG. 2D down to substrate 299 of FIG. 2D, according to some embodiments described herein. As shown in FIG. 2I, decoupling component 280 can include a portion of conductive lines 281a separated from portion 302f (P_Si portion) of pillar 302 by dielectric 307. Conductive portion 293 can contact (electrically connected to) n+ portion of pillar 301.

As described above with reference to FIG. 2A through FIG. 2I, memory device 200 can include memory cells (e.g., 210, 211, 212, and 213) stacked over a substrate (e.g., substrate 299). The memory cells (e.g., 210, 211, 212, and 213) can be grouped into individual memory cell groups, in which memory device 200 can include multiple (e.g., two) write data lines (e.g., 231 and 232) associated with each memory cell group to provide information to be stored in respective memory cells within each memory cell group.

In an alternative structure, memory device 200 can have more than two write data lines associated with each of memory cell groups $201_0$ and $201_1$. For example, in such an alternative structure, memory device 200 can include four write data lines separately coupled to memory cells 210, 211, 212, and 213, such that each of the four write data lines can be coupled to respective memory cells among memory cells 210, 211, 212, and 213. The four write data lines can be shared between memory cell groups $201_0$ and $201_1$. In the alternative structure (e.g., four write data lines), memory cell groups $201_0$ and $201_1$ can share a read data line like read data line 220 shown in FIG. 2A.

Memory device 200 can include other variations (e.g., single write data line associated with each memory cell group). One of such variations is described in detail with reference to FIG. 3A through FIG. 3F.

Figure 3A:
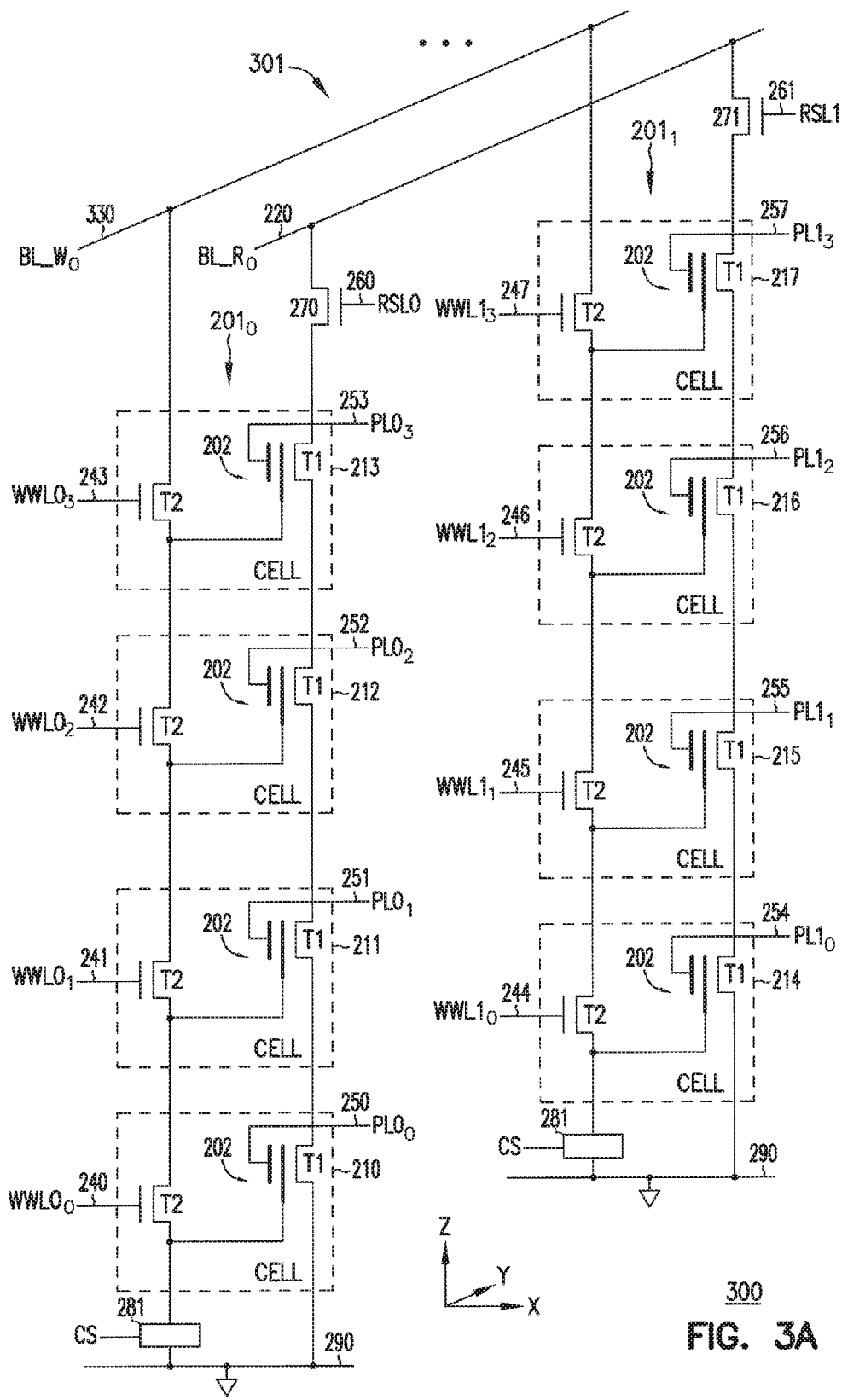
FIG. 3A shows a schematic diagram of a portion of a memory device that can be a variation of the memory device of FIG. 2A, according to some embodiments described herein.

FIG. 3A shows a schematic diagram of a portion of a memory device 300 that can be a variation of memory device 200 of FIG. 2A, according to some embodiments described herein. Memory device 300 can include elements that are similar to or identical to the elements of memory device 200. For simplicity, similar or identical elements between memory devices 200 and 300 are given the same reference labels.

As shown in FIG. 3A, memory device 300 includes one (e.g., only a single) write data line (e.g., write data line 330) for each of memory cell groups $201_0$ and $201_1$. As a comparison, memory device 200 includes more than one write data line (e.g., two write data lines 231 and 232) for each of memory cell groups $201_0$ and $201_1$. In FIG. 3A, write data line 330 can carry signal $BL\_W_0$. Write data line 330 can be shared by memory cell groups $201_0$ and $201_1$ of memory device 300.

Figure 3B:
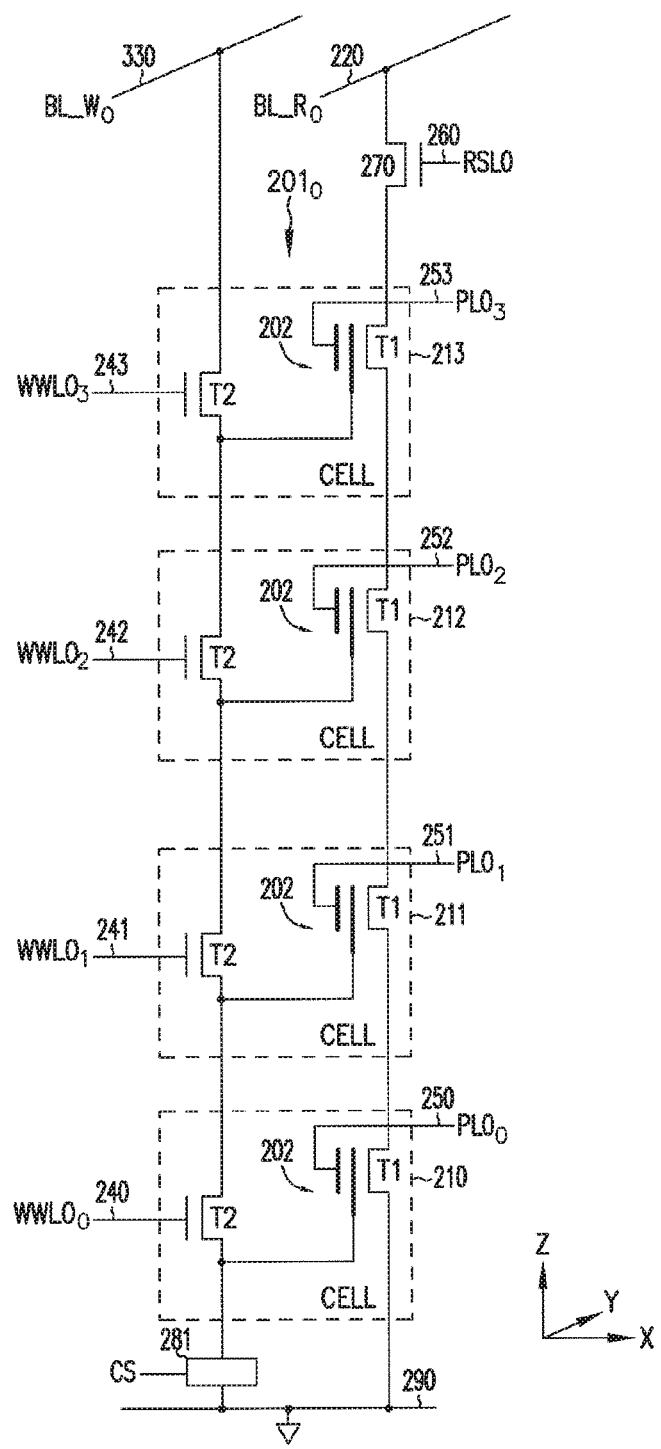
FIG. 3B shows a schematic diagram of a portion of the memory device of FIG. 3A.

FIG. 3B shows a schematic diagram of a portion of a memory device 300 of FIG. 3A including memory cell group $201_0$. As shown in FIG. 3B, memory cells 210, 211, 212, and 213 can be coupled between write data line 330 and common conductive line 290.

Memory device 300 can perform a write operation to store information in memory cells 210, 211, 212, and 213. The write operation in memory device 300 can be a sequential write operation, such that information can be sequentially stored in memory cells 210, 211, 212, and 213. For example, in the sequential write operation, memory cells 210, 211, 212, and 213 can be selected to store information one at a time in an order (e.g., a sequential order) starting at memory cell 210 and ending at memory cell 213. In this sequential order, memory cell 210 can be the first memory cell of memory cell group $201_0$ selected to store information, and memory cell 213 can be the last memory cell of memory cell group $201_0$ selected to store information. This means that memory device 300 may store information in memory cell 211 after (e.g., only after) information has been stored in memory cell 210, memory device 300 may store information in memory cell 212 after (e.g., only after) information has been stored in memory cells 210 and 211, and memory device 300 may store information in memory cell 213 after (e.g., only after) information has been stored in memory cell 210, 211, and 212.

During a write operation of memory device 300, information to be stored in a selected memory cell among memory cells 210, 211, 212, and 213 can be provided from write data line 330. The value (e.g., "0" or "1") of information to be stored in the selected memory cell can be based on the value of voltage provided to signal $BL\_W_0$.

Memory device 300 can perform a read operation to read (e.g., sense) information from memory cells 210, 211, 212, and 213. The read operation in memory device 300 can be similar to the read operation (e.g., a random read operation) of memory device 200 of FIG. 2A. For example, during a read operation of memory device 300, information read from a selected memory cell among memory cells 210, 211, 212, and 213 can be provided to read data line 220. Signal $BL\_R_0$ on read data line 220 can have different values depending on the value (e.g., binary 0 or binary 1) stored in the selected memory cell. Memory device 300 can detect the different values of signal $BL\_R_0$ to determine the value of information stored in the selected memory cell.

FIG. 3C is a chart showing example values of voltages provided to the signals of memory device 300 of FIG. 3B, during example write and read operations of memory device 300, according to some embodiments described herein. The signals in FIG. 3C ($WWL0_0$ through $WWL0_3$, $PL0_0$ through $PL0_3$, $BL\_W_0$, RSL0, and $BL\_R_0$) are the same as those shown in FIG. 3B. In the example write and read operation in FIG. 3C, memory cell 210 is assumed to be a selected memory cell, and memory cells 211, 212, and 213 are not selected (unselected). As described above with reference to FIG. 3B, a write operation in memory device 300 can be a sequential write operation. Thus, in the example write operation associated with FIG. 3C, memory cells 211, 212, and 213 may not have information stored in them when memory cell 210 is selected to store information. The following description refers to FIG. 3B and FIG. 3C.

As shown in FIG. 3C during a write operation, signals $WWL0_0$, $WWL0_1$, $WWL0_2$, and $WWL0_3$ (associated with memory cells 210, 211, 212, and 213, respectively) can be provided with a voltage V1, such as $WWL0_0=WWL0_1=WWL0_2=WWL0_3=V1$). Based on the applied voltage V1, transistor T2 (FIG. 3B) of memory cells 210, 211, 212, and 213 can turn on. Information from write data line 330 can be stored in memory cell 210 (through the turned-on transistor T2 of memory cell 210) and by way of providing voltage $V_{BL\_W}$ to signal $BL\_W_0$. The value (in volt unit) of voltage $V_{BL\_W}$ can be based on the value (e.g., "0 or "1") of information to be stored in memory cell 210. Other signals of memory device 300 during a write operation can be provided with voltages as shown in FIG. 3C. For example, each of signals $PL0_0$, $PL0_1$, $PL0_2$, and $PL0_3$ can be provided with the same voltage V0, and each of signal RSL0 and BL_R$_0$ can be also be provided with voltage V0.

During a read operation associated with FIG. 3C (memory cell 210 is the selected memory cell), signals WWL0$_0$, WWL0$_1$, WWL2, and WWL0$_3$ can be provided with a voltage V0 (e.g., WWL0$_0$=WWL0$_1$=WWL0$_2$=WWL0$_3$=V0). Signal PL0$_0$ (associated with selected memory cell 210) can be provided with a voltage V0. Signals PL0$_1$, PL0$_2$, and PL0$_3$ (associated with unselected memory cells 211, 212, and 213, respectively) can be provided with a voltage V2. Other signals of memory device 300 during a read operation can be provided with voltages as shown in FIG. 3C. For example, signal RSL0 can be provided with a voltage V2 (to turn on select transistor 270), and signal BL_W$_0$ can be provided with voltage V0. Signal BL_R$_0$ can have a voltage $V_{BL\_R}$. Based on the value of voltage $V_{BL\_R}$, memory device 300 can determine the value of information stored in memory cell 210 during a read operation described here.

FIG. 3D is a chart showing example values of voltages provided to the signals of memory device 300 of FIG. 3B, during example write and read operations of memory device 300, according to some embodiments described herein. In the example write and read operation in FIG. 3D, memory cell 212 is assumed to be a selected memory cell, and memory cells 210, 211, and 213 are not selected (unselected). As described above with reference to FIG. 3B, a write operation in memory device 300 can be a sequential write operation. Thus, at the time that memory cell 212 is selected to store information, other information has been stored in memory cells 210 and 211, and no information has been stored in memory cell 213. The following description refers to FIG. 3B, FIG. 3C, and FIG. 3D.

During a write operation of memory device 300 (FIG. 3C), signals WWL0$_0$ and WWL0$_1$ (associated with memory cells 210 and 211, respectively) can be provided with a voltage V0, such as WWL0$_0$=WWL0$_1$=V0). Signals WWL0$_2$ and WWL0$_3$ (associated with memory cells 212 and 213, respectively) can be provided with a voltage V1, such as WWL0$_2$=WWL0$_3$=V1). Based on the applied voltage V1, transistors T2 (FIG. 3B) of memory cells 210 and 211 can turn off, and transistors T2 of memory cells 212 and 213 can turn on. Information from write data line 330 can be stored in memory cell 212 (through the turned-on transistors T2 of memory cells 212 and 213) and by way of providing a voltage $V_{BL\_W}$ to signal BL_W$_0$. The value of voltage $V_{BL\_W}$ can be based on the value of information to be stored in memory cell 212. Other signals of memory device 300 during a write operation can be provided with voltages as shown in FIG. 3C. For example, each of signals PL0$_0$, PL0$_1$, PL0$_2$, and PL0$_3$ can be provided with voltage V0, and each of signals RSL0 and BL_R$_0$ can be provided with voltage V0.

During a read operation associated with FIG. 3D (memory cell 212 is the selected memory cell), the signals of memory device 300 shown in FIG. 3D can be the same as those shown in FIG. 3C. For simplicity, detailed operation of the read operation associated with FIG. 3D is not repeated here.

Figure 3E:
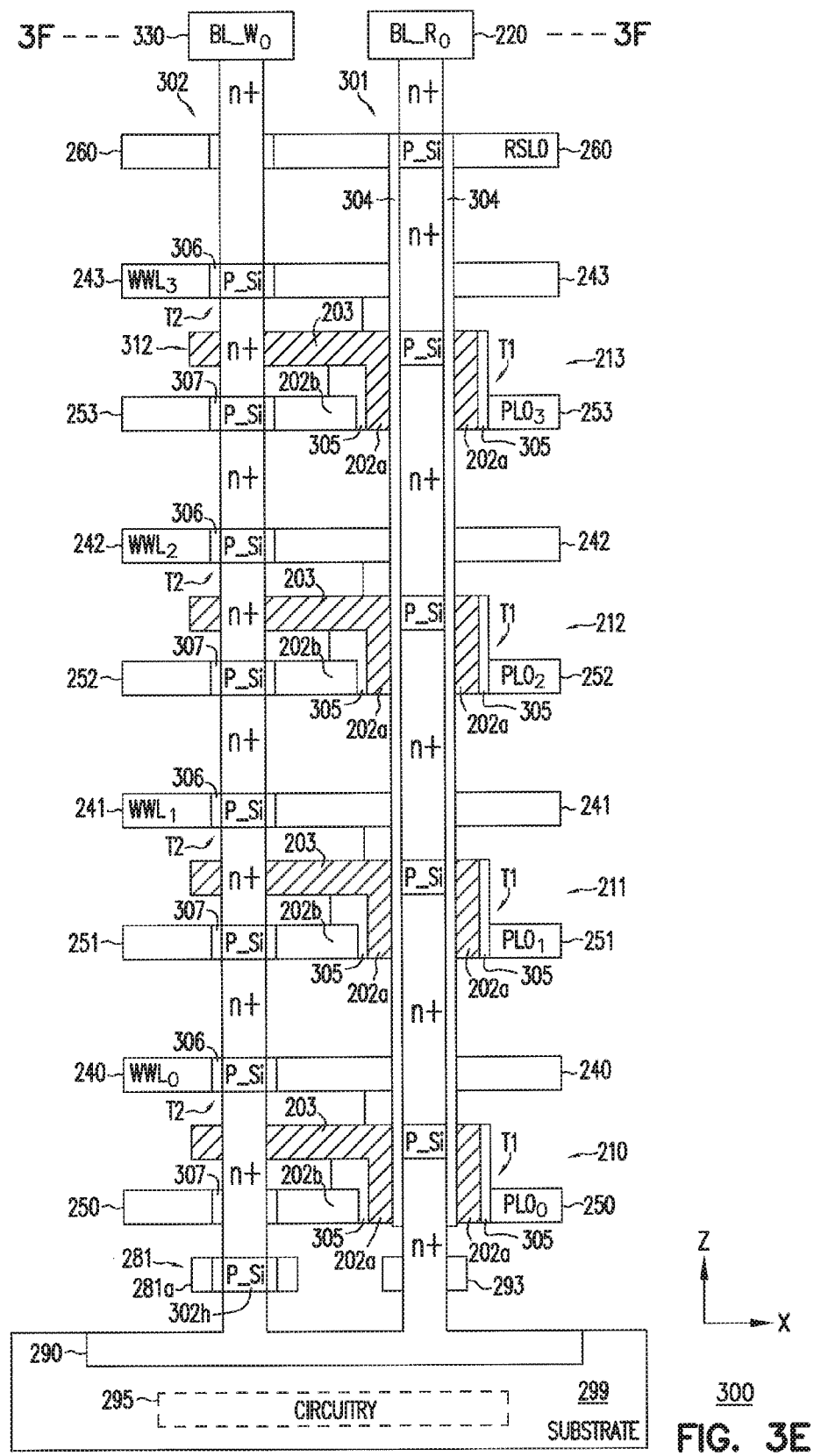
FIG. 3E shows a side view (e.g., cross-sectional view) of a structure of a portion of the memory device schematically shown in FIG. 3B, according to some embodiments described herein.

FIG. 3E shows a side view (e.g., cross-sectional view) of a structure of a portion of memory device 300 schematically shown in FIG. 3B, according to some embodiments described herein. The structure of memory device 300 shown in FIG. 3E includes elements that are similar to or identical to the structure of the memory device 200 shown in FIG. 2D. For simplicity, similar or identical elements between memory devices 200 (FIG. 2D) and 300 (FIG. 3E) are given the same reference labels.

As described above with reference to FIG. 3A, differences between memory devices 200 and 300 include the number of write data lines coupled to the memory cell groups of memory device 300. As shown in FIG. 3E, memory device 300 includes a single write data line 330 associated with memory cells 210, 211, 212, and 213. Unlike memory device 200 of FIG. 2D, memory device 300 of FIG. 3E can exclude (does not include) decoupling components 282 and 283 (FIG. 2D). In FIG. 3E, line 3F is a sectional line in which a portion (e.g., a partial top view) of memory device 300 can be viewed.

Figure 3F:
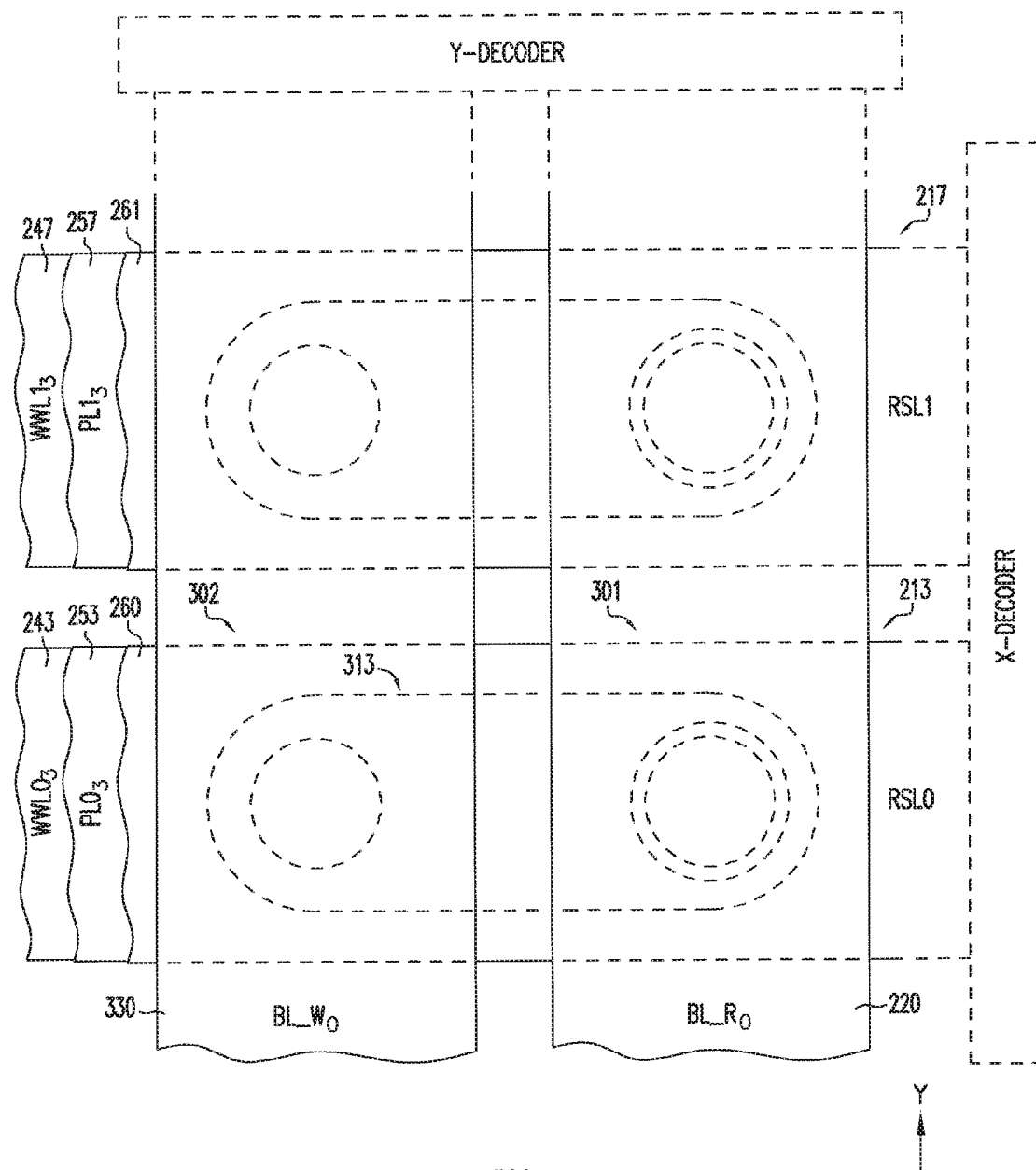
FIG. 3F shows a portion (e.g., partial top views) of the memory device of FIG. 3E, according to some embodiments described herein.

FIG. 3F shows a portion (e.g., partial top view) of memory device 300 including some elements viewed from line 3F of FIG. 3E down to substrate 299 (FIG. 3E), according to some embodiments described herein. As shown in FIG. 3F, write data line 330 can have a length extending the y-direction, which is the same as the direction of the length of read data line 220. The structures of other elements of memory device 300 shown in FIG. 3E are similar to the structure of memory device 200 shown in FIG. 2D through FIG. 2I. Thus, for simplicity, detailed description of other elements of memory device 300 is omitted.

Figure 4A:
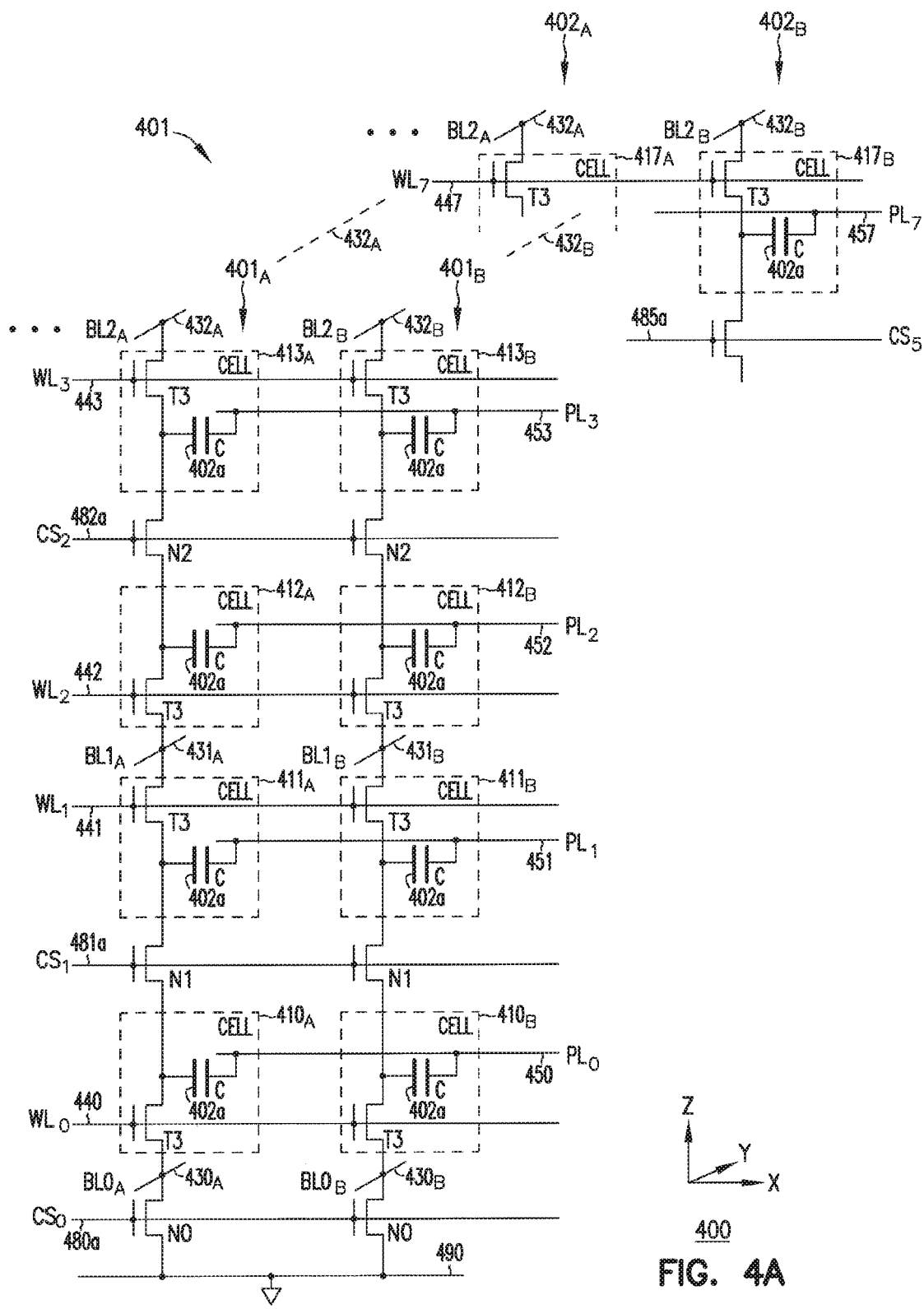
FIG. 4A shows a schematic diagram of a portion of a memory device including memory cells, in which the memory cell structure of each memory cell can include parts from a single-pillar, according to some embodiments described herein.

FIG. 4A shows a schematic diagram of a portion of a memory device 400 including memory cells, in which the memory cell structure of each of the memory cells 410, 411, 412, and 413 can include parts from a single pillar, according to some embodiments described herein. The memory cell structure of the memory cells of memory device 400 is described below with reference to FIG. 4B through FIG. 4F. As shown in FIG. 4A, memory device 400 can include a memory array 401. Memory device 400 can correspond to memory device 100 of FIG. 1. For example, memory array 401 can form part of memory array 101 of FIG. 1.

As shown in FIG. 4A, memory device 400 can include memory cell groups (e.g., strings) 401$_A$ and 401$_B$. Each of memory cell groups 401$_A$ and 401$_B$ can include the same number of memory cells. For example, memory cell group 401$_A$ can include four memory cells 410$_A$, 411$_A$, 412$_A$, and 413$_A$, and memory cell group 401$_B$ can include four memory cells 410$_B$, 411$_B$, 412$_B$, and 413$_B$. FIG. 4A shows four memory cells in each of memory cell groups 401$_A$ and 401$_B$ as an example. The memory cells in memory device 400 are volatile memory cells (e.g., DRAM cells).

FIG. 4A shows directions x, y, and z that can correspond to the directions x, y, and z directions of the structure (physical structure) of memory device 400 shown in FIG. 4B through FIG. 4F. As described in more detail below with reference to FIG. 4B through FIG. 4F, memory cells in each of memory cell groups 401$_A$ and 401$_B$ can be formed vertically (e.g., stacked over each other in a vertical stack in the z-direction) over a substrate of memory device 400.

As shown in FIG. 4A, memory device 400 can include switches (e.g., transistors) N0, N1, and N2 coupled to the memory cells of each of memory cell groups 401$_A$ and 401$_B$. Memory device 400 can include conductive lines 480a, 481a, and 482a that can carry signals CS$_0$, CS$_1$, and CS$_2$, respectively. Memory device 400 can use signals CS$_0$, CS$_1$, and CS$_2$ to control (e.g., turn on or turn off) switches N0, N1, and N2, respectively, during write and read operations of memory device 400.

Memory device 400 can include data lines (bit lines) 430$_A$, 431$_A$, and 432$_A$ associated with memory cell group 401$_A$. Data lines 430$_A$, 431$_A$, and 432$_A$ can carry signals BL0$_A$, BL1$_A$, and BL2$_A$, respectively, to provide information to be stored in respective memory cells (e.g., during a write operation) or information read (e.g., sensed) from respective memory cells (e.g., during a read operation) $410_A$, $411_A$, $412_A$, and $413_A$ of memory cell group $401_A$.

Memory device 400 can include data lines (bit lines) $430_B$, $431_B$, and $432_B$ associated with memory cell group $401_B$. Data lines $430_B$, $431_B$, and $432_B$ can carry signals $BL0_B$, $BL1_B$, and $BL2_B$, respectively, to provide information to be stored in (e.g., during a write operation) or information read (e.g., sensed) from (e.g., during a read operation) respective memory cells $410_B$, $411_B$, $412_B$, and $413_B$ of memory cell group $401_B$.

Memory device 400 can include word lines 440, 441, 442, and 443 that can be shared by memory cell groups $401_A$ and $401_B$. Word lines 440, 441, 442, and 443 can carry signals $WL_0$, $WL_1$, $WL_2$, and $WL_3$, respectively. During a write operation or a read operation, memory device 400 can use word lines 440, 441, 442, and 443 to access the memory cells of memory cell groups $401_A$ and $401_B$.

Memory device 400 can include plate lines 450, 451, 452, and 453 that are shared by memory cell groups $401_A$ and $401_B$. Plate lines 450, 451, 452, and 453 can carry signals $PL_0$, $PL_1$, $PL_2$, and $PL_3$, respectively. Each of plate lines 450, 451, 452, and 453 can be used as a common plate (e.g., can be coupled to ground) for the capacitors (described below) of respective memory cells of memory cell groups $401_A$ and $401_B$. Memory device 400 can include a common conductive line 490, which can be similar to common conductive line 290 of memory device 200 or 300 described above.

As shown in FIG. 4A, each of memory cells $410_A$, $411_A$, $412_A$, and $413_A$ and each of memory cells $410_B$, $411_B$, $412_B$, and $413_B$ can include a transistor T3 and one capacitor C, such that each of these memory cells can be called a 1T1C memory cell. For simplicity, the same label T3 is given to the transistors of different memory cells among the memory cells of memory device 400, and the same label C is given to the capacitor of different memory cells of memory device 400.

As shown in FIG. 4A, capacitor C can include a capacitor plate 402a, and another capacitor plate that can be part of (e.g., electrically connected to) a respective plate line among plate lines 450, 451, 452, and 453. Capacitor plate 402a can form part of a storage node (e.g., a memory element) of a corresponding memory cell of the memory cells of memory device 400. Capacitor plate 402a of a particular memory cell can hold a charge that can be used to represent the value (e.g., "0" or "1") of information stored in a that particular memory cell. Capacitor plate 402a in a particular memory cell can be electrically connected (e.g., directly coupled) to a terminal (e.g., source or drain) of transistor T3 of that particular memory cell.

As shown in FIG. 4A, memory device 400 can include other elements, such as memory cell $417_A$ of a memory cell group $402_A$, memory cell $417_B$ of a memory cell group $402_B$, plate line 457 (and associated signal $PL_7$), and conductive line 485a (and associated signal $CS_5$). Such other elements are similar to those described above. Thus, for simplicity, detailed description of such other elements of memory device 400 is omitted from the description herein.

Figure 4B:
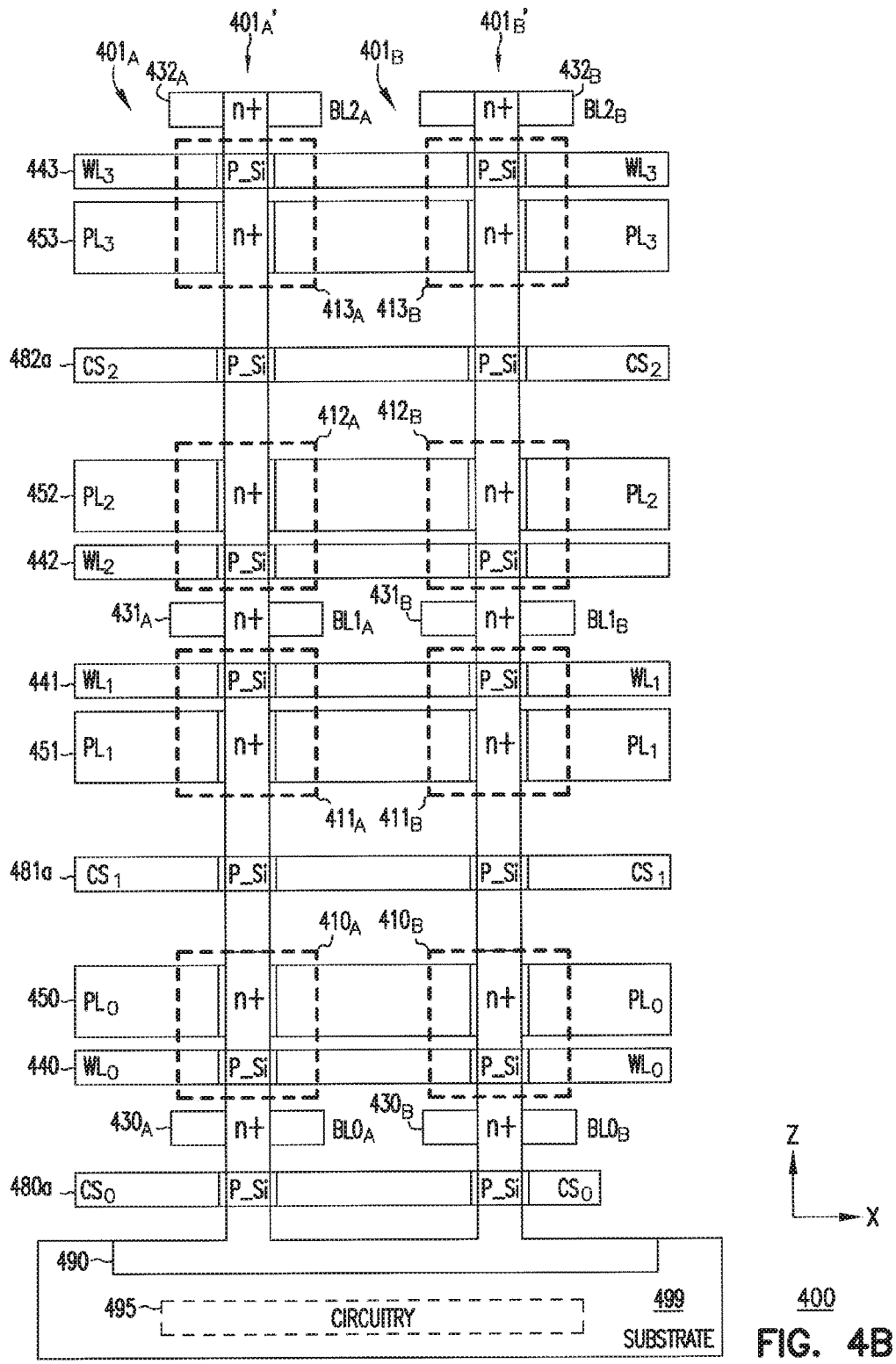
FIG. 4B shows a side view (e.g., cross-sectional view) of a structure of a portion of the memory device schematically shown in FIG. 4A, according to some embodiments described herein.

FIG. 4B shows a side view (e.g., cross-sectional view) of a structure of a portion of memory device 400 that is schematically shown in FIG. 4A, in which the memory cell structure of each of the memory cells can include parts from a single pillar, according to some embodiments described herein.

As shown in FIG. 4B, memory device 200 can include a substrate 499, and pillars (e.g., semiconductor material pillars) $401_A'$ and $401_B'$ formed over substrate 499. Each of pillars $401_A'$ and $401_B'$ has a length extending in the z-direction (e.g., vertical direction) perpendicular to substrate 499. Each of pillars $401_A'$ and $401_B'$ can include n+ portions and P_Si portions. Memory cells $410_A$, $411_A$, $412_A$, and $413_A$ can be formed (e.g., formed vertically with respect to substrate 499) along different segments of pillar $401_A'$. Memory cell $410_A$, $411_B$, $412_B$, and $413_B$ can be formed (e.g., formed vertically with respect to substrate 499) along different segments of a pillar $401_B'$. Memory device 400 can include circuitry 495 formed in substrate 499. Substrate 499, common conductive line 490, and circuitry 495 can be similar to substrate 299, common conductive line 290, and circuitry 295, respectively, of memory device 200 (FIG. 2D). The signals of memory device 400 shown in FIG. 4B (e.g., signals $BL0_B$, $BL1_B$, $BL2_B$, $WL0_0$, $WL0_1$, $WL0_2$, $WL0_3$, $PL0_0$, $PL0_1$, $PL0_2$, $PL0_3$, $CS_0$, $CS_1$, and $CS_2$) are the same as those shown in FIG. 4A.

Figure 4C:
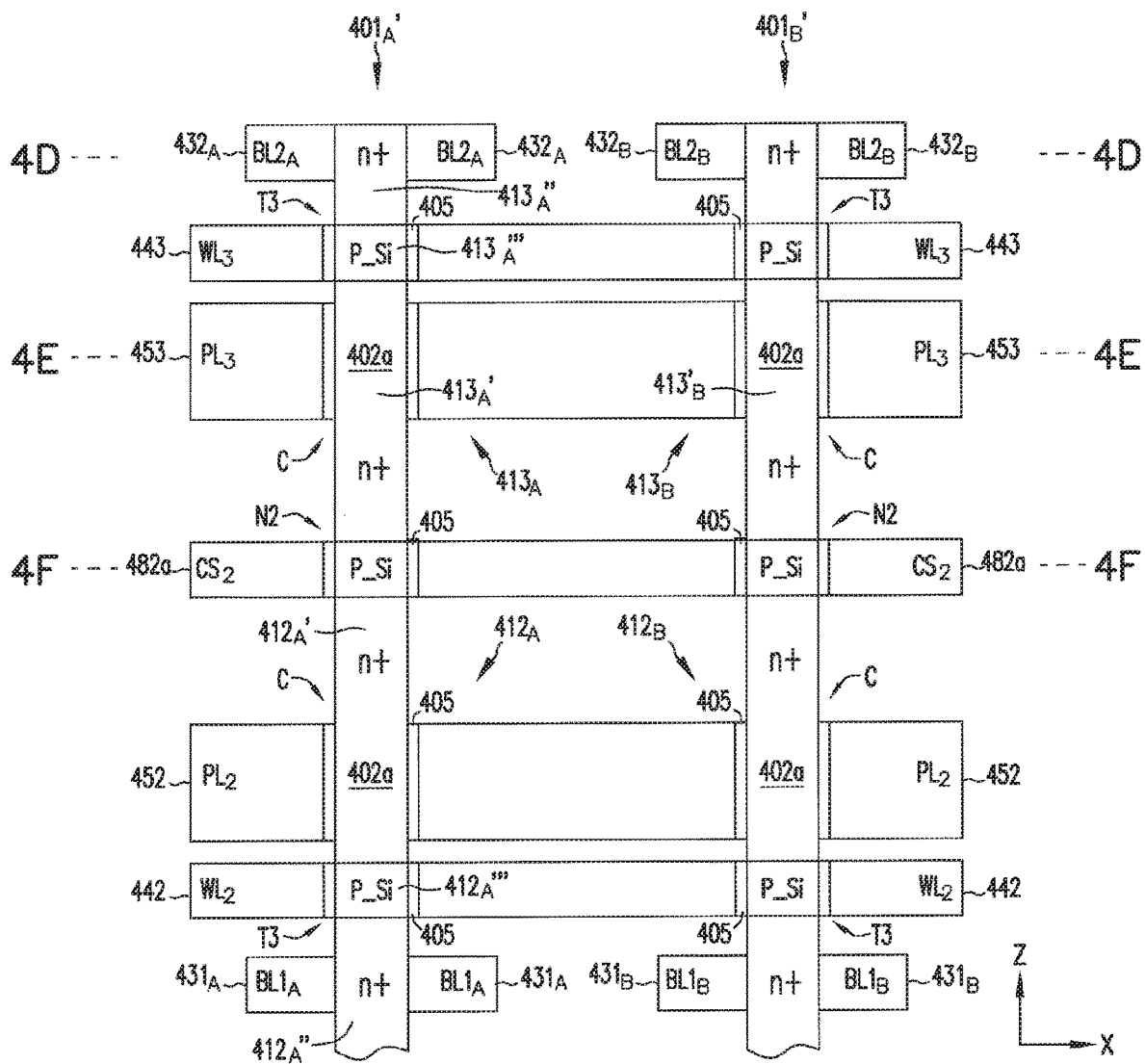
FIG. 4C shows a portion of the memory device of FIG. 4B.

FIG. 4C shows a portion of memory device 400 of FIG. 4B including memory cells $412_A$ and $413_A$ (of memory cell group $401_A$) and memory cells $412_B$ and $413_B$ (of memory cell group $401_B$). The following description discusses the portion of memory device 400 shown FIG. 4C in more detail. Elements in other portion of memory device 400 (e.g., portion that includes memory cells $410_A$, $410_B$, $411_A$, and $411_B$ in FIG. 4B) has similar structures as the elements shown in FIG. 4C and are not described herein for simplicity.

As shown in FIG. 4C, memory device 400 can include dielectrics (e.g., dielectric materials) 405 located at a respective location (adjacent respective segment) of pillar $401_A'$. Dielectrics 405 can include silicon oxide or other dielectric materials. Dielectrics 405 can separate (e.g., electrically isolate) pillars $401_A'$ and $401_B'$ from write word lines 440, 441, 442, and 443, plate lines 450, 451, 452, and 453, and conductive line 482a.

Each of data lines $431_A$ and $432_A$ can contact (e.g., electrically connect to) a respective n+ portion of pillar $401_A'$. Each of data lines $431_B$ and $432_B$ can contact (e.g., electrically connect to) a respective n+ portion of pillar $401_B'$.

Capacitor plate 402a (which is part of a storage node (or memory element) of a respective memory cell) can include (e.g., can be formed from) part of an n+ portion. For example, part of n+ portion $413_A'$ can be a storage node (e.g., a memory element) of memory cell $413_A$. In another example, part of n+ portion $413_B'$ can be a storage node (e.g., a memory element) of memory cell $413_B$.

Transistor T3 can include transistor elements (e.g., body, source, and drain) that are parts of a combination of a portion P_Si of a particular pillar (pillar $401_A'$ or $401_B'$) and two n+ portions adjacent the portion P_Si of the same particular pillar. Transistor T3 can also include a gate, which is part of a respective word line. For example, part of word line 443 can be the gate of transistor T3 of memory cell $413_A$, parts of n+ portions $413_A'$ and $413_A''$ can be the source and drain (or drain and source), respectively, of transistor T3 of memory cell $413_A$, and P_Si portion $413_A'''$ can be a body (e.g., floating body) of transistor T3 of memory cell $413_A$ (where a transistor channel can be formed in the body). In another example, part of word line 442 can be the gate of transistor T3 of memory cell $412_A$, parts of n+ portions $412_A'$ and $412_A''$ can be the source and drain (or drain and source), respectively, of transistor T3 of memory cell $412_A$, and P_Si portion $412_A'''$ can be a body (e.g., floating body) of transistor T3 of memory cell $412_A$ (where a transistor channel can be formed in the body).

Switch N2 can operate as a transistor, such that the structure of switch N2 can include the structure of a transistor. Switch N2 can include parts of a combination of a portion P_Si of a particular pillar (pillar $401_A'$ or $401_B'$) and two n+ portions adjacent the portion P_Si of the same particular pillar. For example, in switch N2 between memory cells $412_A$ and $413_A$, part of conductive line $482_A$, and n+ portions of pillar $401_A'$ and $401_B'$ can be the gate, source, and drain, respectively, of a transistor in switch N2.

Word lines 442 and 443, data lines $431_A$, $431_B$, $432_A$, and $432_B$, plate lines 452 and 453, and conductive line $482_A$ can include conductive materials. Examples of the conductive materials include polysilicon (e.g., conductively doped polysilicon), metals, or other conductive materials.

In FIG. 4C, lines 4D, 4E, and 4F are sectional lines. As described below, some portions (e.g., partial top views) of memory device 400 taken from lines 4D, 4E, and 4F are shown in FIG. 4D, FIG. 4E, and FIG. 4F, respectively.

Figure 4D:
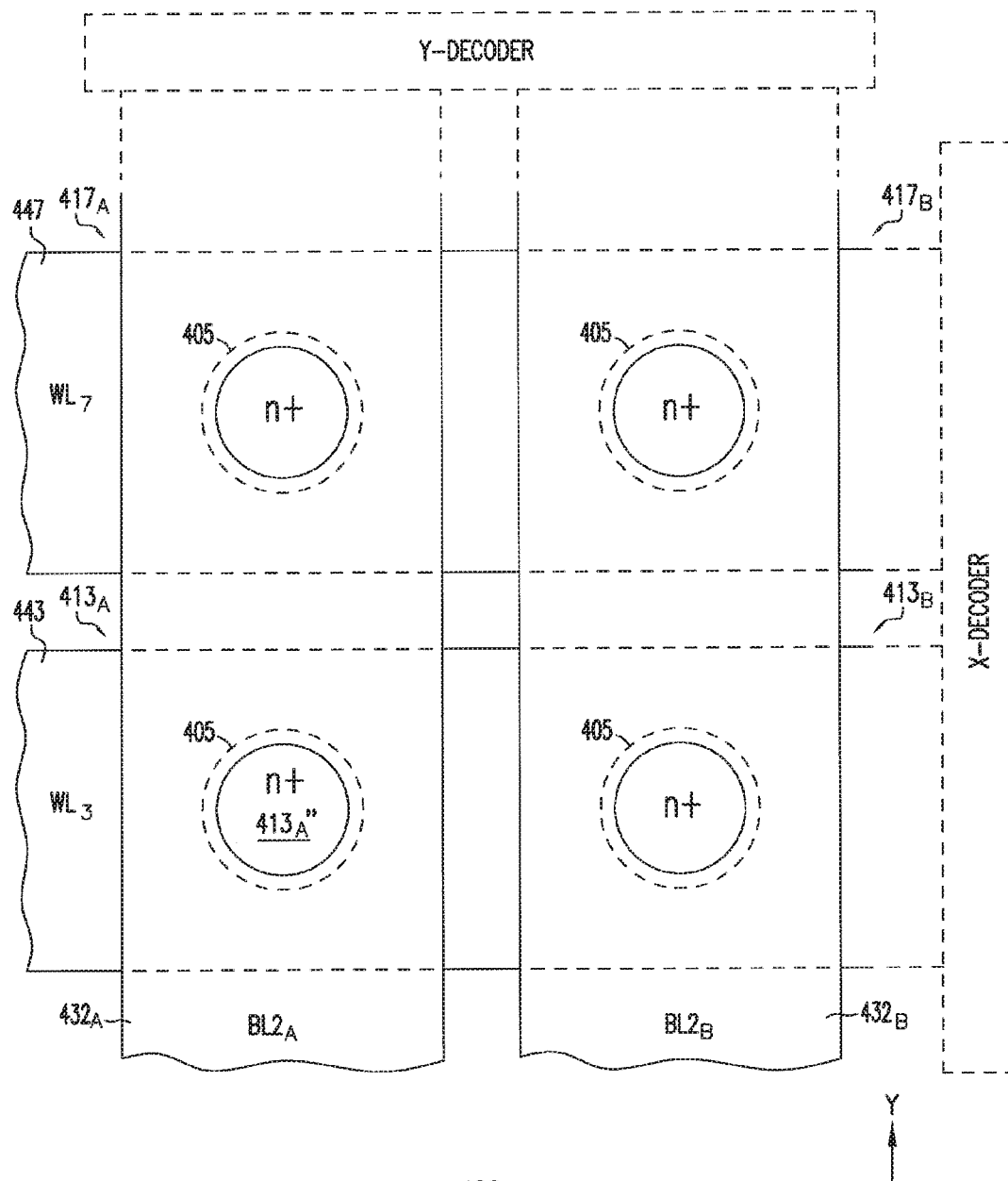
FIG. 4D through FIG. 4F show different portions (e.g., partial top views) of the memory device of FIG. 4C including some of the elements of the memory device viewed from different sectional lines of FIG. 4C, according to some embodiments described herein.

FIG. 4D shows a portion (e.g., partial top view) of memory device 400 including some elements viewed from line 4D of FIG. 4C down to substrate 499 (FIG. 4B), according to some embodiments described herein. For simplicity, detailed description of the same elements shown in FIG. 4A through FIG. 4C (and other figures described below) are not repeated.

Figure 4E:
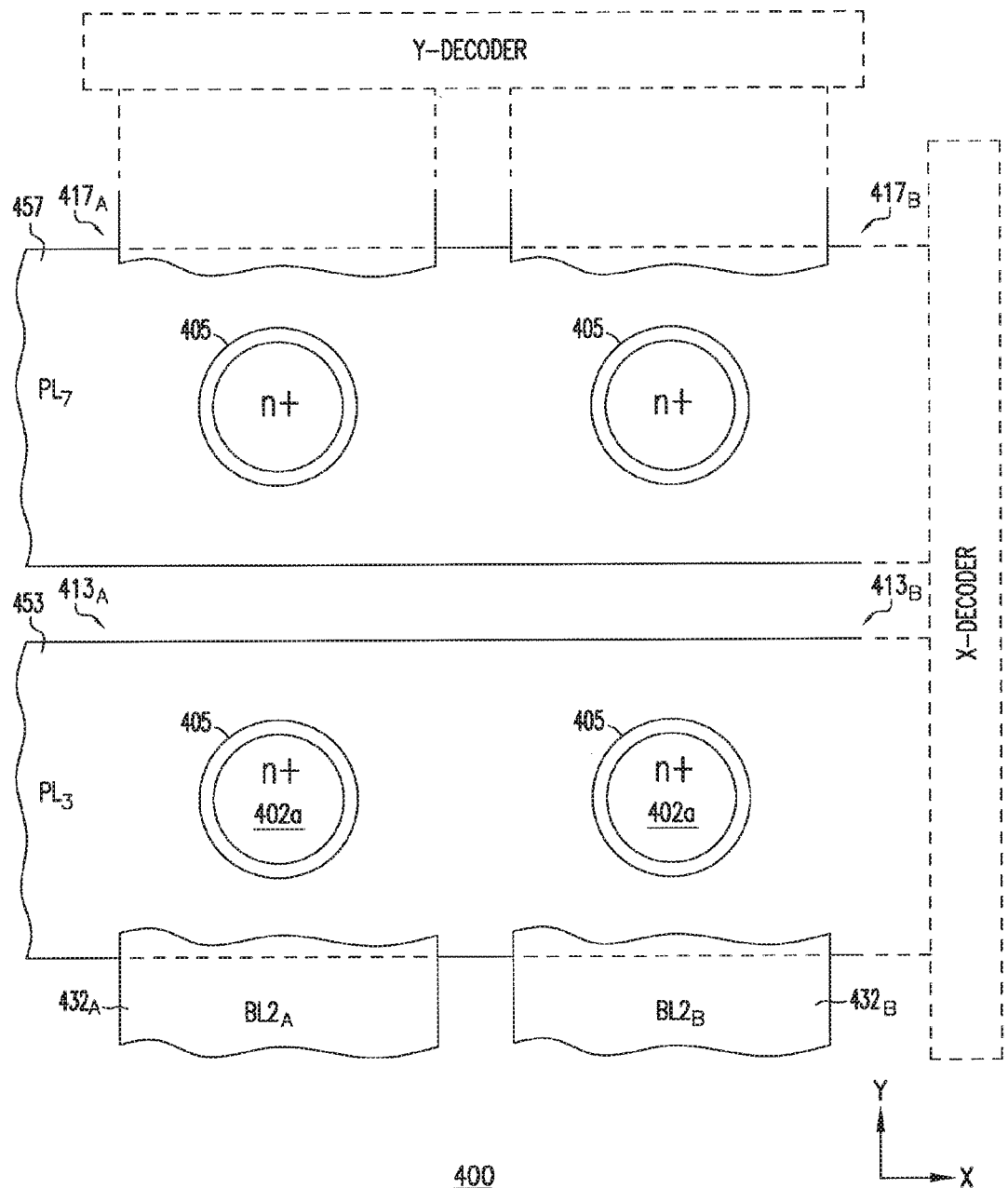
Figure 4F:
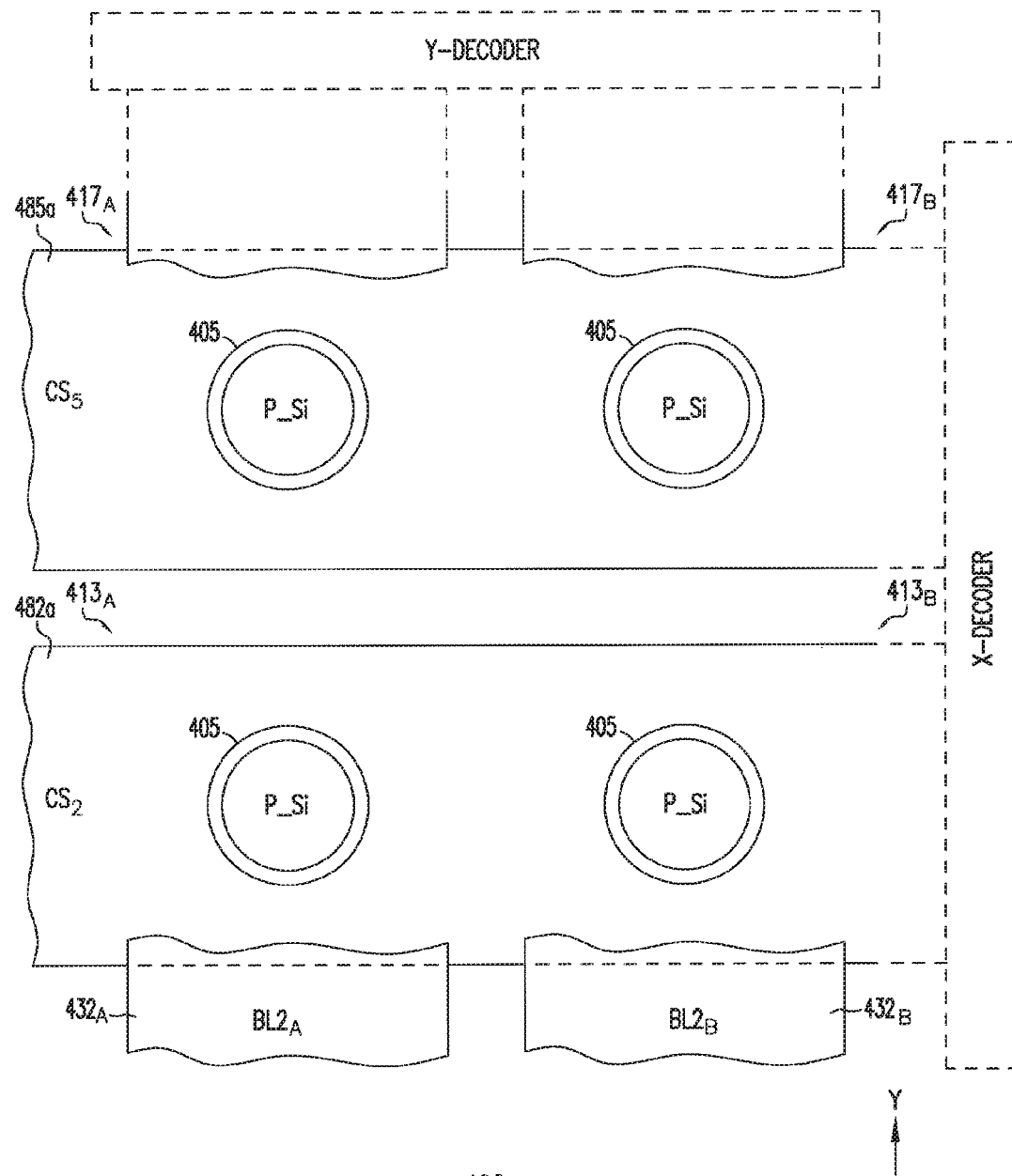

For purposes of illustrating relative locations of some of the elements of memory device 400, FIG. 4D through FIG. 4F show the locations for some elements of memory device 400 that are schematically shown in FIG. 4A but are not structurally shown in FIG. 4B and FIG. 4C. For example, FIG. 4D shows memory cells $417_A$ and $417_B$ and word lines 447 and 443 that are schematically shown in FIG. 4A but are not structurally shown in FIG. 4B and FIG. 4C. In another example, FIG. 4D shows an X-decoder and a Y-decoder that are not shown in FIG. 4A and FIG. 4B. However, the X-decoder and the Y-decoder in FIG. 4D can be part of circuitry 495 in substrate 499 in FIG. 4B of memory device 400. The X-decoder and the Y-decoder (FIG. 4D) can be part of respective row and column access circuitry of memory device 400. As shown in FIG. 4D, each of read data lines $432_A$ and $432_B$ can have a length extending in the y-direction. Each of word lines 443 and 447 can have a length extending in the x-direction and are located below (underneath) read data lines $432_A$ and $432_B$. FIG. 4D does not show other word lines of memory device 400 that are located below respective word lines 443 and 447.

FIG. 4E shows a portion (e.g., partial top view) of memory device 400 including some elements viewed from line 4E of FIG. 4C down to substrate 499 (FIG. 4B), according to some embodiments described herein. As shown in FIG. 4E, each of plate lines 453 and 457 can have a length extending in the x-direction. FIG. 4E does not show other plate lines of memory device 400 that are located below respective plate lines 453 and 457.

FIG. 4F shows a portion (e.g., partial top view) of memory device 400 including some elements viewed from line 4F of FIG. 4C down to substrate 499, according to some embodiments described herein. As shown in FIG. 4F, each of conductive lines 482a and 485a can have a length extending in the x-direction. FIG. 4F does not show other conductive lines of memory device 400 that are located below respective conductive lines 482a and 485a.

Figures 4G, 4H:
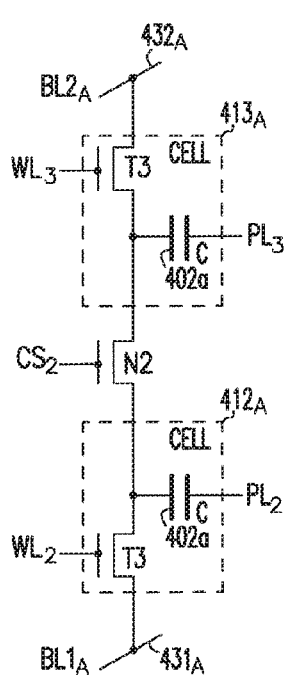
FIG. 4G shows a schematic diagram of a portion of the memory device of FIG. 4A.
FIG. 4H is a chart showing example values of voltages provided to the signals of the portion of the memory device of FIG. 4G during three different example write operations, according to some embodiments described herein.
Figure 41:
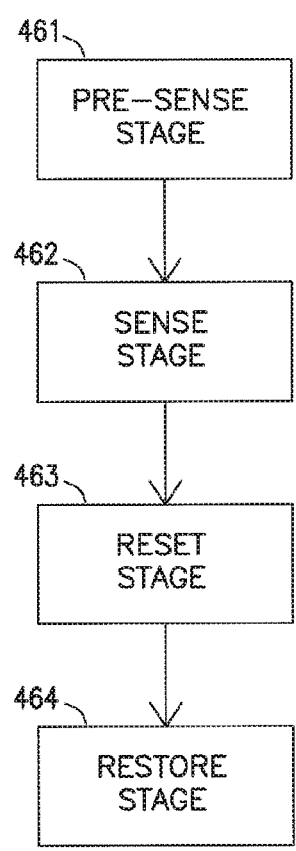

FIG. 4G shows a schematic diagram of a portion of memory device 400 of FIG. 4A including memory cells $412_A$ and $413_A$. FIG. 4H is a chart showing example values of voltages provided to the signals of memory device 400 of FIG. 4G during three different example write operations 421, 422, and 423, according to some embodiments described herein. The following description refers to FIG. 4G and FIG. 4H.

In write operation 421, memory cell $412_A$ is selected to store information, and memory cell $413_A$ is unselected (e.g., not selected to store information). In write operation 422, memory cell $413_A$ is selected to store information, and memory cell $412_A$ is unselected. In write operation 423 both memory cells $412_A$ and $413_A$ are selected to store information.

As shown in FIG. 4H, signal $CS_2$ can be provided with a voltage V3 (to turn off switch N2) during a write operation (e.g., write operation 421, 422, or 423) of memory device 400 regardless of which of memory cells $412_A$ and $413_A$ is selected. Voltage V3 can be 0V (e.g., ground). Each of signals $PL_2$ and $PL_3$ can be provided with a voltage V4 during a write operation (e.g., write operation 421, 422, or 423) of memory device 400 regardless of which of memory cells $412_A$ and $413_A$ is selected. Voltage V4 can be 0V (e.g., ground).

In write operation 421, signal $WL_3$ (associated with unselected memory cell $413_A$) can be provided with a voltage V5 (to turn off transistor T3 of unselected memory cell $413_A$). Voltage V5 can be 0V (e.g., ground). Signal $WL_2$ (associated with selected memory cell $412_A$) can be provided with a voltage V6 (to turn on transistor T3 of selected memory cell $412_A$). The value of voltage V6 is greater than the value of voltage V5 (V6>V5). The value of voltage V6 can be greater than a supply voltage (e.g., VDD) of memory device 500 (e.g., V6>VDD). Signal $BL2_A$ (associated with unselected memory cell $413_A$) can be provided with a voltage Vx, which can be 0V (e.g., Vx=V3 or Vx=V4) or voltage Vx can be some voltage (e.g., an optimal voltage) between 0V and VDD (e.g., one-half VDD) depending on the memory cell leakage characteristics. Signal $BL1_A$ (associated with selected memory cell $412_A$) can be provided with a voltage $V_{BL1}$. The value of voltage $V_{BL1}$ can be based on the value of information to be stored in memory cell $412_A$. For example, voltage $V_{BL1}$ can have one value (e.g., $V_{BL1}$=0V or $V_{BL1}$<0) if information to be stored in memory cell $412_A$ has one value (e.g., "0") and another value (e.g., $V_{BL1}$>0V (e.g., $V_{BL1}$=1V)) if information to be stored in memory cell $412_A$ has another value (e.g., "1"). As mentioned above, VDD is referred to represent some voltage levels, however, they are not limited to a supply voltage (e.g., VDD) of the memory device (e.g., memory device 400). For example, if an internal voltage generator of the memory device (e.g., memory device 400) generates an internal voltage less than VDD and uses that internal voltage to be the memory array voltage then VBL1 (FIG. 4H) can be less than VDD, but more than 0V depending on the memory array voltage.

In write operation 422, the voltages provided to signals $WL_2$ (associated with unselected memory cell $412_A$) and $WL_3$ (associated with selected memory cell $413_A$) can be swapped, such that $WL_2$=V5 and $WL_3$=V6. Signal $BL1_A$ (associated with unselected memory cell $412_A$) can be provided with a voltage Vx. Signal $BL2_A$ (associated with selected memory cell $413_A$) can be provided with a voltage $V_{BL2}$. The value of voltage $V_{BL2}$ can be based on the value of information to be stored in memory cell $413_A$. For example, voltage $V_{BL2}$ can have one value (e.g., $V_{BL2}$=0V or $V_{BL2}$<0) if information to be stored in memory cell $413_A$ has one value (e.g., "0") and another value (e.g., $V_{BL2}$>0V (e.g., $V_{BL2}$=1V, VDD, or greater than 0V)) if information to be stored in memory cell $413_A$ has another value (e.g., "1").

In write operation 423, both memory cells 412$_A$ and 413$_A$ are selected to store information. Thus, the voltages provided to signals associated with memory cells 412$_A$ and 413$_A$ can be the same as those in write operations 421 and 422 for a selected memory cell, such as WL$_2$=WL$_3$=V6, BL1$_A$=V$_{BL1}$, and BL2$_A$=V$_{BL2}$.

FIG. 4I is a flow chart showing different stages of a read operation 460 of memory device 400 of FIG. 4A through FIG. 4F, according to some embodiments described herein. As shown in FIG. 4I, read operation 460 (to read information from a selected memory cell) can include different stages, such as a pre-sense (e.g., pre-read) stage 461, a sense (or read) stage 462, a reset stage 463, and a restore stage 464. These stages (461, 462, 463, and 464) can be performed one stage after another in an order shown in FIG. 4I, starting from pre-sense stage 461. In FIG. 4I, sense stage 462 (to determine the value of information stored in a selected memory cell) can be performed in two different sense schemes. One sense scheme (e.g., shown in FIG. 4M) is based on the threshold voltage (Vt) shift of a transistor (e.g., transistor T3) coupled to the selected memory cell. An alternative sense scheme (e.g., FIG. 4M') is based on a property (e.g., self-latching) of a bipolar junction transistor, which is intrinsically built-in a transistor (e.g., transistor T3) of the selected memory cell. The stages (461, 462, 463, and 464) of read operation 460 are described in detail with reference to FIG. 4J through FIG. 4R.

Figures 4J, 4K:
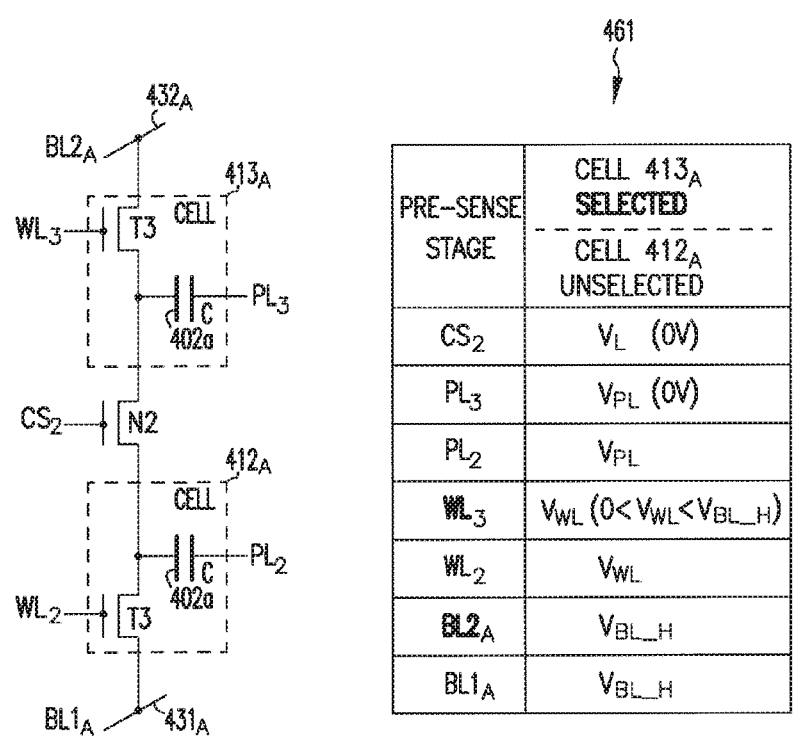
FIG. 4J shows a schematic diagram of a portion of the memory device of FIG. 2A.
FIG. 4K is a chart showing values of signals in FIG. 4J during a pre-sense stage based on impact ionization (II) current mechanism.

FIG. 4J shows a schematic diagram of a portion of memory device 400 of FIG. 4A including memory cells 412$_A$ and 413$_A$. FIG. 4K is a chart showing values of signals in FIG. 4J during pre-sense stage 461 of read operation 460 of FIG. 4I. The following description refers to FIG. 4J and FIG. 4K. Memory cell 413$_A$ is assumed to be a selected memory cell (to be read in this example), and memory cell 412$_A$ is assumed to be an unselected memory cell (not to be read in this example).

Pre-sense stage 461 can be performed to store (e.g., temporarily store) information in the body of transistor T3 of memory cell 413$_A$ and information in the body of transistor T3 of memory cell 412$_A$. The bodies of transistors T3 of memory cell 413$_A$ and 412$_A$ are included in P_Si portions 413''' and 412''', respectively, in FIG. 4C. Referring to FIG. 4J and FIG. 4K, the value of the information stored in the body of transistor T3 of memory cell 413$_A$ is based on the value of the information stored in capacitor plate 402a of memory cell 413$_A$. The value of the information stored in the body of transistor T3 of memory cell 412$_A$ is based on the value of the information stored in capacitor plate 402a (FIG. 4C and FIG. 4J) of memory cells 412$_A$.

Reading information from a selected memory cell (e.g., memory cell 413$_A$ in this example) involves detection of current (e.g., an amount of current) on a conductive path (e.g., current path) between a data line associated with the selected memory cell and a data line associated with an adjacent unselected memory cell (e.g., memory cell 412$_A$ in this example). For example, in FIG. 4K, reading information from memory cell 413$_A$ can involve detection of current on a conductive path between data lines 432$_A$ and 431$_A$.

Information stored in capacitor plate 402a of the selected memory cell and information stored in capacitor plate 402a of the unselected memory cell may be lost after reading of information from the selected memory cell. In pre-sense stage 461 (FIG. 4K), temporarily storing information in the body of transistor T3 of each of memory cells 412$_A$ and 413$_A$ allows restoring (writing back) information to the selected memory cell and the unselected memory cell after the selected memory cell is read (e.g., sensed). Thus, in a read operation of a selected memory cell (e.g., memory cell 413$_A$), the body of transistor T3 to the selected memory cell and the body of transistor T3 of an adjacent unselected memory cell (e.g., memory cell 412$_A$) can be used as temporary storage locations.

The voltages shown in FIG. 4K can allow information to be stored in the body of transistor T3 in the selected memory cell and the unselected memory cell. The information temporarily stored in the body of transistor T3 can be in the form of holes. Holes in the body of transistor T3 as described here refers to an extra amount of holes that may be generated in the material (e.g., P_Si material) that forms part of the body of transistor T3.

As shown in FIG. 4K, in pre-sense stage 461, signals CS$_2$ can be provided with a voltage V$_L$ (e.g., 0V) to turn off switch N2. Each of signals PL$_2$ and PL$_3$ can be provided with a voltage V$_{PL}$ (e.g., 0V). Each of signals BL1$_A$ and BL2$_A$ can be provided with a voltage V$_{BL\_H}$ (e.g., V$_{BL\_H}$=VDD). Each of signals WL$_2$ and WL$_3$ can be provided with a voltage V$_{WL}$. The value of voltage V$_{WL}$ can be selected (e.g., 0<V$_{WL}$<V$_{BL\_H}$) to slightly turn on transistor T3 of each of memory cells 412$_A$ and 413$_A$. This may allow impact ionization (II) current at the drain of transistor T3 of memory cells 413$_A$ and II current at the drain of transistor T3 of memory cell 413$_A$. The II currents allow generation of holes in the body of the transistor T3 of memory cells 412$_A$ and holes in the body of transistor T3 of memory cell 412$_A$. The presence or absence of holes in the body of transistor T3 of memory cells 413$_A$ represents the value ("0" or "1") of information stored in capacitor plate 402a of memory cells 413$_A$. Similarly, the presence or absence of holes in the body of transistor T3 of memory cells 412$_A$ represents the value ("0" or "1") of information stored in capacitor plate 402a of memory cells 412$_A$.

Pre-sense stage 461 in FIG. 4K may or may not generate holes in the body of transistor T3 of memory cell 413$_A$, depending upon the value of information stored in memory cell 413$_A$. For example, holes may be generated (e.g., accumulated) in the body of transistor T3 of memory cell 413$_A$ if "0" is stored in capacitor plate 402a of memory cell 413$_A$. In another example, holes may not be generated (e.g., not accumulated) in the body of transistor T3 of memory cell 413$_A$ if "1" is stored in capacitor plate 402a of memory cell 413$_A$. Similarly, holes may be generated (e.g., accumulated) in the body of transistor T3 of memory cell 412$_A$ if "0" is stored in capacitor plate 402a of memory cell 412$_A$. In another example, holes may not be generated (e.g., not accumulated) in the body of transistor T3 of memory cell 412$_A$ if "1" is stored in capacitor plate 402a of memory cell 412$_A$.

The presence or absence of holes in the body of transistor T3 of memory cell 413$_A$ can cause a change (e.g., shift) in the threshold voltage of memory cell 413$_A$. This change (e.g., temporary change) in the threshold voltage of transistor T3 allows a sense voltage to be provided to the gate of transistor T3 of a particular memory cell (e.g., memory cell 412$_A$ or 413$_A$ in) in sense stage 462 (e.g., described in more detail below) in order to determine the value of information that was stored (e.g., stored in capacitor plate 402a) of that particular memory cell.

As shown in FIG. 4K', in pre-sense stage 461, signals CS$_2$ can be provided with a voltage V$_L$ (e.g., 0V) to turn off switch N2. Each of signals PL$_2$ and PL$_3$ can be provided with a voltage V$_{PL}$ (e.g., 0V). Each of signals BL1$_A$ and BL2$_A$ can be provided with a voltage V$_{BL\_L}$ (e.g., V$_{BL\_L}$=0V). Each of signals WL$_2$ and WL$_3$ can be provided with a voltage V$_{WL}$. The value of voltage V$_{WL}$ can be selected (e.g., $V_{WL}$<0) to initiate the band to band tunneling current conduction of transistor T3 of each of memory cells $412_A$ and $413_A$. This may allow GIDL current at the drain of transistor T3 of memory cells $413_A$ and GIDL current at the drain of transistor T3 of memory cell $413_A$. The GIDL currents allow generation of holes in the body of the transistor T3 of memory cells $412_A$ and holes in the body of transistor T3 of memory cell $412_A$. The presence or absence of holes in the body of transistor T3 of memory cells $413_A$ represents the value ("1" or "0") of information stored in capacitor plate 402a of memory cells $413_A$. Similarly, the presence or absence of holes in the body of transistor T3 of memory cells $412_A$ represents the value ("1" or "0") of information stored in capacitor plate 402a of memory cells $412_A$.

Pre-sense stage 461 in FIG. 4K' may or may not generate holes in the body of transistor T3 of memory cell $413_A$, depending upon the value of information stored in memory cell $413_A$. For example, holes may be generated (e.g., accumulated) in the body of transistor T3 of memory cell $413_A$ if "1" is stored in capacitor plate 402a of memory cell $413_A$. In another example, holes may not be generated (e.g., not accumulated) in the body of transistor T3 of memory cell $413_A$ if "0" is stored in capacitor plate 402a of memory cell $413_A$. Similarly, holes may be generated (e.g., accumulated) in the body of transistor T3 of memory cell $412_A$ if "1" is stored in capacitor plate 402a of memory cell $412_A$. In another example, holes may not be generated (e.g., not accumulated) in the body of transistor T3 of memory cell $412_A$ if "0" is stored in capacitor plate 402a of memory cell $412_A$.

Figure 4M:
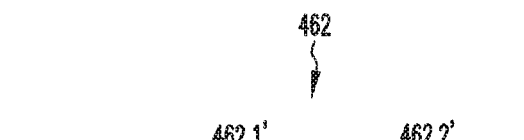
FIG. 4M is a chart showing values of signals in FIG. 4L during a sense stage using a sense scheme based threshold voltage shift.

FIG. 4L shows a schematic diagram of a portion of memory device 400 of FIG. 4A including memory cells $412_A$ and $413_A$. FIG. 4M is a chart showing values of signals in FIG. 4L during sense stage 462 using a scheme based threshold voltage shift. Sense stage 462 is performed after pre-sense stage 461 (FIG. 4K). FIG. 4N is a graph showing relationships among cell current (an amount of a current) flowing through a memory cell (e.g., $412_A$ or $413_A$), the value (e.g., "0" or "1") of information stored in a memory cell (e.g., $412_A$ or $413_A$), and voltages $V_{SENSE}$ and $V_{PASS}$ (that can be applied to the gate of transistor T3 of memory cell $412_A$, or $413_A$). The following description refers to FIG. 4L, FIG. 4M, and FIG. 4N.

As shown in FIG. 4M, sense stage 462 can include a sense interval 462.1 (which can occur from time T1 to time T2) and a sense interval 462.2 (which can occur from time T3 to time T4). Sense interval 462.2 occurs after sense interval 462.1 (e.g., times T3 and T4 occur after times T1 and T2). During sense interval 462.1, memory cell $413_A$ is sensed to determine the value of information stored in memory cell $413_A$. During sense interval 462.2 (after memory cell $413_A$ is sensed), memory cell $412_A$ is sensed to determine the value of information stored in memory cell $412_A$. Thus, in sense stage 462, memory cells $413_A$ and $412_A$ are sensed in a sequential fashion (one cell after another). FIG. 4M shows sensing of memory cell $413_A$ (during sense interval 462.1) is performed before sensing of memory cell 412 (during sense interval 462.2) as an example. Alternatively, a reversed order can be used, such that sensing of memory cell $412_A$ can be performed before sensing of memory cell $413_A$.

As mentioned above, information stored in both memory cells 413 and $412_A$ may be lost after sensing of one or both of memory cells $413_A$ and $412_A$. Thus, although only memory cell 413, is assumed to be a selected memory cell to read information from memory cell $413_A$, sensing both memory cells $413_A$ and $412_A$ during sense stage 462 allows the value (e.g., "0" or "1") of information stored in each of memory cells $413_A$ and $412_A$ to be obtained during sense stage 462. The obtained values (sensed values) can be stored (e.g., stored in storage circuitry (e.g., data buffers, latches, or other storage elements, not shown)) and can be subsequently used as values for information to be restored (e.g., written back) to both memory cells $413_A$ and $412_A$ during restore stage 464 (described below with reference to FIG. 4R). Sensing of memory cells $413_A$ and $412_A$ during sense stage 462 can be performed using voltages shown in FIG. 4M.

As shown in FIG. 4M, some signals can be provided with the same voltages between sense intervals 462.1 and 462.2. For example, signals $CS_2$ can be provided with a voltage $V_H$ ($V_H$>0V, e.g., $V_H$=VDD) to turn on switch N2 (FIG. 4L). Each of signals $PL_2$ and $PL_3$ can be provided with a voltage $V_{PL}$ (the same as the voltage in pre-sense stage 461 in FIG. 4K). Signal $BL2_A$ can be provided with a voltage $V_{BL\_H}$. Signal $BL1_A$ be provided with voltage $V_{BL\_L}$. The value of voltage $V_{BL\_L}$ (e.g., $V_{BL\_L}$=0V) is less than the value of voltage $V_{BL\_H}$.

Signals $WL_2$ and $WL_3$ can be provided with voltages $V_{SENSE}$ and $V_{PASS}$ (e.g., during sense interval 462.1), respectively, or voltages $V_{PASS}$ and $V_{SENSE}$ (during sense interval 461.2), respectively, depending on which of memory cells $413_A$ and $412_A$ is sensed. The value of voltage $V_{PASS}$ is greater than the value of voltage $V_{SENSE}$.

Voltage $V_{PASS}$ can have a value such that transistor T3 of the memory cell not being sensed (e.g., memory cells $412_A$ during sense interval 462.1) is turned on (e.g., becomes conductive) regardless of whether or not holes are present in the body of transistor T3 of the memory cell not being sensed (regardless of the value (e.g., "0" or "1") of information stored in capacitor plate 402a of the memory cell not being sensed). For example, during sense interval 462.1, transistor T3 of memory cells $412_A$ is turned on regardless of whether or not holes are present in the body of transistor T3 of the memory cell $412_A$. This also means that transistor T3 of memory cell $412_A$ is turned on regardless of the value (e.g., "0" or "1") of information that was stored in capacitor plate 402a of memory cell $412_A$ because the presence or absence of holes in the body of transistor T3 of the memory cell $412_A$ during sense stage 462 depends upon the value of information stored in capacitor plate 402a of memory cell $412_A$ before sense stage 462, as described above in the pre-sense stage 461.

In FIG. 4M, voltage $V_{SENSE}$ can have a value such that transistor T3 of the memory cell being sensed (e.g., memory cell $413_A$ during sense interval 462.1) is turned on or turned off depending whether or not holes are present in the body of transistor T3 of the memory cell being sensed. For example, during sense interval 462.1, transistor T3 of memory cell $413_A$ is turned on (e.g., becomes conductive) if holes are present in the body of transistor T3 of memory cell $413_A$. This also means that transistor T3 of memory cell $413_A$ is turned on if "0" (in the case of II and "1" in the case of GIDL) was stored in capacitor plate 402a of memory cell $413_A$ before pre-sense stage 461 (which is before sense stage 462) is performed. In another example, during sense interval 462.1, transistor T3 of memory cell $413_A$ is turned off (e.g., does not become conductive) if holes are absent from the body of transistor T3 of memory cell $413_A$. This also means that transistor T3 of memory cell $413_A$ is turned off if "1" was stored in capacitor plate 402a of memory cell $413_A$ before pre-sense stage 461 (which is before sense stage 462) is performed.

The values of voltages $V_{SENSE}$ and $V_{PASS}$ can be based on the current-voltage relationship shown in FIG. 4N for the case for the result of a pre-sense stage based on II current mechanism (FIG. 4K). Curve 410 indicates that current (cell current) may flow through a particular memory cell (e.g., through transistor T3 of that particular memory cell) if voltage $V_{SENSE}$ is provided to the signal (e.g., WL$_2$ or WL$_3$) at the gate of transistor T3 of that particular memory cell, and "0" is stored in capacitor plate 402a of that particular memory cell. As described above, holes may be generated in the body of transistor T3 of that particular memory cell if "0" is stored in capacitor plate 402a of that particular memory cell.

However, no current (or a negligible (e.g., undetectable) amount of current) may flow through a particular memory cell if voltage $V_{SENSE}$ is provided to the signal (e.g., WL$_2$ or WL$_3$) at the gate of transistor T3 of that particular memory cell, and "1" is stored in the particular memory cell. As described above, holes may not be generated in the body of transistor T3 of that particular memory cell if "1" is stored in capacitor plate 402a of that particular memory cell.

Curve 411 shows that current (cell current) may flow through a particular memory cell (e.g., through transistor T3 of that particular memory cell) if voltage $V_{PASS}$ is provided to the signal (e.g., WL$_2$ or WL$_3$) at the gate of transistor T3 of that particular memory cell, regardless of the value (e.g., "0" or "1") of information stored in that particular memory cell. In the case for the result of a pre-sense stage based on GIDL current mechanism (FIG. 4K'), curve 410 of FIG. 4N can present the case where holes may be generated in the body of transistor T3 of that particular memory cell if "1" is stored in capacitor plate 402a of that particular memory cell, and curve 411 can present the case where no holes may be generate in the body of transistor T3 of that particular memory cell if "0" is store in capacitor plate 402a of that particular memory cell.

Thus, during sense interval 462.1 (to sense memory cell 413$_A$), if transistor T3 of memory cell 413$_A$ is turned on (e.g., if holes are present in the body of transistor T3 of memory cell 413$_A$ (generated during pre-sense stage 461 of FIG. 4K)), then current may flow between data lines 431$_A$ and 432$_A$ (FIG. 4L) through transistor T3 of memory cell 413$_A$, switch N2 (which is turned on), and transistor T3 (which is turned on) of memory cell 412$_A$. During sense interval 462.1, if transistor T3 of memory cell 413$_A$ is turned off (e.g., if holes are absent from the body of transistor T3 of memory cell 413$_A$ (not generated during pre-sense stage 461 of FIG. 4K)), then current may not flow between data lines 431$_A$ and 432$_A$ (FIG. 4L) because transistor T3 of memory cell 413$_A$ is turned off (although switch N2 and transistor T3 of memory cell 412$_A$ are turned on).

Similarly, during sense interval 462.2 (to sense memory cell 412$_A$), if transistor T3 of memory cell 412$_A$ is turned on (e.g., if holes are present in the body of transistor T3 of memory cell 412$_A$ (generated during pre-sense stage 461 of FIG. 4K) in the body of transistor T3 of memory cell 412$_A$), then current may flow between data lines 431$_A$ and 432$_A$ (FIG. 4L) through transistor T3 of memory cell 413$_A$ (which is turned on), switch N2 (which is turned on), and transistor T3 of memory cell 412$_A$. During sense interval 462.1, if transistor T3 of memory cell 412$_A$ is turned off (e.g., if holes are absent from the body of transistor T3 of memory cell 412$_A$ (not generated during pre-sense stage 461 of FIG. 4K), then current may not flow between data lines 431$_A$ and 432$_A$ (FIG. 4L) because transistor T3 of memory cell 412$_A$ is turned off (although switch N2 and transistor T3 of memory cell 413$_A$ are turned on).

Memory device 400 can include a detection circuit (not shown) that can be coupled to data line 432$_A$ or data line 431$_A$. Memory device 400 can use the detection circuit to determine the value (e.g., "0" or "1") of information stored in the memory cell being sensed based on the presence or absence of current between data lines 432$_A$ and 431$_A$ during sense intervals 462.1 and 462.2. For example, during sense interval 462.1, memory device 400 can determine that "0" was stored in memory cell 413$_A$ if current is detected, and "1" was stored in memory cell 413$_A$ if no current (or a negligible of current) is detected. In another example, during sense interval 462.2, memory device 400 can determine that "0" was stored in memory cell 412$_A$ if current is detected, and "1" was stored in memory cell 412$_A$ if no current (or a negligible of current) is detected. Memory device 400 can include storage circuitry (e.g., data buffers, latches, or other storage elements) to store the values (e.g., "0" or "1") of information sensed from memory cells 412$_A$ and 413$_A$ during sense stage 462. Memory device 400 can used these stored values as values for information to be written back to memory cells 412$_A$ and 413$_A$ in restore stage 464 (described below).

FIG. 4M' is a chart showing values of signals in FIG. 4L during sense stage 462 using an alternative sense scheme based on a property (e.g., self-latching) of a built-in bipolar junction transistor. The voltage values of FIG. 4M' can be the same those shown in FIG. 4M, except that in FIG. 4M' signal WL$_3$ can be provided with voltages $V_G$ (instead of $V_{SENSE}$) when memory cell 413$_A$ is sensed, and signal WL$_2$ can be provided with voltages $V_G$ (instead of $V_{SENSE}$) when memory cell 412$_A$ is sensed. As shown in FIG. 4M', sense stage 462 can include a sense interval 462.1' (which can occur from time T1' to time T2') and a sense interval 462.2' (which can occur from time T3' to time T4'). Sense interval 462.2' (when memory cell 412$_A$ is sensed) occurs after sense interval 462.1' (when memory cell 413$_A$ is sensed). Voltage $V_G$ can be less than zero volts, such as a slightly negative voltage (e.g., $V_G$<0V). Applying voltage $V_G$ of less than zero volts can induce a phenomenon such as impact ionization current (near data line 413$_A$) and subsequent BJT latch. Memory device 400 can include a detection circuit (not shown) to determine the value (e.g., "0" or "1") of information stored in memory cell 412$_A$ (when it is sensed) memory cell 413$_A$ (when it is sensed) in ways similar to the current detection described above with reference to FIG. 4M.

Figures 4O, 4P:
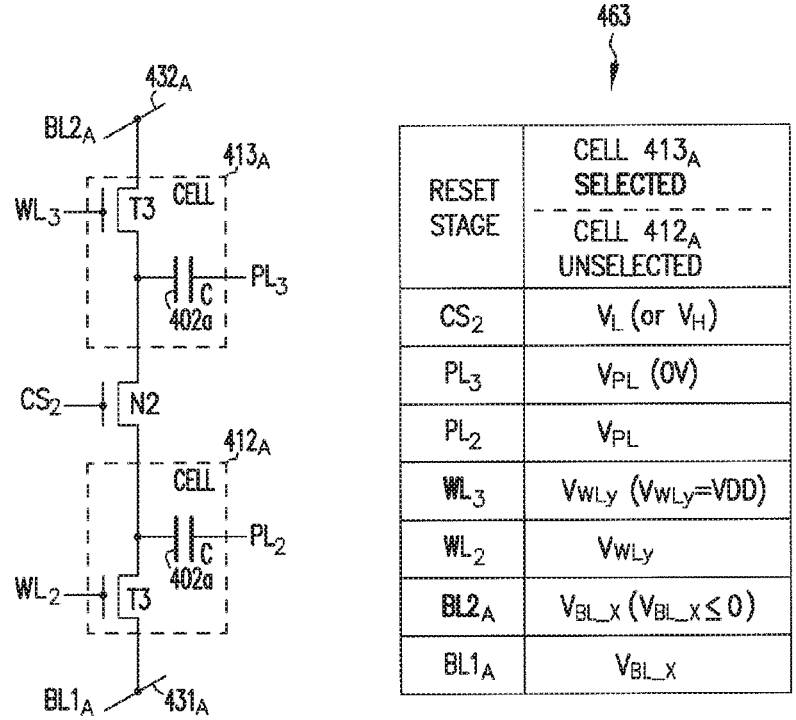
FIG. 4O shows a schematic diagram of a portion of the memory device of FIG. 4A.
FIG. 4P is a chart showing values of signals in FIG. 4O during a reset stage.

FIG. 4O shows a schematic diagram of a portion of memory device 400 of FIG. 2A including memory cells 412$_A$ and 413$_A$. FIG. 4P is a chart showing values of signals in FIG. 4O during reset stage 463, which is performed after sense stage 462 (FIG. 4M).

Reset stage 463 can be can be performed to clear holes from the body of transistor T3 of each of memory cells 412$_A$ and 413$_A$ that may have been generated during pre-sense stage 461 (FIG. 4K). Clearing holes in reset stage 463 may reset the threshold voltage of transistor T3 of each of memory cells 412$_A$ and 413$_A$. Reset stage 463 may help maintain the relationships (e.g., FIG. 4N) among cell current flowing through memory cells 412$_A$ and 413$_A$, the value (e.g., "0" or "1") of information stored in memory cells 412$_A$ and 413$_A$ and voltages $V_{SENSE}$ and $V_{PASS}$. The following description refers to FIG. 4O and FIG. 4P.

As shown in FIG. 4P signals CS$_2$ can be provided with either voltage $V_L$ or voltage $V_H$. Each of signals PL$_2$ and PL$_3$ can be provided with a voltage $V_{PL}$. Each of signals BL1$_A$ and BL2$_A$ can be provided with a voltage $V_{BL\_X}$. Each of signals WL$_2$ and WL$_3$ can be provided with voltages $V_{WLy}$. Voltage $V_{WLy}$ can have a value such that transistor T3 of each of memory cells 412$_A$ and 413$_A$ can be turned on. For example, the value of voltage $V_{WLy}$ can be greater than 0V (e.g., greater than ground) and equal to or less than the supply voltage (e.g., VDD) of memory device 400. With the values of the signals shown in FIG. 4P, holes (e.g., generated during pre-sense stage 461 in FIG. 4K) can be cleared from the body of transistor T3 of memory cells 412$_A$ and 413$_A$. The value of voltage $V_{BL\_X}$ can be zero volts (e.g., $V_{BL\_X}$=0V) or alternatively, less than zero volts, such as a slightly negative voltage (e.g., $V_{BL\_X}$<0V).

In a particular reset stage of a different read operation, memory cells (not shown in FIG. 4O) adjacent memory cells 412$_A$ and 413$_A$ may be reset during that particular reset stage (e.g., similar to reset stage 463 in FIG. 4P) and memory cells 412$_A$ and 413$_A$ are unselected (or unused) in that read operation. In that particular reset stage (to reset the adjacent memory cells, not shown), the value of voltages on signals WL$_2$, WL$_3$, and CS$_2$ (FIG. 4O) can be less than zero volts (e.g., slightly less than zero volts, such as WL$_2$=WL$_3$=Vn (e.g., Vn=−0.3V) if voltages of less than zero volts are provided to signals BL1$_A$ and BL2$_A$ during that particular reset stage. However, in order to avoid transistor leakage that may be caused by GIDL current, the value of voltages on signals WL$_2$, WL$_3$, and CS$_2$ (FIG. 4O) can be slightly less than zero volts such as WL$_2$=WL$_3$=Vn, but not too much less than Vn (e.g., −1V<WL2=WL3<−0.3V).

Figures 4Q, 4R:
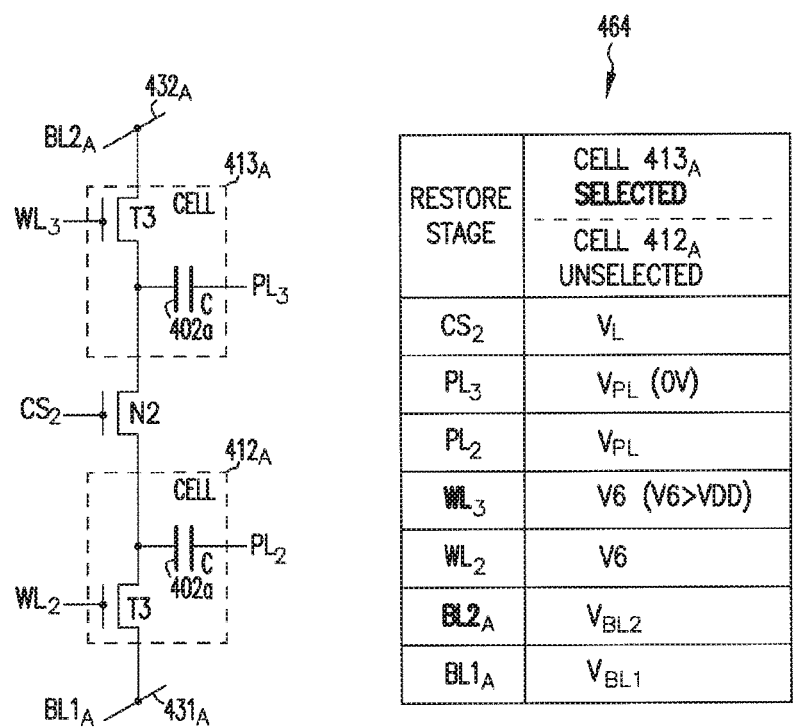
FIG. 4Q shows a schematic diagram of a portion of the memory device of FIG. 4A.
FIG. 4R is a chart showing values of signals in FIG. 4Q during a restore stage.

FIG. 4Q shows a schematic diagram of a portion of memory device 400 of FIG. 2A including memory cells 412$_A$ and 413$_A$. FIG. 4R is a chart showing values of signals in FIG. 4Q during restore stage 464, which is performed after reset stage 463 (FIG. 4P). As described above, restore stage 464 can be performed to restore (e.g., write back) information to memory cells 412$_A$ and 413$_A$ after memory cells 412$_A$ and 413$_A$ were sensed (e.g., based on either the sense scheme shown in FIG. 4M or the sense scheme shown in FIG. 4M'). The following description refers to FIG. 4Q and FIG. 4R.

As shown in FIG. 4R, signals CS$_2$ can be provided with voltage $V_L$. Each of signals PL$_2$ and PL$_3$ can be provided with a voltage $V_{PL}$. Each of signals WL$_2$ and WL$_3$ can be provided with voltages V6 (e.g., V6>VDD) such that transistor T3 of each of memory cells 412$_A$ and 413$_A$ can be turned on.

Signal BL2$_A$ (associated with memory cell 413$_A$) can be provided with a voltage $V_{BL2}$. The value of voltage $V_{BL2}$ can be based on the value of information (e.g., "0" or "1") to be stored (e.g., rewritten) in memory cell 413$_A$. The value of information to be stored in memory cell 413$_A$ during restore stage 464 is the same as the value of information read (sensed) from memory cell 413$_A$ during sense stage 462. In FIG. 4R, voltage $V_{BL2}$ can have one value (e.g., $V_{BL2}$=0V or $V_{BL2}$<0) if information to be stored in memory cell 413$_A$ has one value (e.g., "0") and another value (e.g., $V_{BL2}$>0V (e.g., $V_{BL2}$=1V)) if information to be stored in memory cell 412$_A$ has another value (e.g., "1"). Based on the voltages in FIG. 4R, information (which was sensed in sense stage 462) can be restored in capacitor plate 402a of memory cell 413$_A$.

Similarly, signal BL1$_A$ (associated with memory cell 412$_A$) can be provided with a voltage $V_{BL1}$. The value of voltage $V_{BL1}$ can be based on the value of information (e.g., "0" or "1") to be stored (e.g., rewritten) in memory cell 412$_A$. The value of information to be stored in memory cell 412$_A$ during restore stage 464 is the same as the value of information read (sensed) from memory cell 412$_A$ during sense stage 462 if the information is pre-sensed using the II pre-sense stage (associated with FIG. 4K). However, if the information is pre-sensed using the GIDL pre-sense stage (associated with FIG. 4K'), then the value of information read (sensed) from memory cell 412$_A$ during sense stage 462 can be inverted during sense stage 462. In FIG. 4R, voltage $V_{BL1}$ can have one value (e.g., $V_{BL1}$=0V or $V_{BL1}$<0) if information to be stored in memory cell 412$_A$ has one value (e.g., "0"), and another value (e.g., $V_{BL1}$>0V (e.g., $V_{BL1}$=1V)) if information to be stored in memory cell 412$_A$ has another value (e.g., "1"). Based on the voltages in FIG. 4R, information (which was sensed in sense stage 462) can be restored (e.g., in capacitor plate 402a of memory cell 412$_A$).

In the above example read operation (FIG. 4J through FIG. 4R), only memory cell 413$_A$ is assumed to be a selected memory cell. However, both memory cells 413$_A$ and 412$_A$ can be selected in a read operation. In such a read operation (both memory cells 413$_A$ and 412$_A$ are selected), sense stage 462 (FIG. 4M) can also be performed in the way described above (e.g., the same way where only memory cell 413$_A$ is selected) because both memory cells 413$_A$ and 412$_A$ can be sensed in a sequential fashion to determine the values of information stored in memory cells 413$_A$ and 412$_A$.

Figure 5A:
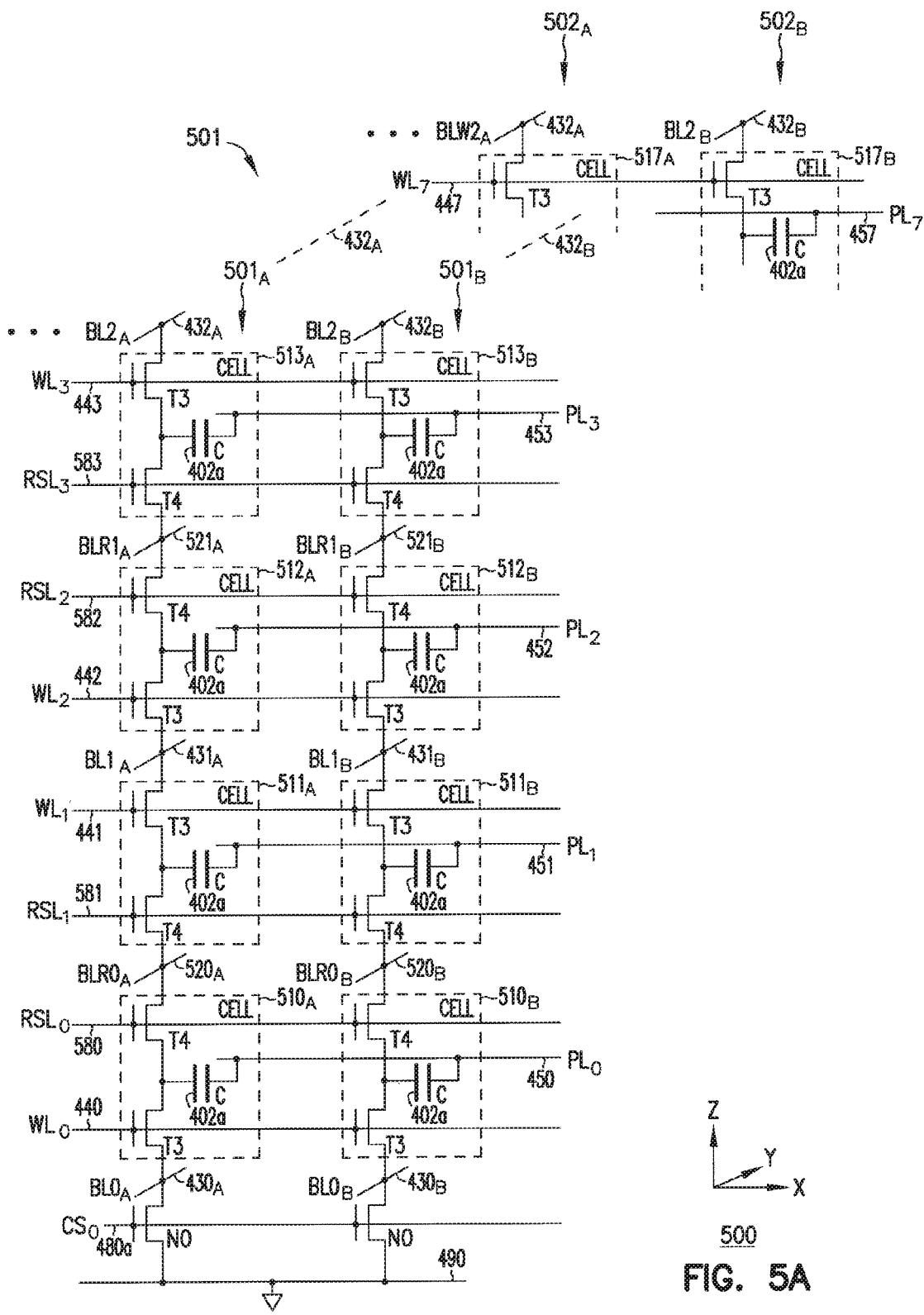
FIG. 5A shows a schematic diagram of a portion of another memory device including memory cells having memory cell structure from a single-pillar, according to some embodiments described herein.

FIG. 5A shows a schematic diagram of a portion of a memory device 500 including memory cells having memory cell structure from a single-pillar, according to some embodiments described herein. Memory device 500 can include a memory array 501. Memory device 500 can correspond to memory device 100 of FIG. 1. For example, memory array 501 can form part of memory array 101 of FIG. 1. Memory device 500 can be a variation of memory device 400 of FIG. 4A. Thus, for simplicity, detailed description of similar or the same elements (which are given the same labels in FIG. 4A and FIG. 5A) of memory devices 400 and 500 are not repeated. Differences in structures between memory devices 400 and 500 are described below.

As shown in FIG. 5A, memory device 500 can include memory cells memory cell groups (e.g., strings) 501$_A$ and 501$_B$. Each of memory cell groups 501$_A$ and 501$_B$ can include the same number of memory cells. For example, memory cell group 501$_A$ can include memory cells 510$_A$, 511$_A$, 512$_A$, and 513$_A$, and memory cell group 501$_B$ can include memory cells 510$_B$, 511$_B$, 512$_B$, and 513$_B$. FIG. 5A shows four memory cells in each of memory cell groups 501$_A$ and 501$_B$ as an example. The memory cells in memory device 500 are volatile memory cells (e.g., DRAM cells).

FIG. 5A shows directions x, y, and z that can correspond to the directions x, y, and z directions of the structure (physical structure) of memory device 500 shown in FIG. 5B through FIG. 5H. Memory cells in each of memory cell groups 501$_A$ and 501$_B$ can be formed vertically (e.g., stacked over each other in a vertical stack in the z-direction) over a substrate of memory device 500.

Memory device 500 can omit switches (e.g., transistors) N1 and N2 of memory device 400. However, as shown in FIG. 5A, memory device 500 can include a transistor T4 in each memory cell in each of memory cell groups 501$_A$ and 501$_B$. Memory device 500 also includes conductive lines 580, 581, 582, and 583 that can carry signals RSL$_0$, RSL$_1$, RSL$_2$, and RSL$_3$, respectively. Memory device 500 can use signals RSL$_0$, RSL$_1$, RSL$_2$, and RSL$_3$ to control (e.g., turn on or turn off) transistor T4 of respective memory cells of memory cell groups 501$_A$ and 501$_B$. The description herein uses the term "conductive lines" (referring to lines 580, 581, 582, and 583) for ease of describing different elements of memory device 500. However, conductive lines 580, 581, 582, and 583 can be word lines of memory device 500 similar to word lines 440, 441, 442, and 443.

Memory device 500 can include data lines (bit lines) 520$_A$ and 521$_A$ (in addition to data lines 430$_A$, 431$_A$, and 432$_A$)

associated with memory cell group $501_A$. Data lines $520_A$ and $521_A$ can carry signals $BLR0_A$ and $BLR1_A$, respectively, to access (e.g., during a read operation) respective memory cells $510_A$, $511_A$, $512_A$, and $513_A$ of memory cell group $501_A$.

Memory device 500 can include data lines (bit lines) $520_B$ and $521_B$ (in addition to data lines $430_B$, $431_B$, and $432_B$) associated with memory cell group $501_B$. Data lines $520_B$ and $521_B$ can carry signals $BLR0_B$ and $BLR1_B$, respectively, to access (e.g., during a read operation) respective memory cells $510_B$, $511_B$, $512_B$, and $513_B$ of memory cell group $501_B$.

As shown in FIG. 5A, each of memory cells $510_A$, $511_A$, $512_A$, and $513_A$ and each of memory cells $510_B$, $511_B$, $512_B$, and $513_B$ can include transistors T3 and T4 and one capacitor C, such that each of these memory cells can be called a 2T1C memory cell. As a comparison, each memory cell (e.g., memory cell $413_A$) of memory device 400 includes a 1T1C memory cell. As shown in FIG. 5A, memory device 500 can include other elements, such as memory cell $517_A$ of a memory cell group $502_A$, memory cell $517_B$ of a memory cell group $502_B$, plate line 457 (and associated signal $PL_7$). Such other elements are similar to those described above. Thus, for simplicity, detailed description of such other elements of memory device 500 is omitted from the description herein.

Figure 5B:
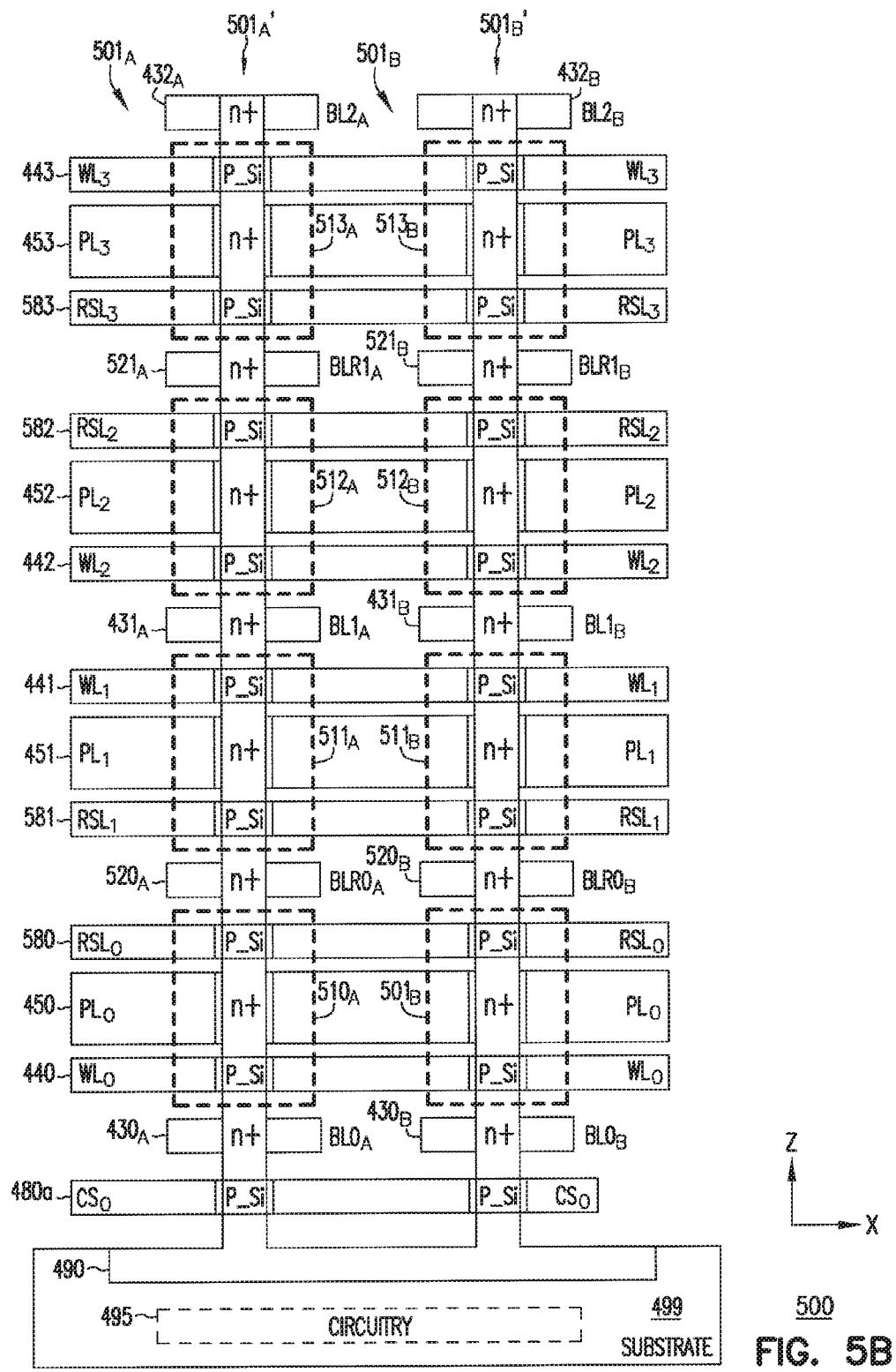
FIG. 5B shows a side view (e.g., cross-sectional view) of a structure of a portion of the memory device schematically shown in FIG. 5A, according to some embodiments described herein.

FIG. 5B shows a side view (e.g., cross-sectional view) of a structure of a portion of memory device 500 that is schematically shown in FIG. 5A, according to some embodiments described herein. The structure of memory device 500 is similar to that of the structure of memory device 400 in FIG. 4B. Thus, for simplicity, detailed description of similar or the same elements (which are given the same labels in FIG. 4B and FIG. 5B) of memory devices 400 and 500 are not repeated.

As shown in FIG. 5B, conductive lines 580, 581, 582, and 583 can be similar to (or identical to) word lines 440, 441, 442, and 443, respectively. For example, each of conductive lines 580, 581, 582, and 583 can have a length extending in the x-direction and can be shared by respective memory cells of memory cell groups $501_A$ and $501_B$. Each of conductive lines 580, 581, 582, and 583 can also have a structure similar to (or identical to) the structures of word lines 440, 441, 442, and 443, such as the structure of word line 443 shown in FIG. 4D.

Data lines $520_A$ and $520_B$ can be similar to (or identical to) data lines $430_A$ and $430_B$, respectively. Data lines $521_A$ and $521_B$ can be similar to (or identical to) data lines $432_A$ and $432_B$, respectively. For example, each of data lines $520_A$, $520_B$, $521_A$, and $521_B$ can have a length extending in the y-direction perpendicular to the x-direction. Each of data lines $520_A$, $520_B$, $521_A$, $521_B$ can have a structure similar to (or identical to) the structures of data line $432_A$ or $432_B$ shown in FIG. 4D.

Figure 5C:
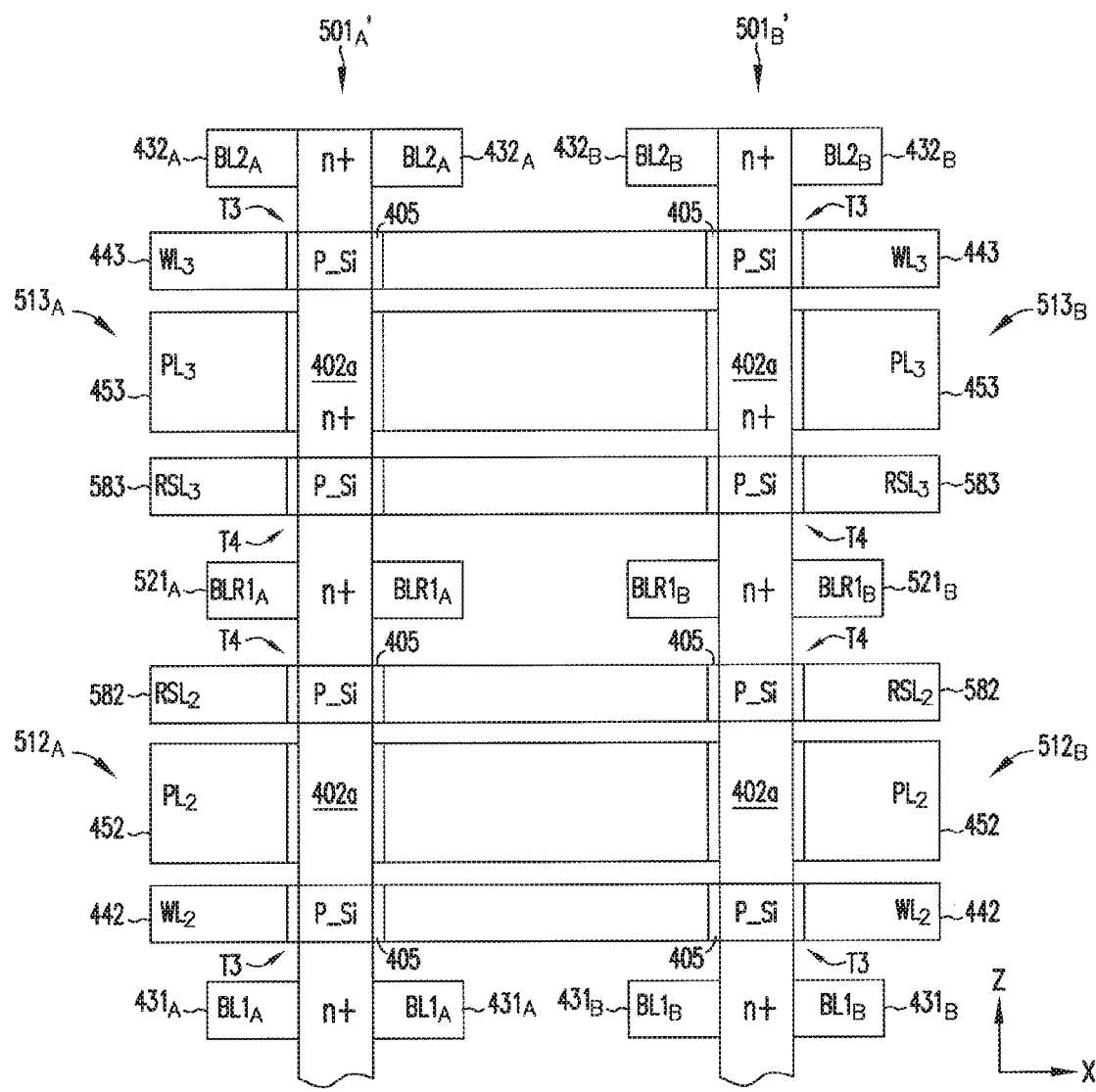
FIG. 5C shows a portion of the memory device of FIG. 5B.

FIG. 5C shows a portion of memory device 500 of FIG. 5B including memory cells $512_A$, $513_A$, $512_B$, and $513_B$. Some of the elements shown in FIG. 5C are similar to some of the elements of memory device 400 of FIG. 4C; such similar (or the same) elements are given the same labels and are not described herein for simplicity. As shown in FIG. 5C, the structures and locations of transistor T3 and capacitor plate 402a are the same as those of memory device 400 (FIG. 4B and FIG. 4C). Transistor T4 in FIG. 5C can include elements similar to those of transistor T3. For example, transistor T4 can include transistor elements (e.g., body, source, and drain) that are parts of a combination of a portion P_Si and two n+ portions adjacent the portion P_Si of the same pillar (pillar $501_A$ or $501_B$), and transistor element (e.g., gate) that is part of a respective conductive line (one of conductive lines 582 and 583).

Figures 5D, 5E:
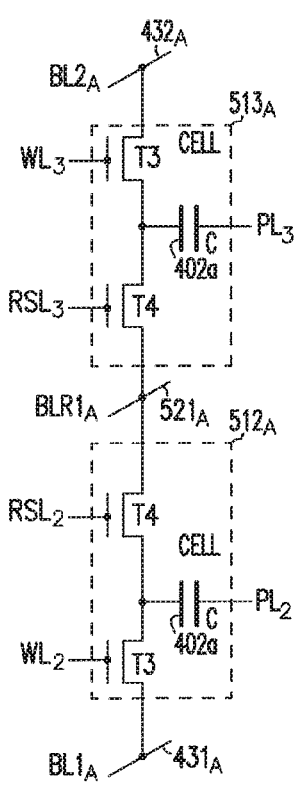
FIG. 5D shows a schematic diagram of a portion of the memory device of FIG. 5A including two memory cells.
FIG. 5E is a chart showing example values of voltages provided to the signals of the portion of the memory device of FIG. 5D during three different example write operations, according to some embodiments described herein.

FIG. 5D shows a schematic diagram of a portion of memory device 500 of FIG. 5A including memory cells $512_A$ and $513_A$. FIG. 5E is a chart showing example values of voltages provided to the signals of memory device 500 of FIG. 5D during three different example write operations 521, 522, and 523, according to some embodiments described herein. The following description refers to FIG. 5D and FIG. 5E.

In write operation 521, memory cell $512_A$ is selected to store information, and memory cell $513_A$ is unselected (e.g., not selected to store information). In write operation 522, memory cell $513_A$ is selected to store information, and memory cell $512_A$ is unselected. In write operation 523 both memory cells $512_A$ and $513_A$ are selected to store information.

As shown in FIG. 5E, each of signals $PL_2$ and $PL_3$ can be provided with a voltage V4 during a write operation (e.g., any of write operations 521, 522, and 523) of memory device 500 regardless of which of memory cells $512_A$ and $513_A$ is selected. Each of signals $RSL_2$ and $RSL_3$ can be provided with a voltage Va (e.g., Va=0V) in write operations 521, 522, and 523. Signal $BLR1_A$ can be provided with a voltage Vb (e.g., Vb=0V) in write operations 521, 522, and 523.

In write operation 521, signal $WL_3$ (associated with unselected memory cell $513_A$) can be provided with a voltage V5 (to turn off transistor T3 of unselected memory cell $513_A$). Signal $WL_2$ (associated with selected memory cell $512_A$) can be provided with a voltage V6 (to turn on transistor T3 of selected memory cell $512_A$). The value of voltage V6 can be greater than a supply voltage (e.g., VDD) of memory device 500 (e.g., V6>VDD). Signal $BL2_A$ (associated with unselected memory cell $513_A$) can be provided with a voltage Vx (e.g., Vx=V4). Signal $BL1_A$ (associated with selected memory cell $512_A$) can be provided with a voltage $V_{BL1}$. The value of voltage $V_{BL1}$ can be based on the value of information to be stored in memory cell $512_A$. For example, voltage $V_{BL1}$ can have one value (e.g., $V_{BL1}$=0V or $V_{BL1}$<0) if information to be stored in memory cell $512_A$ has one value (e.g., "0"), and another value (e.g., $V_{BL1}$>0V (e.g., $V_{BL1}$=1V)) if information to be stored in memory cell $512_A$ has another value (e.g., "1").

In write operation 522, the voltages provided to signals $WL_2$ (associated with unselected memory cell $512_A$) and $WL_3$ (associated with selected memory cell $513_A$) can be swapped, such that $WL_2$=V5 and $WL_3$=V6. Signal $BL1_A$ (associated with unselected memory cell $512_A$) can be provided with a voltage Vx. Signal $BLR1_A$ (associated with selected memory cell $513_A$) can be provided with a voltage Vb. Signal $BL2_A$ (associated with selected memory cell $513_A$) can be provided with a voltage $V_{BL2}$. The value of voltage $V_{BL2}$ can be based on the value of information to be stored in memory cell $513_A$. For example, voltage $V_{BL2}$ can have one value (e.g., $V_{BL2}$=0V or $V_{BL2}$<0) if information to be stored in memory cell $513_A$ has one value (e.g., "0"), and another value (e.g., $V_{BL2}$>0V (e.g., $V_{BL2}$=1V)) if information to be stored in memory cell $513_A$ has another value (e.g., "1").

In write operation 523, both memory cells $512_A$ and $513_A$ are selected to store information. Thus, the voltages provided to each of signals $WL_2$ and $WL_3$ can be the same as those in write operations 521 and 522 for a selected memory cell, such as $WL_2$=$WL_3$=V6. $BL1_A$=$V_{BL1}$, and $BL2_A$=$V_{BL2}$.

Figure 5F:
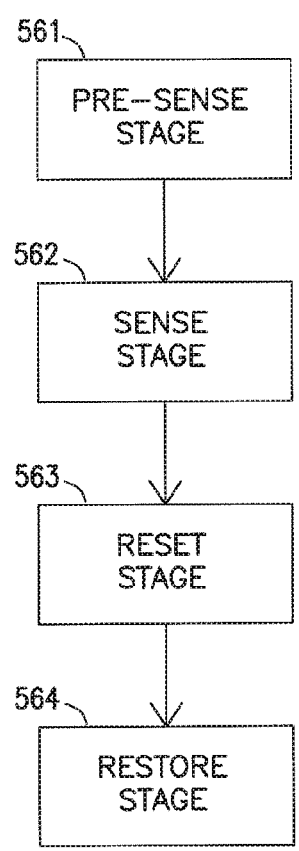
FIG. 5F is a flow chart showing different stages of a read operation of the memory device of FIG. 5A through FIG. 5C, according to some embodiments described herein.

FIG. 5F is a flow chart showing different stages of a read operation 560 of memory device 500 of FIG. 5A through FIG. 5C, according to some embodiments described herein. As shown in FIG. 5F, read operation 560 (to read information from a selected memory cell) can include different stages, such as a pre-sense stage 561, a sense (or read) stage 562, a reset stage 563, and a restore stage 564. These stages (561, 562, 563, and 564) can be performed one stage after another in an order shown in FIG. 5F, starting from pre-sense stage 561. In FIG. 5F, sense stage 562 (to determine the value of information stored in a selected memory cell) can be performed in two different sense schemes. One sense scheme (e.g., FIG. 5J) is based on the threshold voltage (Vt) shift of a transistor (e.g., transistor T3) coupled to the selected memory cell. An alternative sense scheme of sensing (e.g., FIG. 5K') based on a property (e.g., self-latching) of a bipolar junction transistor, which is intrinsically built-in a transistor (e.g., transistor T4) of the selected memory cell.

The stages (561, 562, 563, and 564) of read operation 560 are described in detail with reference to FIG. 5G through FIG. 5N.

Figures 5G, 5H:
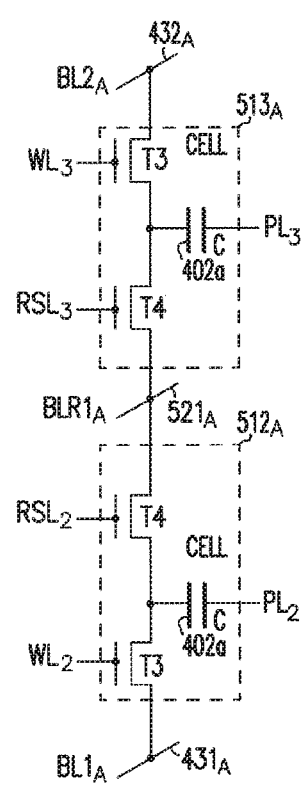
FIG. 5G shows a schematic diagram of a portion of the memory device of FIG. 5A.
FIG. 5H is a chart showing values of signals in FIG. 5G during a pre-sense stage based on impact ionization current mechanism.

FIG. 5G shows a schematic diagram of a portion of memory device 500 of FIG. 5A including memory cells $512_A$ and $513_A$. FIG. 5H is a chart showing values of signals in FIG. 5G during pre-sense stage 561 of a read operation associated with FIG. 5F. The following description refers to FIG. 5H (impact ionization pre-sense stage) and FIG. 5G. Memory cell $512_A$ is assumed to be a selected memory cell (to be read in this example), and memory cell $513_A$ is assumed to be an unselected memory cell (not to be read in this example). In pre-sense stage 561, each of signals $PL_2$ and $PL_3$ can be provided with a voltage $V_{PL}$ (e.g., 0V). Signal $BL2_A$ can be provided with a voltage Vc (e.g., Vc=0V). Signals $WL_3$ can be provided with a voltage $V_L$ (e.g., $V_L$=0V) to turn off transistor T3 of memory cell $513_A$ (unselected memory cell). Signal $RSL_3$ can be provided with a voltage $V_L$ ($V_L$=0V). Signals $BLR1_A$ and $BL1_A$ can be provided with a voltage $V_{BL\_H}$. Signal $WL_2$ can be provided with a voltage $V_{WL}$ ($0<V_{WL}<V_{BL\_H}$), and $RSL_2$ can be provided with a voltage $V_L$ ($V_L<V_{BL}$_H). Similar to a pre-sense stage 461 of FIG. 4K, pre-sense stage 561 of FIG. 5H can store the information in the body of transistor T3 of memory cell $512_A$ in the forms of holes. The presence or absence of holes in body of transistor T3 of memory cell $512_A$ depends upon the value ("0" or "1") of information stored in capacitor plate 402a of memory cell $512_A$.

The following description refers to FIG. 5H' (GIDL pre-sense stage) and FIG. 5G. Memory cell $512_A$ is assumed to be a selected memory cell (to be read in this example), and memory cell $513_A$ is assumed to be an unselected memory cell (not to be read in this example). In pre-sense stage 561 in FIG. 5H', each of signals $PL_2$ and $PL_3$ can be provided with a voltage $V_{PL}$ (e.g., 0V). Signal $BL2_A$ can be provided with a voltage Vc (e.g., Vc=0V). Signals $WL_3$ can be provided with a voltage $V_L$ (e.g., $V_L$=0V) to turn off transistor T3 of memory cell $513_A$ (unselected memory cell). Signal $RSL_3$ can be provided with a voltage $V_L$ ($V_L$=0V). Signals $BLR1_A$ and $BL1_A$ can be provided with a voltage $V_L$. Signal $WL_2$ can be provided with a voltage $V_{WL}$ ($V_{WL}<0$). Signal $RSL_2$ can be provided with a voltage $V_L$ ($V_L$=0V). Similar to a pre-sense stage 461 of FIG. 4K', pre-sense stage 561 of FIG. H' can store the information in the body of transistor T3 of memory cell $512_A$ in the forms of holes. The presence or absence of holes in body of transistor T3 of memory cell $512_A$ depends upon the value ("0" or "1") of information stored in capacitor plate 402a of memory cell $512_A$.

Figures 5I, 5J:
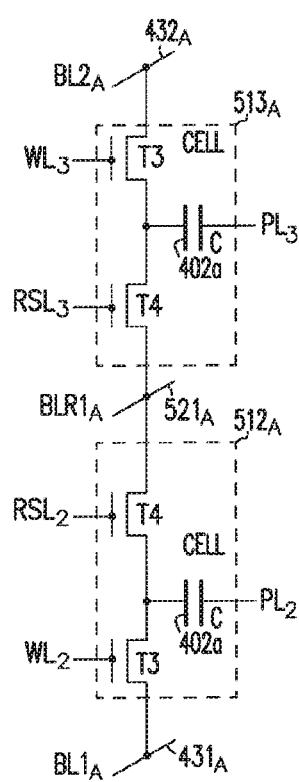
FIG. 5I shows a schematic diagram of a portion of the memory device of FIG. 5A.
FIG. 5J is a chart showing values of signals in FIG. 5I during a sense stage using a sense scheme based threshold voltage shift.

FIG. 5I shows a schematic diagram of a portion of memory device 500 of FIG. 5A including memory cells $512_A$ and $513_A$. FIG. 5J is a chart showing values of signals in FIG. 5I during sense stage 562 using a sense scheme based threshold voltage shift. Sense stage 562 is performed after pre-sense stage 561 (FIG. 5H). The following description refers to FIG. 5I and FIG. 5J. The voltage values of FIG. 5I can be the same those shown in FIG. 5H, except for signals $BLR1_A$, $RSL_2$, $WL_2$, and $BL1_A$ that can be provided with voltages $V_{BL\_H}$, $V_{PASS}$, $V_{SENSE}$, and $V_{BL\_L}$, respectively.

Memory device 500 can include a detection circuit (not shown) that can be coupled to data line $521_A$ or data line $431_A$. Memory device 500 can use the detection circuit to determine the value (e.g., "0" or "1") of information stored in memory cell $512_A$ based on the presence or absence of current between data lines $532_A$ and $431_A$ during sense stage 562. For example, during sense stage 562, memory device 500 can determine that "0" was stored in memory cell $512_A$ if current is detected, and "1" was stored in memory cell $512_A$ if no current (or a negligible of current) is detected. The values of "0" and "1" mentioned here may be applicable to the case for the impact ionization pre-sense stage. In the case of the GIDL pre-sense stage, the logic may be reversed. Memory device 500 can include storage circuitry to store the values (e.g., "0" or "1") of information sensed from memory cell $512_A$ during sense stage 562. Memory device 500 can use the stored value (e.g., stored in the storage circuitry) as the value for information to be written back to memory cell 512a in restore stage 564 (described below). In an alternative sense stage for FIG. 5J, the voltages provided to signals $BLR1_A$ and $BL1_A$ can be switched, such that $BLR1_A=V_{BL\_L}$ and $BL1_A=V_{BL\_H}$.

FIG. 5J' is a chart showing values of signals in FIG. 5I during a sense stage using an alternative sense scheme based on a property (e.g., self-latching) of a built-in bipolar junction transistor. The voltage values of FIG. 5J' can be the same those shown in FIG. 5J, except for signals $BLR1_A$, $WL_2$, and $BL1_A$ in FIG. 5J' that can be provided with voltages $V_{BL\_L}$, $V_G$, and $V_{BL\_H}$, respectively. Voltage $V_G$ can be less than zero volts, such as a slightly negative voltage (e.g., $V_G<0V$). Applying voltage $V_G$ of less than zero volts can induce a phenomenon such as impact ionization current (near data line $521_A$) and subsequent BJT latch. Memory device 500 can include a detection circuit (not shown) to determine the value (e.g., "0" or "1") of information stored in memory cell $512_A$ in ways similar to the current detection described above with reference to FIG. 5J.

Figures 5K, 5L:
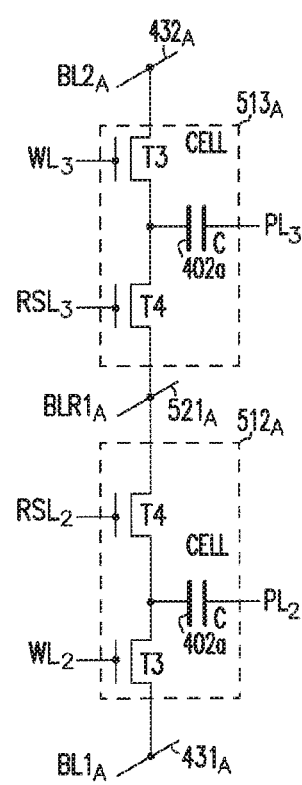
FIG. 5K shows a schematic diagram of a portion of the memory device of FIG. 5A.
FIG. 5L is a chart showing values of signals in FIG. 5K during a reset stage.

FIG. 5K shows a schematic diagram of a portion of memory device 500 of FIG. 5A including memory cells $512_A$ and $513_A$. FIG. 5L is a chart showing values of signals in FIG. 5K during reset stage 563, which is performed after sense stage 562 (FIG. 5J). The following description refers to FIG. 5K and FIG. 5L. The voltage values of FIG. 5L can be the same those shown in FIG. 5J, except for signals $BLR1_A$ and $B1_A$ that can be provided with voltage $V_{BL\_X}$, and signals $RSL_2$ and $WL_2$ that can be provided with voltage $V_{WL_Y}$. The value of voltage $V_{BL\_X}$ can be zero volts (e.g., $V_{BL\_X}$=0V). Alternatively, the value of voltage $V_{BL\_X}$ can be less than zero volts, such as a slightly negative voltage (e.g., $V_{BL\_X}$=−0.3V).

In a particular reset stage of a different read operation, memory cells (both shown and not shown in FIG. 5K) adjacent memory cells $513_A$ may be reset during that particular reset stage (e.g., similar to reset stage 563 in FIG. 5L) and memory cells $513_A$ are unselected (or unused) in that read operation. In that particular reset stage (to reset the adjacent memory cells, both shown and not shown), the value of voltages on signals $RSL_3$ (FIG. 5K) can be less than zero volts (e.g., slightly less than zero volts, such as $RSL_3=Vn$ (e.g., $Vn=-0.3V$) if voltages of less than zero volts are provided to signals $BLR1_A$ and $BL1_A$ during that particular reset stage. However, in order to avoid transistor leakage that may be caused by GIDL current, the value of voltages on signals $RSL_3$ (FIG. 5K) can be slightly less than zero volts such as $RSL_3=Vn$, but not too much less than Vn (e.g., $-1V<RSL3<-0.3V$).

Figures 5M, 5N:
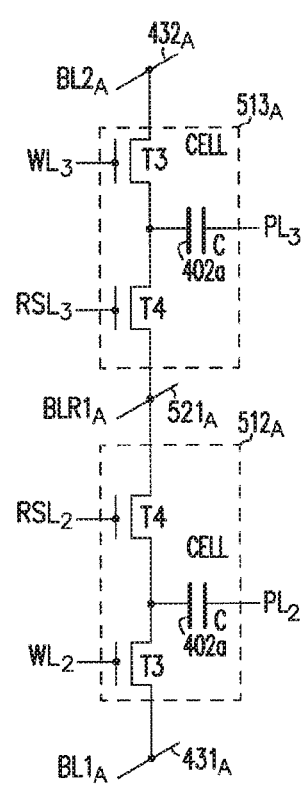
FIG. 5M shows a schematic diagram of a portion of the memory device of FIG. 5A.
FIG. 5N is a chart showing values of signals in FIG. 5M during a restore stage.

FIG. 5M shows a schematic diagram of a portion of memory device 500 of FIG. 5A including memory cells $512_A$ and $513_A$. FIG. 5N is a chart showing values of signals in FIG. 5M during restore stage 564, which is performed after reset stage 563 (FIG. 5K). As described above, restore stage 564 can be performed to restore (e.g., write back) information to memory cells $512_A$ and $513_A$ after memory cells $512_A$ and $513_A$ were sensed (e.g., based on either the sense scheme shown in FIG. 5J or the sense scheme shown in FIG. 5'). The following description refers to FIG. 5M and FIG. 5N. As shown in FIG. 5N, signal $BL2_A$ can be provided with voltage Vx, each of signals $WL_3$, $RSL_2$, and $RSL_3$ can be provided with signal $V_L$ (e.g., $V_L=0V$), signal $BLR1_A$ can be provided with voltage Vc (e.g., $Vc=0V$), signal $WL_2$ can be provided with voltage V6 (e.g., $V6>VDD$), and signal $BL1_A$ can be provided with voltage $V_{BL1}$. Voltage $V_{BL1}$ can have one value (e.g., $V_{BL1}=0V$ or $V_{BL1}<0$) if information to be restored in memory cell $512_A$ has one value (e.g., "0"), and another value (e.g., $V_{BL1}=1V$) if information to be restored in memory cell $512_A$ has another value (e.g., "1"). Based on the voltages in FIG. 5N, information can be stored (e.g., restored) in capacitor plate 402a of memory cell $512_A$.

Figure 6:
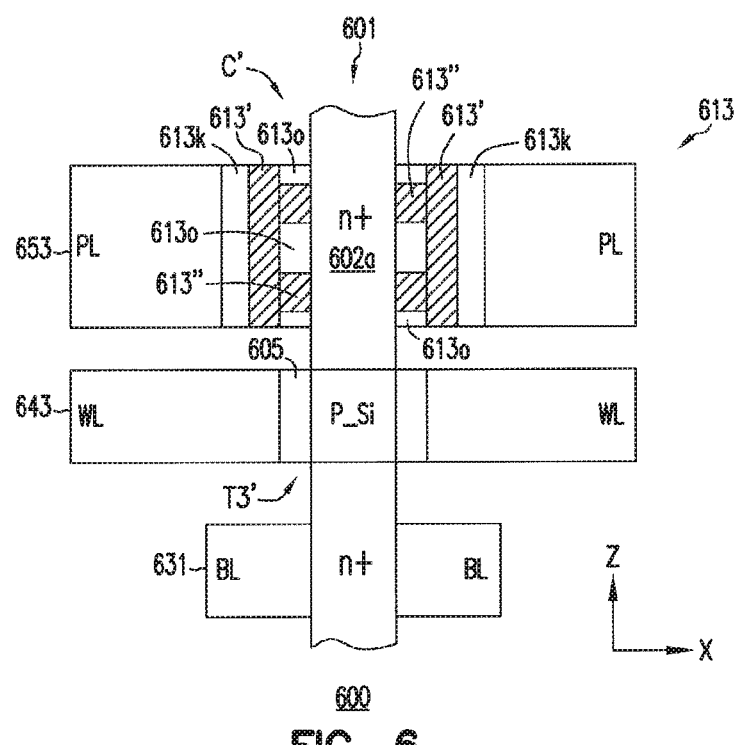
FIG. 6 shows a structure of a portion of a memory cell located along a segment of a pillar of a memory device, according to some embodiments described herein.

FIG. 6 shows a structure of a portion of a memory cell 613 located along a segment of a pillar 601 of a memory device 600, according to some embodiments described herein. Memory device 600 can include a plate line 653, a word line 643, and a data line 631 that can correspond to one of the plate lines, one of the word lines, and one of the data lines of memory device 400 (FIG. 4B) or memory device 500 (FIG. 5B).

As shown in FIG. 6, pillar 601 can include n+ portions and a P_Si portion. Pillar 601 can be similar to one of the pillars (e.g., pillar $401_A$') in FIG. 4B) of memory device 400 (FIG. 4B) or one of the pillars (e.g., pillar $501_A$') in FIG. 5B) of memory device 500 (FIG. 5B). Portion P_Si is separated from word line 643 by a dielectric (e.g., silicon dioxide) 605.

As shown in FIG. 6, memory cell 613 can include a capacitor C' and a transistor T3'. Capacitor C' can include a capacitor plate 602a (which is part of n+ portion), conductive portion 613', conductive contacts 613", and a part of plate line 653. Conductive portion 613' can be formed from a relatively low resistance material (e.g., a material that can has a resistance lower than conductively doped polysilicon, such as metal). Conductive contacts 613" can also have a relatively low resistance material that can be similar to the material of conductive portion 613'. Dielectrics 613k and 613o can be different dielectric materials that have different dielectric constants. Dielectrics 613k can have a dielectric constant greater than the dielectric constant of dielectric 613o. For example, dielectric 613o can be silicon dioxide, and dielectric 613k can be a high-k dielectric, which is a dielectric material having a dielectric constant greater than the dielectric constant of silicon dioxide.

The structure of memory cell 613 can be substituted for the structure of each of the memory cells (e.g., memory cell $413_A$ in FIG. 4B) of memory device 400 (FIG. 4B) or the structure of each of the memory cells (e.g., memory cell $513_A$ in FIG. 5B) of memory device 500 (FIG. 5B). For example, the structure of capacitor C' can be substituted for the structure of capacitor C in each of the memory cells of memory device 400 (FIG. 4B) or memory device 500 (FIG. 5B).

The illustrations of apparatuses (e.g., memory devices 100, 200, 400, 500, and 600) and methods (e.g., operations of memory devices 100, 200, 400, 500, and 600) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 400, 500, and 600) or a system (e.g., an electronic item that can include any of memory devices 100, 200, 400, 500, and 600).

Any of the components described above with reference to FIG. 1 through FIG. 6 can be implemented in a number of ways, including simulation via software. Thus, apparatuses, e.g., memory devices 100, 200, 400, 500, and 600, or part of each of these memory devices described above, may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, 400, 500, and 600 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 6 include apparatuses, and methods of operations performed by the apparatuses. One of the apparatuses includes volatile memory cells located along a pillar that has a length extending in a direction perpendicular to a substrate of a memory device. Each of the volatile memory cells includes a capacitor and at least one transistor. The capacitor includes a capacitor plate. The capacitor plate is either formed from a portion a semiconductor material of the pillar or formed from a conductive material separated from the pillar by a dielectric. Other embodiments including additional apparatuses and methods are described.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B and C"

means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A. B and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
    a first data line and a second data line;
    a first volatile memory cell including a first transistor coupled in series between the first and second data lines, and a first capacitor plate coupled in series with the first transistor between the first and second data lines; and
    a second volatile memory cell including a second transistor coupled in series between the first and second data lines, and a second capacitor plate coupled in series with the second transistor between the first and second data lines, wherein the apparatus comprises a memory device, the memory device includes a substrate and a pillar extending perpendicular from the substrate, and wherein:
    a first portion of the pillar forms part of the first capacitor plate; and
    a second portion of the pillar forms part of the second capacitor plate, and the first and second capacitor plates are between the first and second data lines;
    a third portion of the pillar forms part of a channel of the first transistor; and
    a fourth portion of the pillar forms part of a channel of the second transistor, wherein the third and fourth portions are between the first and second portions, and, wherein the first and second portions include a semiconductor material of a first conductivity type, the third and fourth portions include a semiconductor material of a second conductivity type different from the first conductivity type.

2. The apparatus of claim 1, wherein the first conductivity type includes n-type, and the second conductivity type includes p-type.

3. An apparatus comprising:
    a first data line and a second data line;
    a first volatile memory cell coupled to the first data line, the first data line configured to provide information to be stored in the first volatile memory cell;
    a second volatile memory cell coupled to the second data line, the second data line configured to provide information to be stored in the second volatile memory cell; and
    a switch coupled between the first and second volatile memory cells, the first and second volatile memory cells coupled in series with the switch between the first and second data lines, the switch configured to turn off during storing of the information in the first volatile memory cell, and to turn off during storing of the information in the second volatile memory cell, wherein:
    the first volatile memory cell includes a first transistor coupled in series between the first data line and the switch, and a first capacitor plate located between the first transistor and the switch; and
    the second volatile memory cell includes a second transistor coupled in series between the second data line and the switch, and a second capacitor plate located between the second transistor and the switch.

4. The apparatus of claim 3, wherein the switch is configured to turn on during sensing of information stored in the first volatile memory cell and during sensing of information stored in the second volatile memory cell.

5. The apparatus of claim 3, wherein the apparatus comprises a memory device, the memory device includes a substrate and a pillar extending perpendicular from the substrate, and wherein:
    a first portion of the pillar forms part of a channel of the first transistor; and
    a second portion of the pillar forms part of a channel of the second transistor.

6. The apparatus of claim 5, wherein the switch includes a third transistor, and a third portion of the pillar between the first and second portions forms part of a channel of the third transistor.

7. The apparatus of claim 6, wherein a fourth portion of the pillar between the first and third portions forms part of the first capacitor plate.

8. The apparatus of claim 7, wherein a fifth portion of the pillar between the second and third portions forms part of the second capacitor plate.

9. The apparatus of claim 8, wherein the first, second, and third portions include a semiconductor material of first conductivity type, the fourth and fifth portions include a semiconductor material of a second conductivity type different from the first conductivity type.

10. An apparatus comprising:
    a first data line and a second data line;
    a first volatile memory cell coupled to the first data line, the first data line configured to provide information to be stored in the first volatile memory cell;
    a second volatile memory cell coupled to the second data line, the second data line configured to provide information to be stored in the second volatile memory cell; and
    a switch coupled between the first and second volatile memory cells, the first and second volatile memory cells coupled in series with the switch between the first and second data lines, the switch configured to turn off during storing of the information in the first volatile memory cell, and to turn off during storing of the information in the second volatile memory cell, wherein:
    the first data line is configured to receive a first voltage during sensing of information from each of the first and second volatile memory cells; and a third data line is configured to receive a second voltage during sensing of information from each of the first and second volatile memory cells.

11. An apparatus comprising:
a first data line, a second data line, and a third data line;
a first volatile memory cell including first and second transistors coupled in series between the first and second data lines, and a first capacitor plate located between the first and second transistors; and
a second volatile memory cell including third and fourth transistors coupled in series between the second and third data lines, and a second capacitor plate located between the third and fourth transistors, wherein the first and second capacitor plates include a semiconductor material of a first conductivity type, and each of the first, second, third, and fourth transistors includes a channel having a semiconductor material of a second conductivity type different from the first conductivity type.

12. The apparatus of claim 11, wherein:
the first data line is configured to provide information to be stored in the first volatile memory cell; and
the third data line configured to provide information to be stored in the second volatile memory cell.

13. The apparatus of claim 11, wherein the apparatus comprises a memory device, the memory device includes a substrate and a pillar extending perpendicular from the substrate, and wherein:
a first portion of the pillar forms part of the channel of the first transistor;
a second portion of the pillar forms part of the channel of the second transistor;
a third portion of the pillar forms part of the channel of the third transistor; and
a fourth portion of the pillar forms part of the channel of the fourth transistor.

14. The apparatus of claim 13, wherein a fifth portion of the pillar between the first and second portions forms part of the first capacitor plate.

15. The apparatus of claim 14, wherein a sixth portion of the pillar between the third and fourth portions forms part of the second capacitor plate.

16. An apparatus comprising:
a first data line, a second data line, and a third data line;
a first volatile memory cell including first and second transistors coupled in series between the first and second data lines, and a first capacitor plate located between the first and second transistors; and
a second volatile memory cell including third and fourth transistors coupled in series between the second and third data lines, and a second capacitor plate located between the third and fourth transistors, wherein the first transistor has a longer channel length than the second transistor.

* * * * *